(12) United States Patent
Kang et al.

(10) Patent No.: US 12,210,290 B2
(45) Date of Patent: Jan. 28, 2025

(54) OPTICAL PROXIMITY CORRECTION METHOD AND METHOD OF FABRICATING A SEMICONDUCTOR DEVICE USING THE SAME

(71) Applicant: Samsung Electronics Co., Ltd., Suwon-si (KR)

(72) Inventors: Pilsoo Kang, Hwaseong-si (KR); Sangwook Kim, Yongin-si (KR); Sanghun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 657 days.

(21) Appl. No.: 17/497,106

(22) Filed: Oct. 8, 2021

(65) Prior Publication Data
US 2022/0179323 A1 Jun. 9, 2022

(30) Foreign Application Priority Data
Dec. 8, 2020 (KR) .......................... 10-2020-0170078

(51) Int. Cl.
*G06F 30/398* (2020.01)
*G03F 1/36* (2012.01)
(Continued)

(52) U.S. Cl.
CPC ............ *G03F 7/70441* (2013.01); *G03F 1/36* (2013.01); *G06F 30/398* (2020.01); *H01L 21/0274* (2013.01); *H01L 21/0337* (2013.01)

(58) Field of Classification Search
CPC ... G03F 1/36; G03F 1/70; G03F 7/705; G03F 1/76; G03F 7/70441; G03F 1/00; G03F 1/38; G03F 1/50; G03F 7/0002; G03F 7/70633; G03F 1/26; G03F 1/58; G03F 1/68; G03F 7/2022; G03F 7/70041; G03F 7/70291; G03F 7/704; G03F 7/70475; G03F 7/70725; G03F 7/70283; G03F 1/84; G03F 7/7065; G03F 1/32; G03F 1/78; H01L 23/5386; H01L 27/0688; H01L 21/28123;
(Continued)

(56) References Cited

U.S. PATENT DOCUMENTS 7,901,850 B2 3/2011 Fujimura et al.
8,056,021 B2 11/2011 Abrams et al.
(Continued)

*Primary Examiner* — Binh C Tat
(74) *Attorney, Agent, or Firm* — Myers Bigel, P.A.

(57) ABSTRACT

A method of fabricating a semiconductor device includes performing an optical proximity correction (OPC) operation on a layout and forming a photoresist pattern on a substrate using a photomask that is manufactured with the layout corrected by the OPC operation. The OPC operation includes sectioning the layout into a low-level patch and a high-level patch, performing a first OPC operation on the low-level patch, the first OPC operation including generating a first boundary correction pattern of a curvilinear shape on a boundary between the low-level patch and the high-level patch, performing a second OPC operation on the high-level patch, the second OPC operation including a second boundary correction pattern of a curvilinear shape on the boundary, and conforming the first boundary correction pattern and the second boundary correction pattern to each other to generate a conformed boundary correction pattern of a curvilinear shape.

16 Claims, 81 Drawing Sheets

(51) Int. Cl.
*G03F 7/00* (2006.01)
*H01L 21/027* (2006.01)
*H01L 21/033* (2006.01)

(58) Field of Classification Search
CPC ......... H01L 2027/11874; H01L 23/528; H01L 21/0274; H01L 2221/68345; H01L 29/7869; G06F 30/398; G06F 30/392; G06F 2119/06; G06F 2119/10; G06F 30/27; G06F 30/367; G06F 30/3953; G06F 18/23; G06F 2119/18; G06F 3/01; G06F 3/013; G06F 3/041; G06F 3/042; G06F 30/337
USPC ..................................................... 716/50–56
See application file for complete search history.

(56) References Cited

U.S. PATENT DOCUMENTS

| | | |
|---|---|---|
| 8,458,631 B2 | 6/2013 | Lu et al. |
| 9,430,607 B2 | 8/2016 | Tao et al. |
| 9,922,159 B2 | 3/2018 | Tiphine et al. |
| 9,996,658 B2 | 6/2018 | Kim et al. |
| 10,534,255 B2 | 1/2020 | Quaglio et al. |
| 10,877,380 B1* | 12/2020 | Lin ........................ G03F 1/36 |
| 2009/0241077 A1* | 9/2009 | Lippincott .......... G03F 7/70441 716/119 |
| 2018/0150578 A1* | 5/2018 | Lai ......................... G03F 7/705 |

* cited by examiner

FIG. 33A
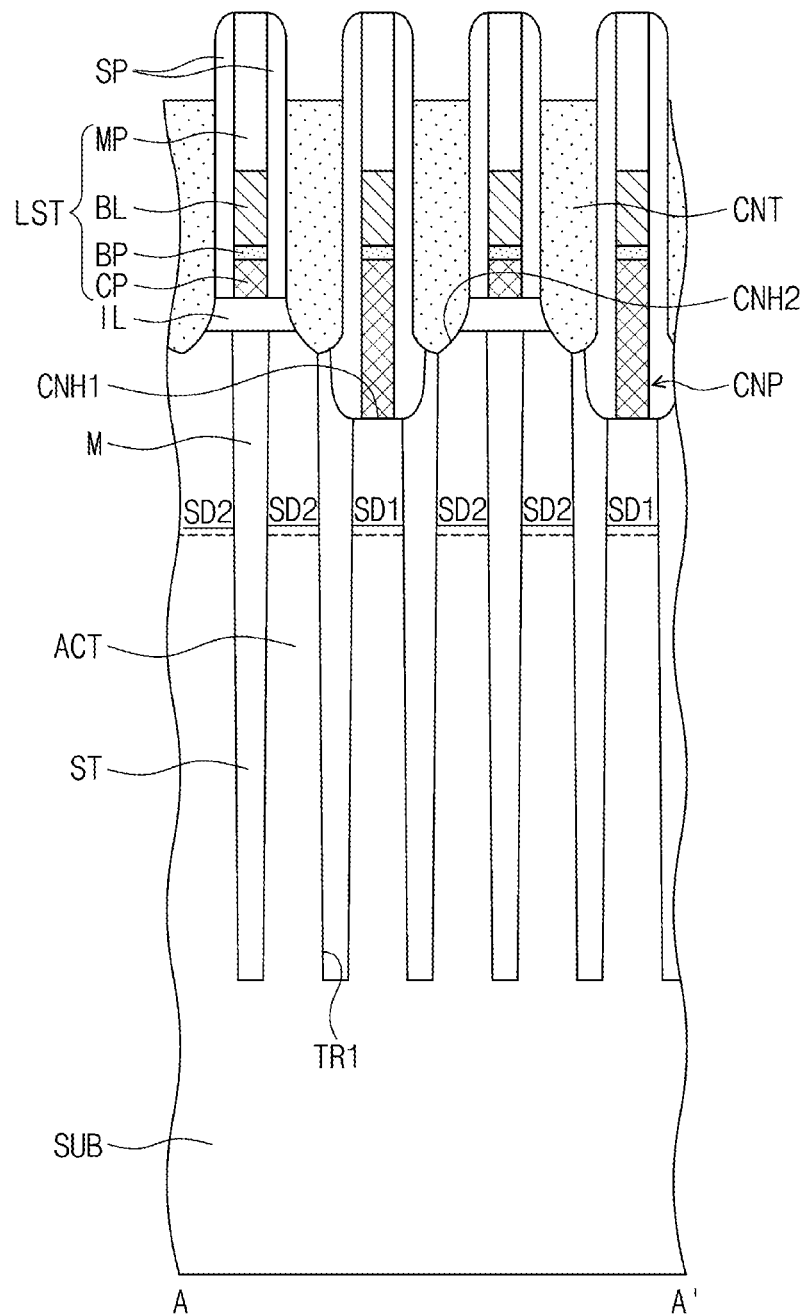
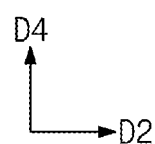

FIG. 33B
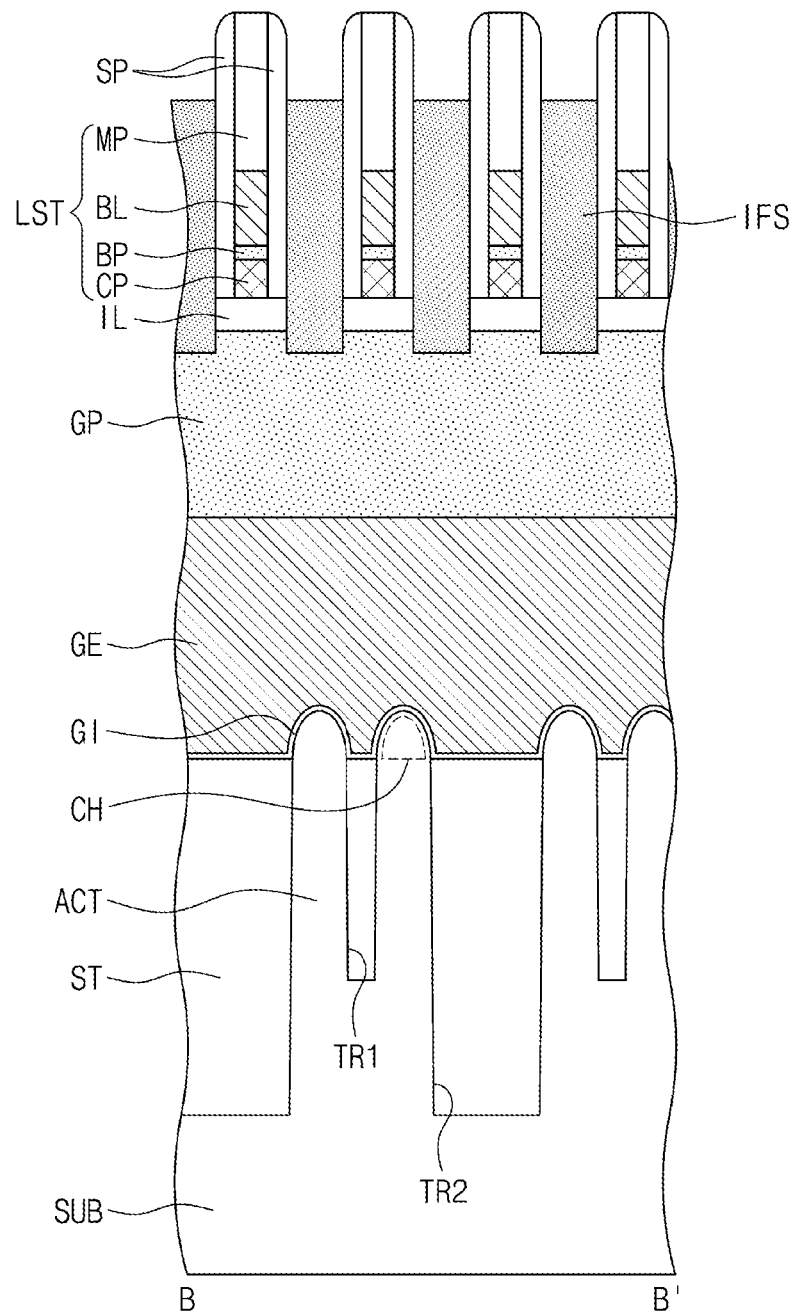
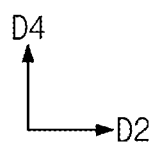

OPTICAL PROXIMITY CORRECTION METHOD AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2020-0170078, filed on Dec. 8, 2020, in the Korean Intellectual Property Office, the entire contents of which are hereby incorporated by reference.

BACKGROUND OF THE INVENTION

Embodiments of the present disclosure relate to a method of fabricating a semiconductor device, and in particular, to a method of fabricating a semiconductor device using an optical proximity correction (OPC) method.

Due to their small-sized, multifunctional, and/or low-cost characteristics, semiconductor devices are held in esteem as important elements in the electronics industry. The semiconductor devices may be classified into memory devices for storing data, logic devices for processing data, and hybrid devices including both memory and logic elements. As the electronics industry becomes more highly developed, there is an increasing demand for semiconductor devices with improved characteristics. For example, there is an increasing demand for semiconductor devices with high reliability, high performance, and/or multiple functions. To satisfy these technical requirements, complexity and/or integration density of semiconductor devices are being increased.

SUMMARY

Some embodiments of the inventive concept may provide an OPC method with high precision.

Some embodiments of the inventive concept may provide a method of fabricating a highly integrated and highly reliable semiconductor device.

According to an embodiment of the inventive concept, a method of fabricating a semiconductor device may include performing an optical proximity correction (OPC) operation on a layout and forming a photoresist pattern on a substrate using a photomask that is manufactured with the layout corrected by the OPC operation. The OPC operation may include sectioning the layout into a low-level patch and a high-level patch, performing a first OPC operation on the low-level patch, the first OPC operation including generating a first boundary correction pattern of a curvilinear shape on a boundary between the low-level patch and the high-level patch, performing a second OPC operation on the high-level patch, the second OPC operation including a second boundary correction pattern of a curvilinear shape on the boundary, and conforming the first boundary correction pattern and the second boundary correction pattern to each other to generate a conformed boundary correction pattern of a curvilinear shape.

According to an embodiment of the inventive concept, a method of fabricating a semiconductor device may include performing an optical proximity correction (OPC) operation on a layout and forming a photoresist pattern on a substrate using a photomask that is manufactured with the layout corrected by the OPC operation. The OPC operation may include performing a first OPC operation on a first patch of the layout, performing a second OPC operation on a second patch of the layout adjacent to the first patch, converting a first boundary correction pattern, which is generated on a boundary between the first patch and the second patch through the first OPC operation, to a first Manhattan pattern, converting a second boundary correction pattern, which is generated on the boundary through the second OPC operation, to a second Manhattan pattern, merging the first Manhattan pattern and the second Manhattan pattern to generate a single Manhattan pattern, and converting the single Manhattan pattern to a conformed boundary correction pattern.

According to an embodiment of the inventive concept, a method of fabricating a semiconductor device may include sectioning a layout into a first patch and a second patch, the layout including a first design pattern disposed in the first patch, a second design pattern in the second patch, and a boundary design pattern on a boundary between the first and second patches, performing a first OPC operation on the first patch to generate a first correction pattern and a first boundary correction pattern from the first design pattern and the boundary design pattern, respectively, performing a second OPC operation on the second patch to generate a second correction pattern and a second boundary correction pattern from the second design pattern and the boundary design pattern, respectively, converting the first boundary correction pattern to a first Manhattan pattern, converting the second boundary correction pattern to a second Manhattan pattern, merging the first and second Manhattan patterns to generate a single Manhattan pattern, converting the single Manhattan pattern to a conformed boundary correction pattern, manufacturing a photomask, using the layout that is corrected to include the first correction pattern, the second correction pattern, and the conformed boundary correction pattern, forming an etching target layer and a photoresist layer on a substrate, forming photoresist patterns by exposing the photoresist layer using the photomask and developing the photoresist layer, and patterning the etching target layer using the photoresist patterns.

BRIEF DESCRIPTION OF THE DRAWINGS

FIGS. 21A, 23A, 25A, 27A, 29A, 31A, 33A, and 35A are sectional views taken along lines A-A' of FIGS. 20, 22, 22, 24, 26, 28, 30, 32, and 34, respectively.

FIGS. 21B, 23B, 25B, 27B, 29B, 31B, 33B, and 35B are sectional views taken along lines B-B' of FIGS. 20, 22, 22, 24, 26, 28, 30, 32, and 34, respectively.

DETAILED DESCRIPTION

Figure 1:
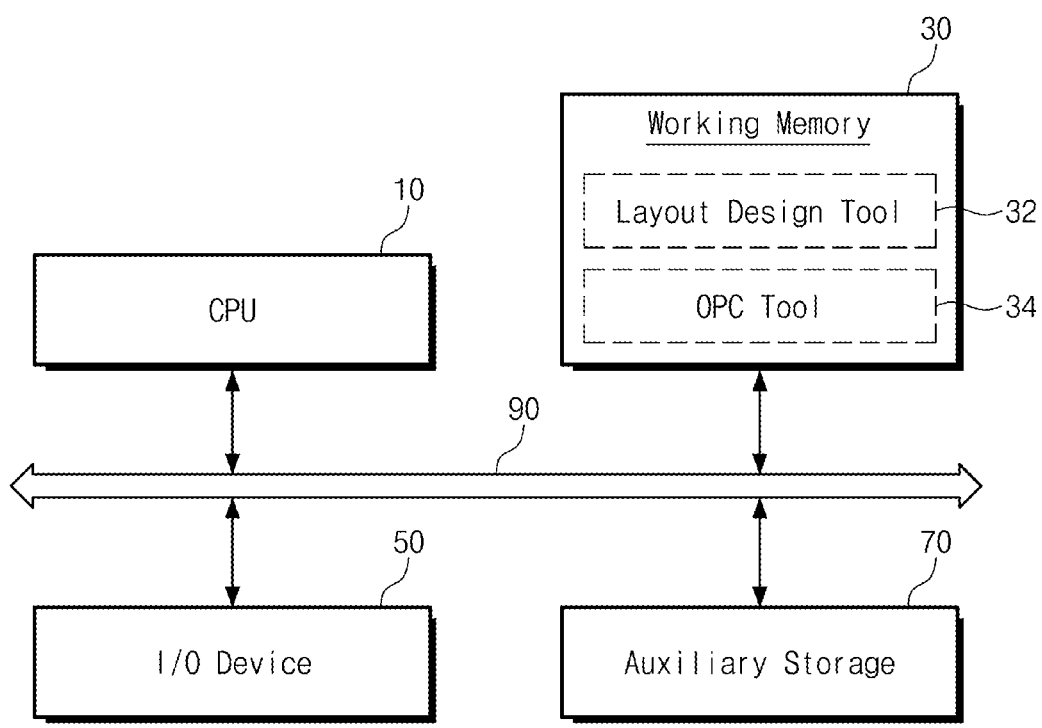
FIG. 1 is a block diagram illustrating a computer system for performing a semiconductor design process, according to an embodiment of the inventive concept.

Hereinafter, embodiments will be described in detail with reference to the accompanying drawings. Like numeral references refer to like elements, and their repetitive descriptions are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. FIG. 1 is a block diagram illustrating a computer system for performing a semiconductor design process, according to an embodiment of the inventive concept. Referring to FIG. 1, a computer system may include a central processing unit (CPU) 10, a working memory 30, an input-output device 50, and an auxiliary storage device 70. In some embodiments, the computer system may be a customized system for performing a layout design process according to some embodiments of the inventive concept. Furthermore, the computer system may include a computing system configured to execute various design and verification check simulation programs.

The CPU 10 may be configured to run a variety of software programs, such as application programs, operating systems, and device drivers. For example, the CPU 10 may be configured to run an operating system (not shown) loaded on the working memory 30. Furthermore, the CPU 10 may be configured to run various application programs on the operating system. For example, the CPU 10 may be configured to run a layout design tool 32 and/or OPC tool 34 loaded on the working memory 30.

The operating system or application programs may be loaded on the working memory 30. For example, when the computer system starts a booting operation, an OS image (not shown) stored in the auxiliary storage device 70 may be loaded on the working memory 30 according to a booting sequence. In the computer system, overall input/output operations may be managed by the operating system. Some application programs, which may be selected by a user or be provided for basic services, may be loaded on the working memory 30. According to some embodiments of the inventive concept, the layout design tool 32 and/or OPC tool 34 may be loaded on the working memory 30, from the auxiliary storage device 70.

The layout design tool 32 may provide a function for changing biasing data for specific layout patterns; for example, the layout design tool 32 may be configured to allow the specific layout patterns to have shapes and positions different from those defined by a design rule. The layout design tool 32 may be configured to perform a design rule check (DRC) under the changed condition of the bias data. The OPC tool 34 may be configured to perform an optical proximity correction (OPC) process on layout data, which is obtained by the layout design tool 32. The working memory 30 may be one of volatile memory devices (e.g., static random access memory (SRAM) or dynamic random access memory (DRAM) devices) or nonvolatile memory devices (e.g., PRAM, MRAM, ReRAM, FRAM, NOR FLASH memory devices).

The input-output device 50 may be configured to control user input and output operations of user interface devices. For example, the input-output device 50 may include a keyboard or a monitor, allowing a designer to input relevant information. By using the input-output device 50, the designer may receive information on several regions or data paths, to which adjusted operating characteristics will be applied, of a semiconductor device. The input-output device 50 may be configured to display a progress status or a process result of the OPC tool 34.

The auxiliary storage device 70 may serve as a storage medium for the computer system. The auxiliary storage device 70 may be configured to store application programs, an OS image, and various data. The auxiliary storage device 70 may be provided in the form of one of memory cards (e.g., MMC, eMMC, SD, MicroSD, and so forth) or a hard disk drive (HDD). The auxiliary storage device 70 may include a NAND FLASH memory device with a large memory capacity. In other embodiments, the auxiliary storage device 70 may include at least one of next-generation nonvolatile memory devices (e.g., PRAM, MRAM, ReRAM, or FRAM) or NOR FLASH memory devices.

A system interconnector 90 may serve as a system bus for realizing a network in the computer system. The CPU 10, the working memory 30, the input-output device 50, and the auxiliary storage device 70 may be electrically connected to each other through the system interconnector 90, and thus, data may be exchanged therebetween. However, the system interconnector 90 may not be limited to the afore-described configuration; for example, it may further include an additional element for increasing efficiency in data communication.

Figure 2:
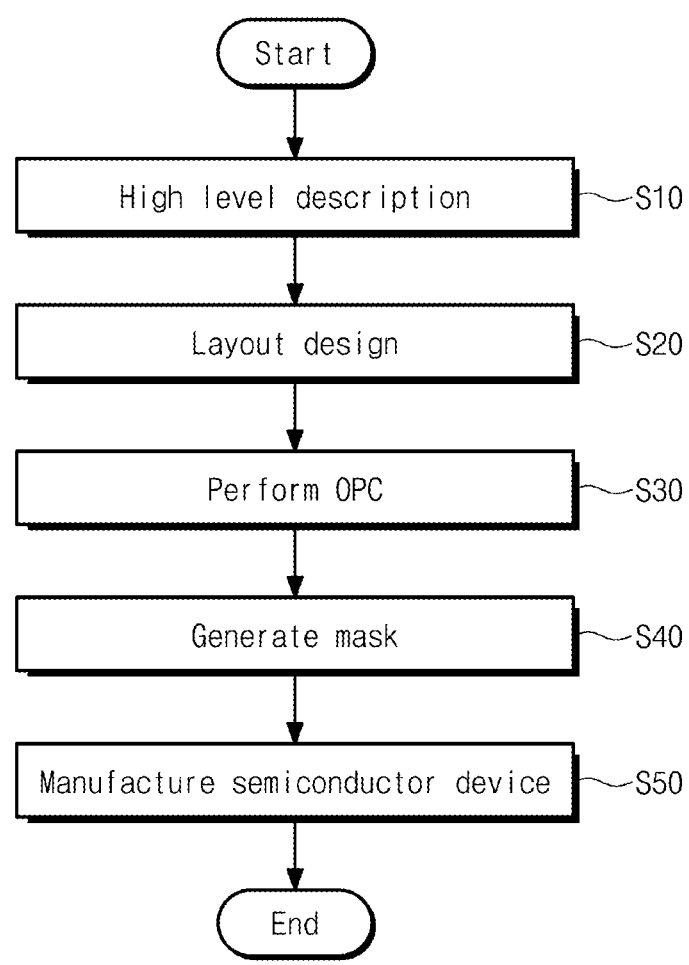
FIG. 2 is a flow chart illustrating a method of designing and fabricating a semiconductor device, according to an embodiment of the inventive concept.

FIG. 2 is a flow chart illustrating a method of designing and fabricating a semiconductor device, according to an embodiment of the inventive concept.

Referring to FIG. 2, a high-level design process for a semiconductor integrated circuit may be performed using the computer system described with reference to FIG. 1 (in S10). For example, in the high-level design process, an integrated circuit to be designed may be described in terms of high-level computer language (e.g., C language). Circuits designed by the high-level design process may be more concretely described by a register transfer level (RTL) coding or a simulation. Furthermore, codes generated by the RTL coding may be converted into a netlist, and the results may be combined with each other to wholly describe a semiconductor device. The combined schematic circuit may be verified by a simulation tool. In certain embodiments, an adjusting operation may be further performed, in consideration of a result of the verification step.

A layout design process may be performed to realize a logically complete form of the semiconductor integrated circuit on a silicon wafer (in S20). For example, the layout design process may be performed based on the schematic circuit prepared in the high-level design process or the corresponding netlist. The layout design process may include a routing step of placing and connecting various standard cells that are provided from a cell library, based on a predetermined design rule.

The cell library may contain information on operation, speed, and power consumption of cells. In certain embodiments, a cell library for representing a layout of a circuit in a gate level may be defined in or by the layout design tool. Here, the layout may be prepared to define or describe shapes, positions, or dimensions of patterns constituting transistors and metal interconnection lines, which will be actually formed on a silicon wafer. For example, to actually form an inverter circuit on a silicon wafer, it may be necessary to prepare or draw a layout for patterns (e.g., PMOS, NMOS, N-WELL, gate electrodes, and metal interconnection lines thereon). For this, at least one of the inverters defined in the cell library may be selected.

Furthermore, a routing operation of connecting the selected cells to each other may be performed. In detail, the routing operation may be performed on the selected and disposed standard cells to connect them to upper interconnection lines. These operations may be automatically or manually performed in the layout design tool. In certain embodiments, an operation of placing the standard cells and establishing routing structures thereto may be automatically performed by a Place & Routing tool.

After the routing operation, a verification operation may be performed on the layout to check whether there is a portion violating the given design rule. In some embodiments, the verification operation may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an electrical disconnection issue in the layout. The evaluating of the LVS item may be performed to evaluate whether the layout is prepared to coincide with the gate-level netlist.

An optical proximity correction (OPC) operation may be performed (in S30). The OPC step may be performed to correct optical proximity effects, which may occur when a photolithography process is performed on a silicon wafer using a photomask manufactured based on the layout. The optical proximity effect may be an unintended optical effect (such as refraction or diffraction), which may occur in the exposing process using the photomask manufactured based on the layout. In the OPC operation, the layout may be modified to have a reduced difference in shape between designed patterns and actually-formed patterns, which may be caused by the optical proximity effects. As a result of the OPC step, the shapes and positions of patterns in the designed layout may be changed or biased. The OPC operation will be described in more detail with reference to FIGS. 4 to 17.

A photomask may be manufactured, based on the layout modified by the OPC operation (in S40). In general, the photomask may be manufactured by patterning a chromium layer provided on a glass substrate, using the layout pattern data.

The manufactured photomask may be used to manufacture a semiconductor device (in S50). In the actual fabricating process, the exposing and etching operations may be repeatedly performed, and thus, patterns defined in the layout design process may be sequentially formed on a semiconductor substrate.

Figure 3:
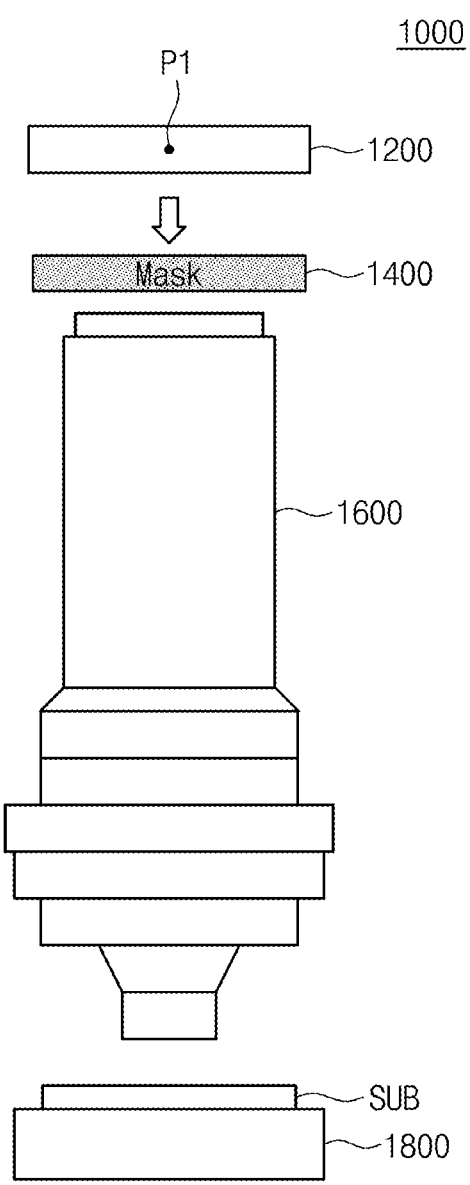
FIG. 3 is a conceptual diagram illustrating a photolithography system, in which a photomask according to an embodiment of the inventive concept is used.

FIG. 3 is a conceptual diagram illustrating a photolithography system, in which a photomask according to some embodiments of the inventive concept is used. A photolithography system 1000 may include a light source 1200, a photomask 1400, a reduction projection apparatus 1600, and a substrate stage 1800. Although not illustrated in FIG. 3, some additional elements may be provided in the photolithography system 1000. For example, the photolithography system 1000 may further include a sensor for measuring a height and a slope of a top surface of a substrate SUB.

The light source 1200 may be configured to emit light. The light emitted from the light source 1200 may be incident into the photomask 1400. To control a focal length, a lens may be provided between the light source 1200 and the photomask 1400. The light source 1200 may be configured to emit an ultraviolet light; for example, the light source 1200 may be a KrF light source (at 234 nm), an ArF light source (at 193 nm), or an extreme ultraviolet (EUV) light source. The light source 1200 according to an embodiment of the inventive concept may be the EUV light source. The light source 1200 may include a single point light source P1, but the inventive concept may not be limited thereto. In certain embodiments, the light source 1200 may be configured to have a plurality of point light sources.

The photomask 1400 may include image patterns, which are used to transcribe or print the designed layout onto the substrate SUB. The image patterns may be formed, based on layout patterns, which are prepared through layout design and OPC operations described above. The image patterns may be defined by transparent and opaque regions formed on the photomask 1400. The transparent region may be formed by etching the metal layer (e.g., the chromium layer) that is provided on the photomask 1400. The transparent region may be configured to allow light, which is incident from the light source 1200, to propagate toward the substrate SUB. By contrast, the opaque region may be configured to reduce or prevent the light from propagating toward the substrate SUB.

The light passing through the transparent region of the photomask 1400 may be incident into a photoresist layer, which is formed on the substrate SUB, through the reduction projection apparatus 1600, and as a result, photoresist patterns may be formed on the substrate SUB. The photoresist patterns may have shapes corresponding to the image patterns of the photomask 1400. That is, by using the reduction projection apparatus 1600, it may be possible to form the photoresist patterns, whose shapes are defined by the image patterns of the photomask 1400, on the substrate SUB.

The substrate stage 1800 may be configured to support the substrate SUB. The substrate SUB may include, for example, a silicon wafer. The reduction projection apparatus 1600 may include an aperture. The aperture may be used to control a depth of focus, when the ultraviolet light emitted from the light source 1200 is incident onto the substrate SUB. As an example, the aperture may include a dipole or quadruple aperture. The reduction projection apparatus 1600 may further include a lens for controlling a focal length.

As an integration density of a semiconductor device increases, a distance between the image patterns of the photomask 1400 may be reduced, thereby causing a proximity issue, such as undesired interference and diffraction. As a result of the proximity issue, the photoresist patterns formed on the substrate SUB may have distorted shapes (i.e., different from those of the image patterns of the photomask 1400). The distortion of the photoresist patterns may lead to malfunction of an electronic device or circuit to be formed on the substrate SUB.

A resolution enhancement technology may be used to reduce or prevent the distortion of the photoresist patterns. An OPC technology, which is used in the step S30 of FIG. 2, may be an example of the resolution enhancement technology. According to the OPC technology, the optical distortion issue, which is caused by interference and diffraction, may be quantitatively predicted by a simulation process using an OPC model. The designed layout may be corrected or biased, based on the predicted result. Based on the corrected layout, image patterns may be formed on the photomask 1400, and in the case where the photomask 1400 is manufactured by this method, the photoresist patterns may be formed in desired shapes on the substrate SUB.

A layout of a semiconductor device may include a plurality of layers. In some embodiments, the OPC step may be performed to correct a layout for each of the layers. In other words, the OPC step may be independently performed on each of the plurality of layers. A semiconductor device may be fabricated by forming the plurality of layers on a substrate through a semiconductor process. As an example, a semiconductor device may include a plurality of metal layers, which are stacked to realize a specific circuit.

Figure 4:
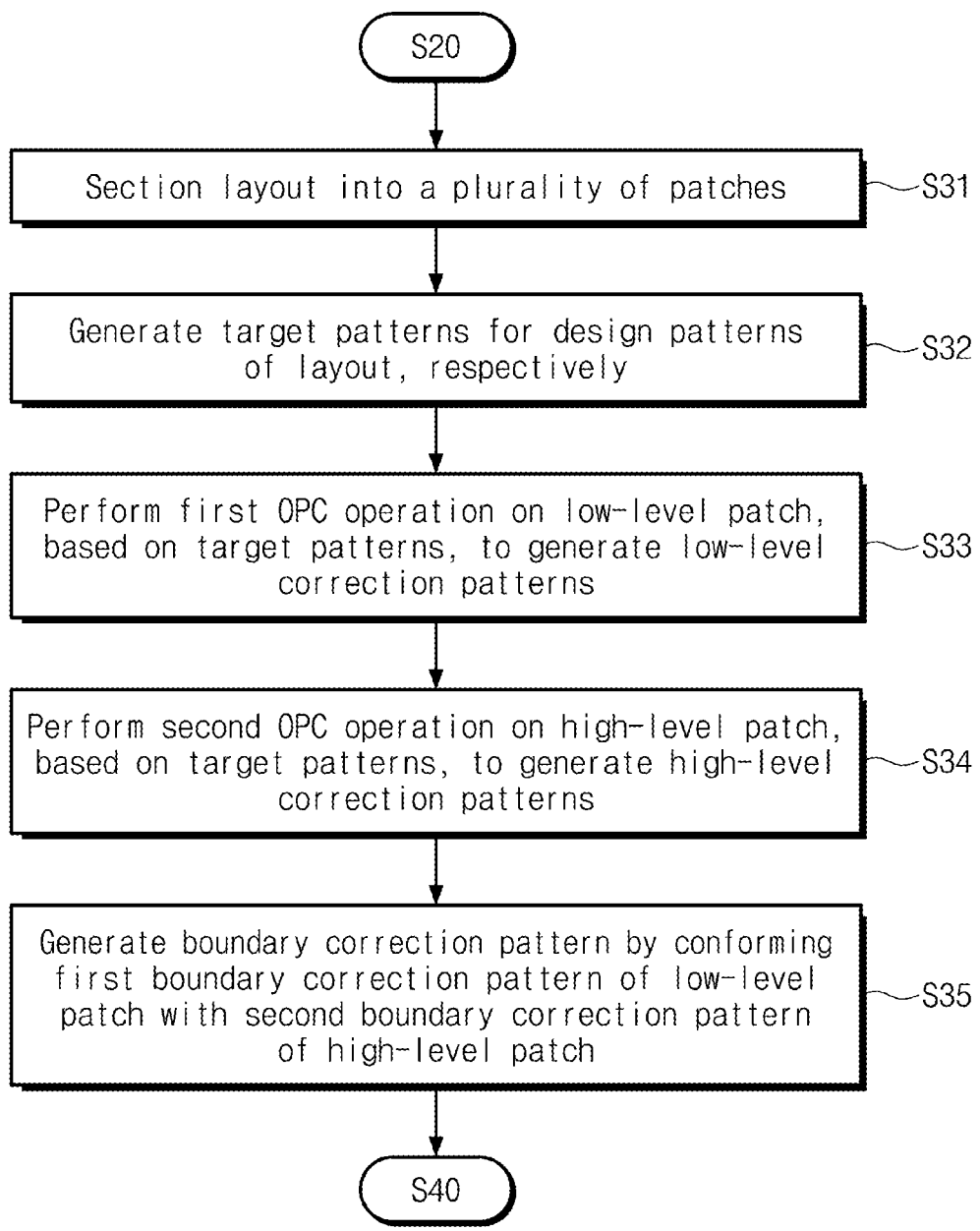
FIG. 4 is a flow chart schematically illustrating some operations in an optical proximity correction process according to an embodiment of the inventive concept.

FIG. 4 is a flow chart schematically illustrating some operations in an optical proximity correction process according to an embodiment of the inventive concept. FIGS. 5-11 are layout diagrams illustrating the optical proximity correction process of FIG. 4.

Figure 5:
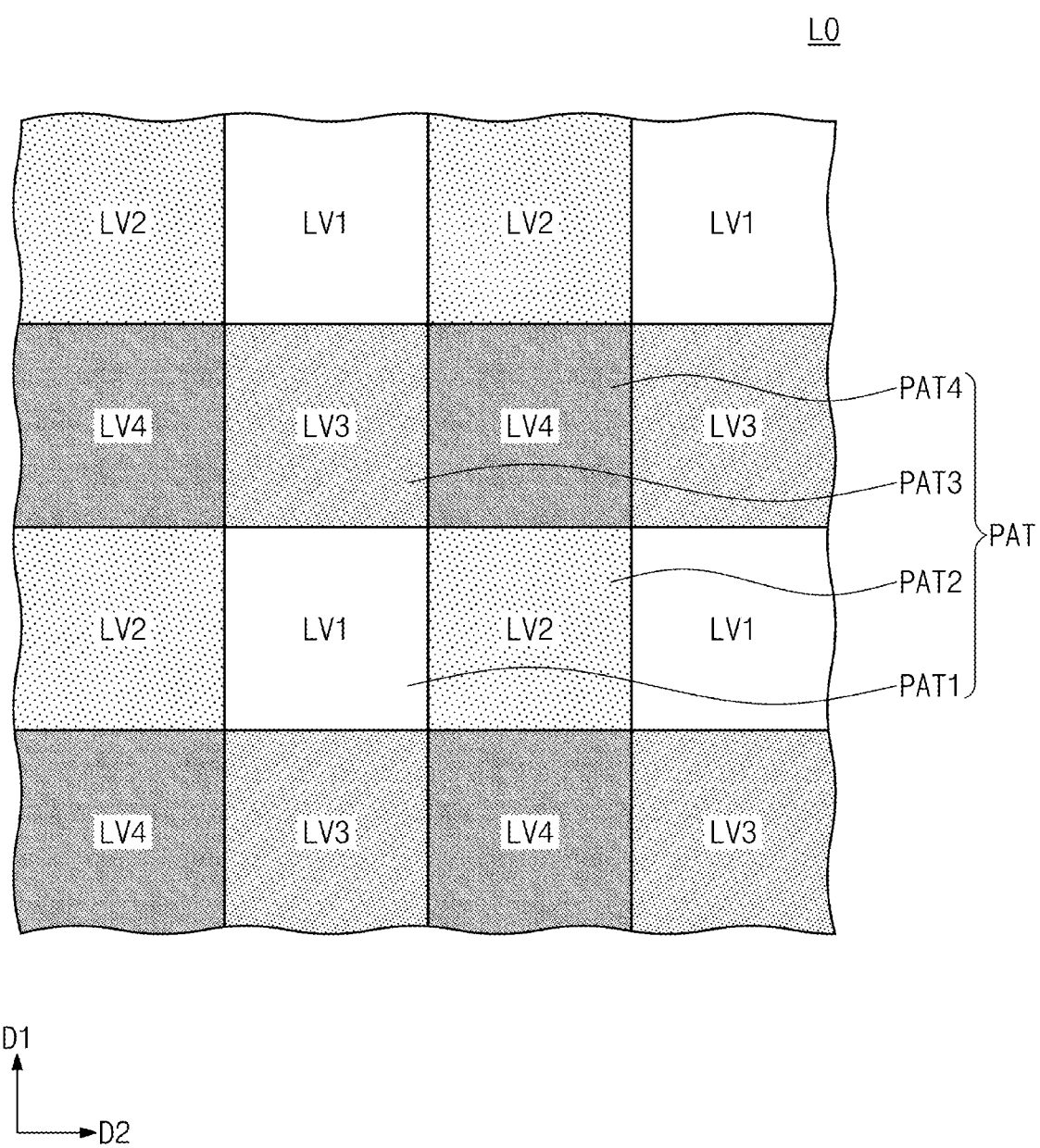
FIGS. 5-11 are layout diagrams illustrating the optical proximity correction process of FIG. 4.

Referring to FIGS. 4 and 5, a layout LO may be generated by the layout design process S20 previously described with reference to FIG. 2. The layout LO may be a layout for a single layer.

The layout LO may be sectioned into a plurality of patches PAT (in S31). It may be impossible to perform an OPC process on the entirety of the layout LO of a full-chip size. Thus, the layout LO may be sectioned into a plurality of the patches PAT, and each of the patches PAT may be sectioned to have a size, to which the OPC operation can be performed.

The patches PAT may include a first patch PAT1, a second patch PAT2, a third patch PAT3, and a fourth patch PAT4. First to fourth levels LV1 to LV4 may be assigned to the first to fourth patches PAT1 to PAT4, respectively. In other words, the first patch PAT1 may have the first level LV1, the second patch PAT2 may have the second level LV2, the third patch PAT3 may have the third level LV3, and the fourth patch PAT4 may have the fourth level LV4. The first to fourth patches PAT1 to PAT4 may be repeatedly provided on a two-dimensional plane.

A plurality of OPC operations may be sequentially performed according to the levels of the patches PAT. For example, a first OPC operation may be performed on the first patches PAT1 of the first level LV1, a second OPC operation may be performed on the second patches PAT2 of the second level LV2, a third OPC operation may be performed on the third patches PAT3 of the third level LV3, and a fourth OPC operation may be performed on the fourth patches PAT4 of the fourth level LV4. A final OPC result for the layout LO may be generated by gathering and combining the results of the first to fourth OPC operations.

Hereinafter, the OPC operations on the first patch PAT1 of the first level LV1 and the second patch PAT2 of the second level LV2 will be described by way of example and without any limitation.

Figure 6:
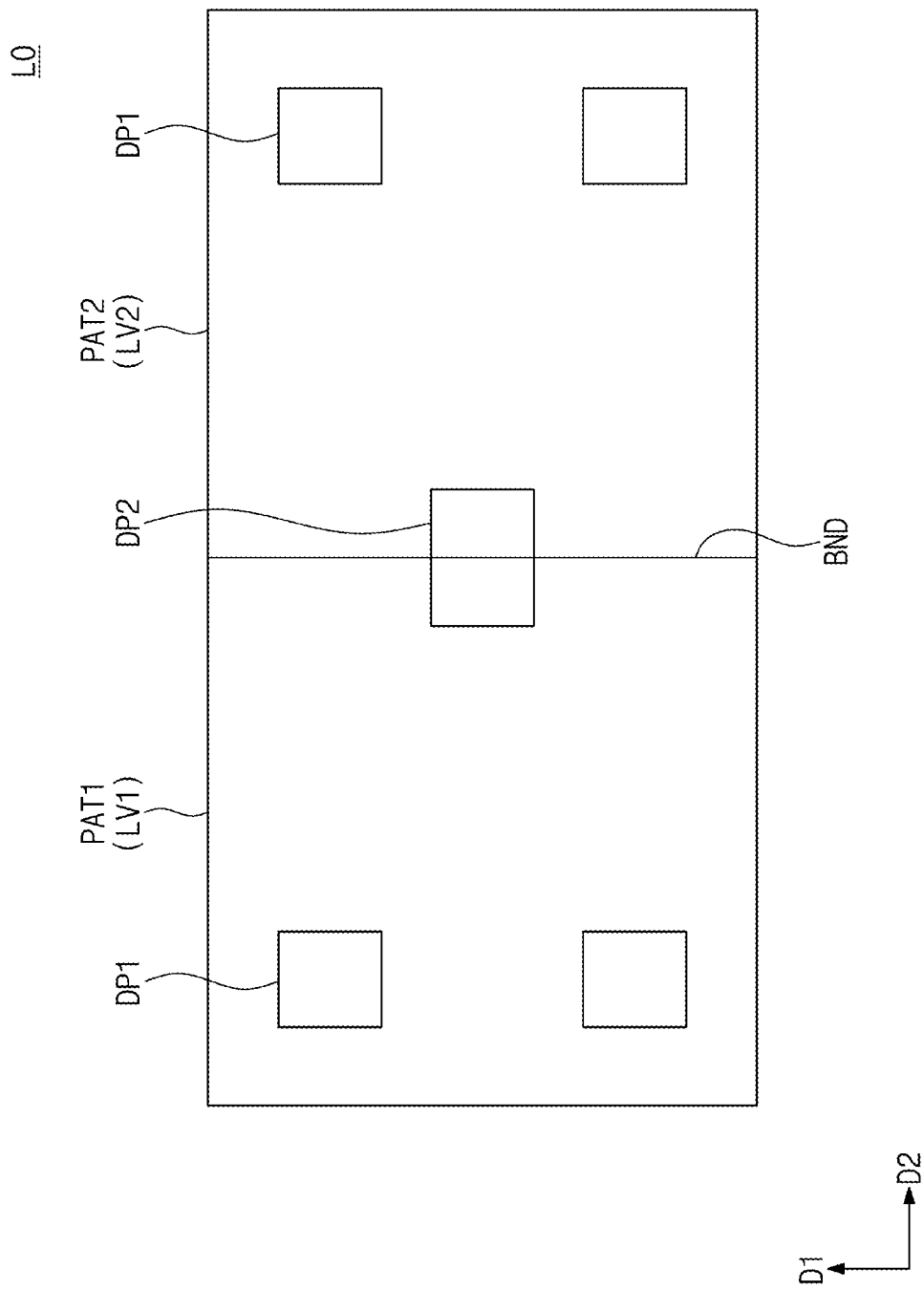

Referring to FIGS. 4 and 6, the layout LO, which is composed of the first and second patches PAT1 and PAT2, may include a plurality of design patterns DP1 and DP2. In detail, each of the first and second patches PAT1 and PAT2 may include first design patterns DP1 provided therein. A second design pattern DP2 may be placed on a boundary BND between the first patch PAT1 and the second patch PAT2. The second design pattern DP2 may be a boundary design pattern. The first patch PAT1 may include a portion of the second design pattern DP2, and the second patch PAT2 may include the remaining portion of the second design pattern DP2.

Figure 7:
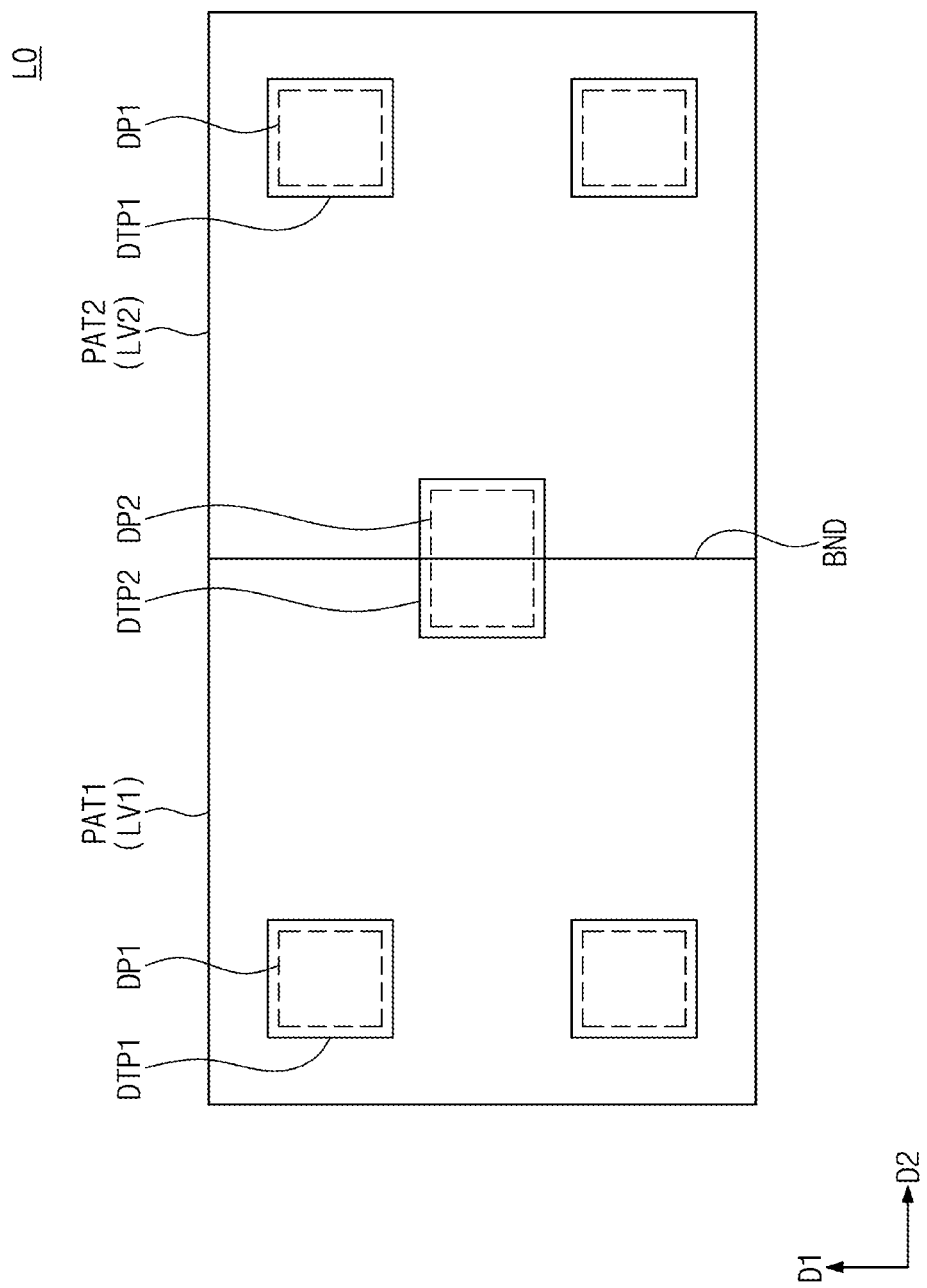

Referring to FIGS. 4 and 7, first and second target patterns DTP1 and DTP2 may be generated for the first and second design patterns DP1 and DP2 (in S32). Each of the first and second target patterns DTP1 and DTP2 may be generated from a corresponding design pattern through a table-driven layout operation (TDLO). The second target pattern DTP2 may be a boundary target pattern located on a boundary BND between the first and second patches PAT1 and PAT2.

Each of the first and second target patterns DTP1 and DTP2 may be generated to define a size of a photoresist pattern, which will be formed by developing a photoresist layer during a photolithography process. That is, each of the first and second target patterns DTP1 and DTP2 may be generated to define a target size of a corresponding photoresist pattern, which will be actually formed in the developing operation.

According to an embodiment of the inventive concept, each of the first and second design patterns DP1 and DP2 may define a size of a final pattern, which will be formed in an etching target layer below the photoresist pattern. The final pattern, which will be formed in the etching target layer, may have a size that is smaller than the size of the photoresist pattern formed by the photolithography process. This is because the etching target layer is formed to have an inclined etching profile when it is etched using the photoresist pattern as an etch mask. In sum, the generation of the target pattern (in S32) may be a process that is performed to correct a difference in size between a photoresist pattern formed by developing a photoresist layer and a final pattern formed in an etching target layer.

Figure 8:
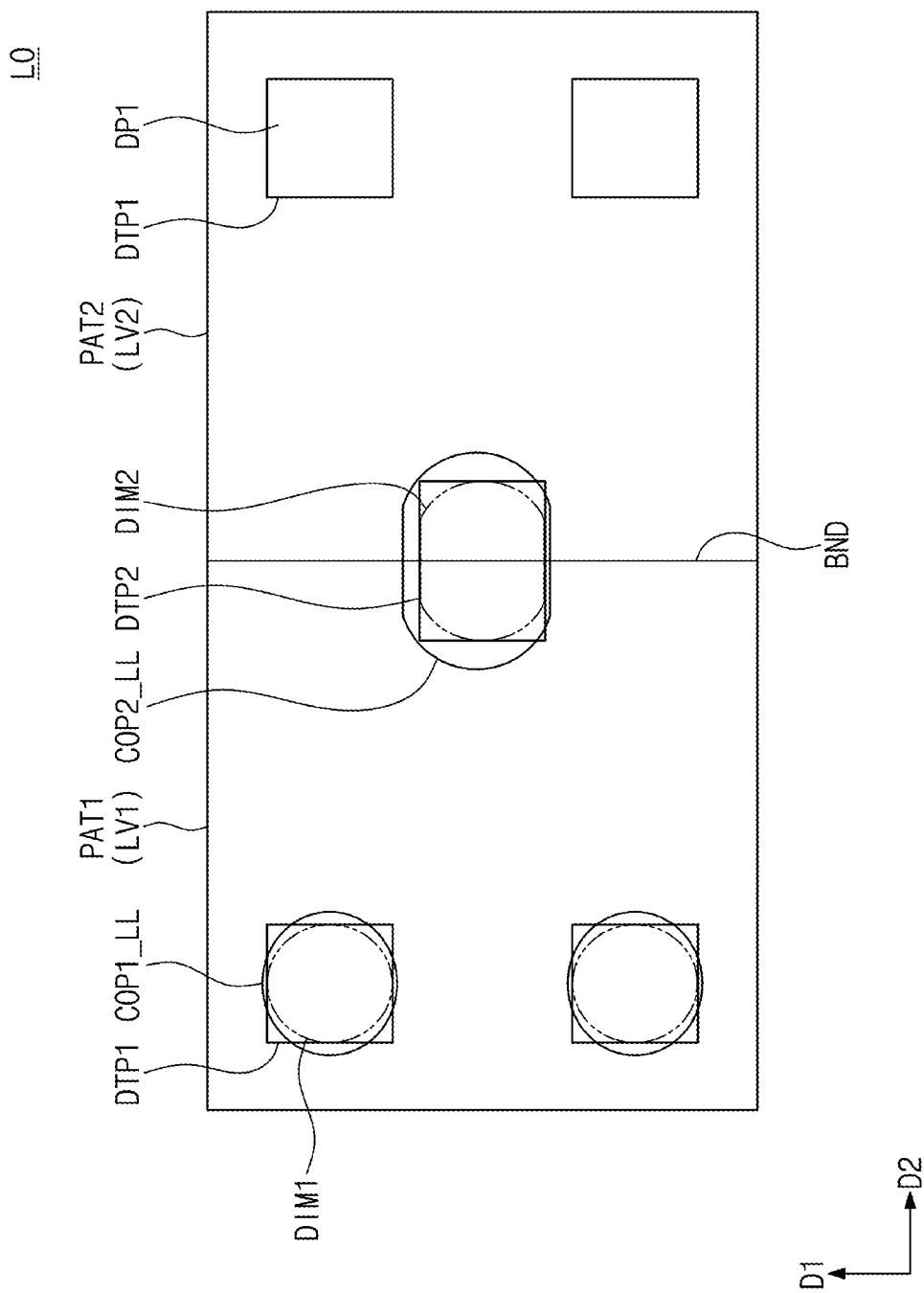

Referring to FIGS. 4 and 8, the first OPC operation may be performed on the first patch PAT1, which is a low-level patch, to generate low-level correction patterns COP1_LL and COP2_LL (in S33). The first OPC operation may be performed under a mask rule. The mask rule may be prepared to define the minimum distance between image patterns, which will be formed in the photomask 1400 of FIG. 3. The first OPC operation may be selectively performed on only the first patch PAT1 and may not be performed on the second patch PAT2, which is a high-level patch.

In detail, the first OPC operation may be performed on the first and second design patterns DP1 and DP2 of the first patch PAT1, which are based on the first and second target patterns DTP1 and DTP2 that have been generated in the previous step. As a result, first and second low-level correction patterns COP1_LL and COP2_LL may be generated from the first and second design patterns DP1 and DP2, respectively.

In the first OPC operation, the entirety of the second design pattern DP2 positioned on the boundary BND may be chosen as a target of the OPC operation. That is, in the first OPC operation, a target region, to which the first OPC operation is applied, may be expanded to a region of the second patch PAT2, which is adjacent to the first patch PAT1, to allow the target region of the first OPC operation to include the entirety of the second design pattern DP2 on the boundary BND.

The first low-level correction pattern COP1_LL may have a first simulation image DIM1, which is generated through a simulation process using an OPC model. In the OPC simulation process, the first low-level correction pattern COP1_LL may be generated to obtain the first simulation image DIM1 maximally conforming to the first target pattern DTP1 in its size and position. During the first OPC operation, the low-level correction patterns COP1_LL and COP2_LL may be generated to meet the mask rule for the minimum distance between them.

In an embodiment, by using an inverse lithography technology (ILT), which is a technology used in OPC, the first low-level correction pattern COP1_LL may be generated in a curvilinear shape. In other words, the OPC correction pattern according to the present embodiments may have a curvilinear shape.

In the case where the OPC correction pattern has a curvilinear shape, it may have some advantages over a Manhattan shape, which will be described below. First, during the OPC operation, the use of the curvilinear pattern may make it possible to effectively exploit an area of the mask layout, compared with the Manhattan-shaped pattern, and thus, the mask rule may be more easily satisfied. Also, in the fabrication of the photomask 1400, it may be possible to more precisely realize the curvilinear pattern on the photomask 1400 compared with the Manhattan-shaped pattern with sharp corners. This is because the curvilinear pattern, rather than the Manhattan-shaped pattern, may be more precisely realized by an e-beam patterning process, which is performed on a chromium layer, as a part of the fabrication of the photomask 1400. Furthermore, for the curvilinear pattern rather than the Manhattan-shaped pattern, it may be possible to more precisely realize a desired size and a desired shape of an actual photoresist pattern, which is formed by a developing operation of a photolithography process.

The second low-level correction pattern COP2_LL may be generated from the second design pattern DP2 positioned on the boundary BND. The second low-level correction pattern COP2_LL may have a second simulation image DIM2, which is generated through a simulation process using an OPC model. In the OPC simulation process, the second low-level correction pattern COP2_LL may be generated to obtain the second simulation image DIM2 maximally conforming to the second target pattern DTP2 in its size and position. The second low-level correction pattern COP2_LL may also be generated in a curvilinear shape.

Figure 9:
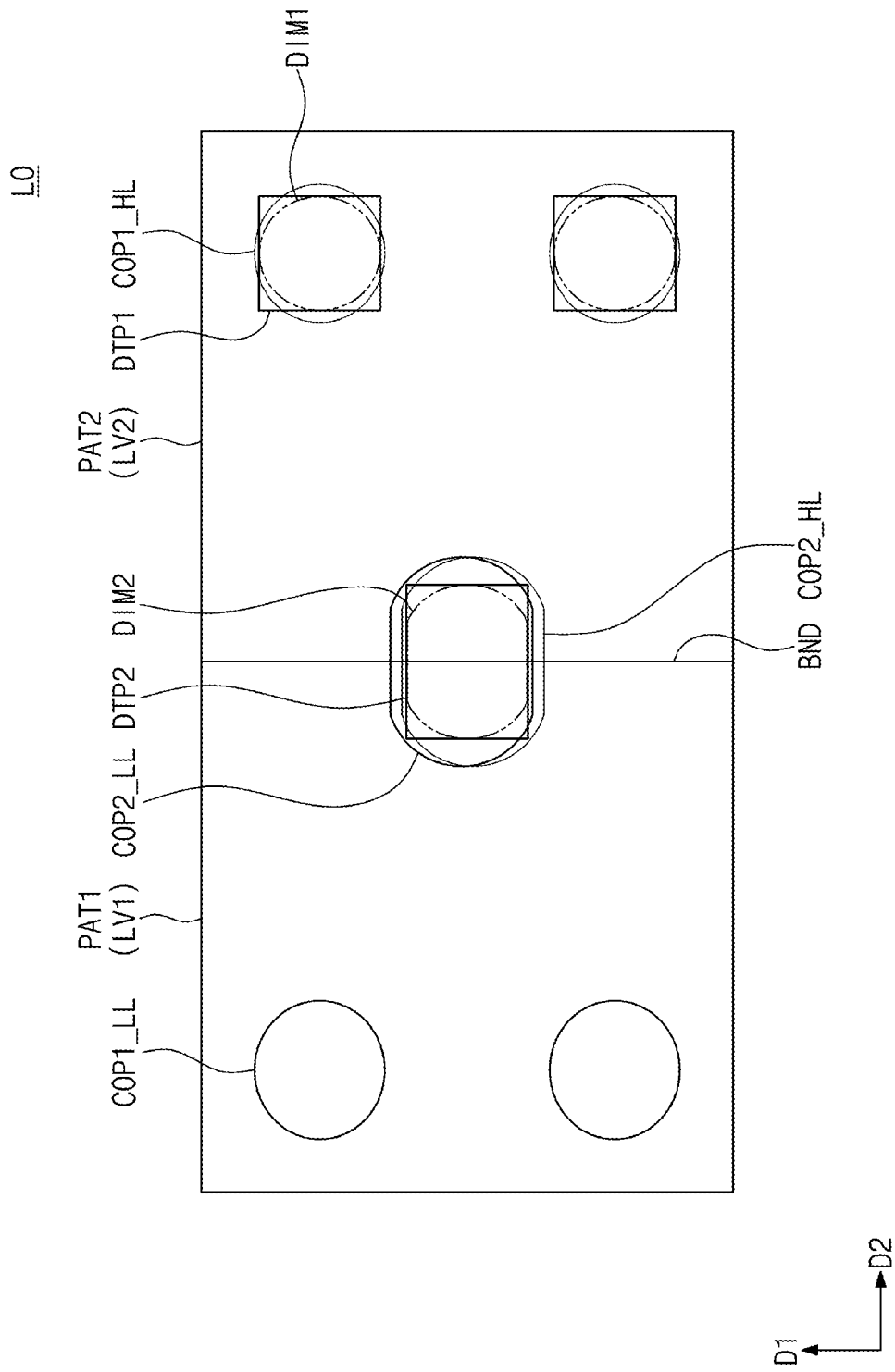

Referring to FIGS. 4 and 9, a second OPC operation may be performed on the second patch PAT2, which is the high-level patch, to generate high-level correction patterns COP1_HL and COP2_HL (in S34). The second OPC operation may be performed under a mask rule. The second OPC operation may be performed on only the second patch PAT2.

In the second OPC operation, the entirety of the second design pattern DP2 positioned on the boundary BND may be chosen as a target of the OPC operation.

The second OPC operation may be performed on the first and second design patterns DP1 and DP2 of the second patch PAT2 based on the first and second target patterns DTP1 and DTP2 that have been generated in the previous operation. As a result, first and second high-level correction patterns COP1_HL and COP2_HL may be generated from the first and second design patterns DP1 and DP2, respectively. Each of the first and second high-level correction patterns COP1_HL and COP2_HL may have a curvilinear shape. The second OPC operation may be performed in substantially the same manner as the first OPC operation.

Figure 10:
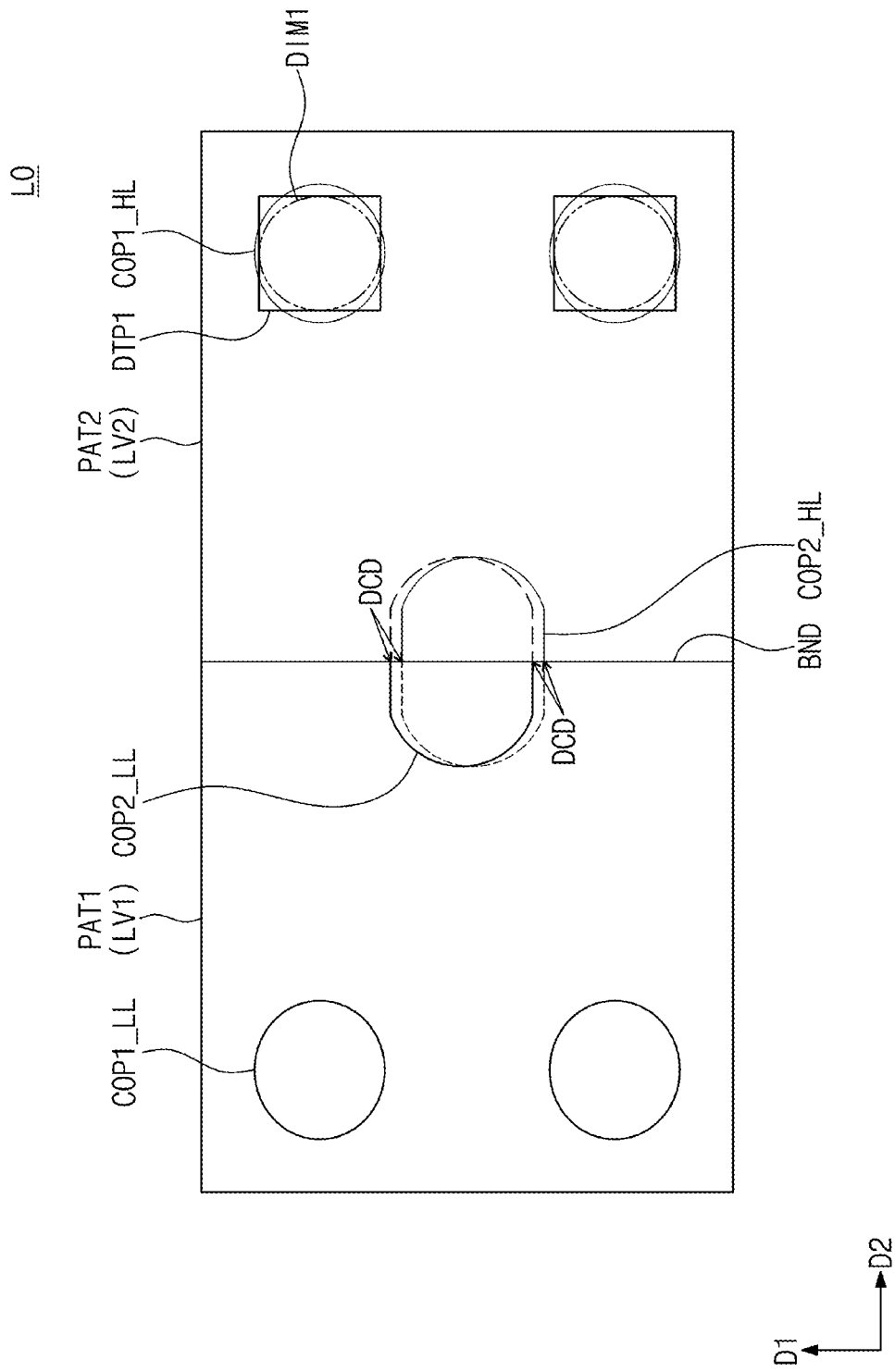

Referring to FIGS. 4 and 10, on the boundary BND, the second low-level correction pattern COP2_LL obtained by the first OPC operation may not conform to the second high-level correction pattern COP2_HL obtained by the second OPC operation. Hereinafter, the second low-level correction pattern COP2_LL will be referred to as a first boundary correction pattern COP2_LL, and the second high-level correction pattern COP2_HL will be referred to as a second boundary correction pattern COP2_HL.

The first boundary correction pattern COP2_LL may be a pattern that is generated based on the relation with patterns, which are adjacent to the first patch PAT1, and the design rule, and the second boundary correction pattern COP2_HL may be a pattern that is generated based on the relation with patterns, which are adjacent to the second patch PAT2, and the design rule. Thus, the first and second boundary correction patterns COP2_LL and COP2_HL may not conform to each other, although they are generated for the same pattern (i.e., the second target pattern DTP2). On the boundary BND, there may be an incongruity DCD between the first and second boundary correction patterns COP2_LL and COP2_HL.

For example, the first and second boundary correction patterns COP2_LL and COP2_HL may be different from each other in terms of size and shape. A center of the first boundary correction pattern COP2_LL may be offset from a center of the second boundary correction pattern COP2_HL.

Figure 11:
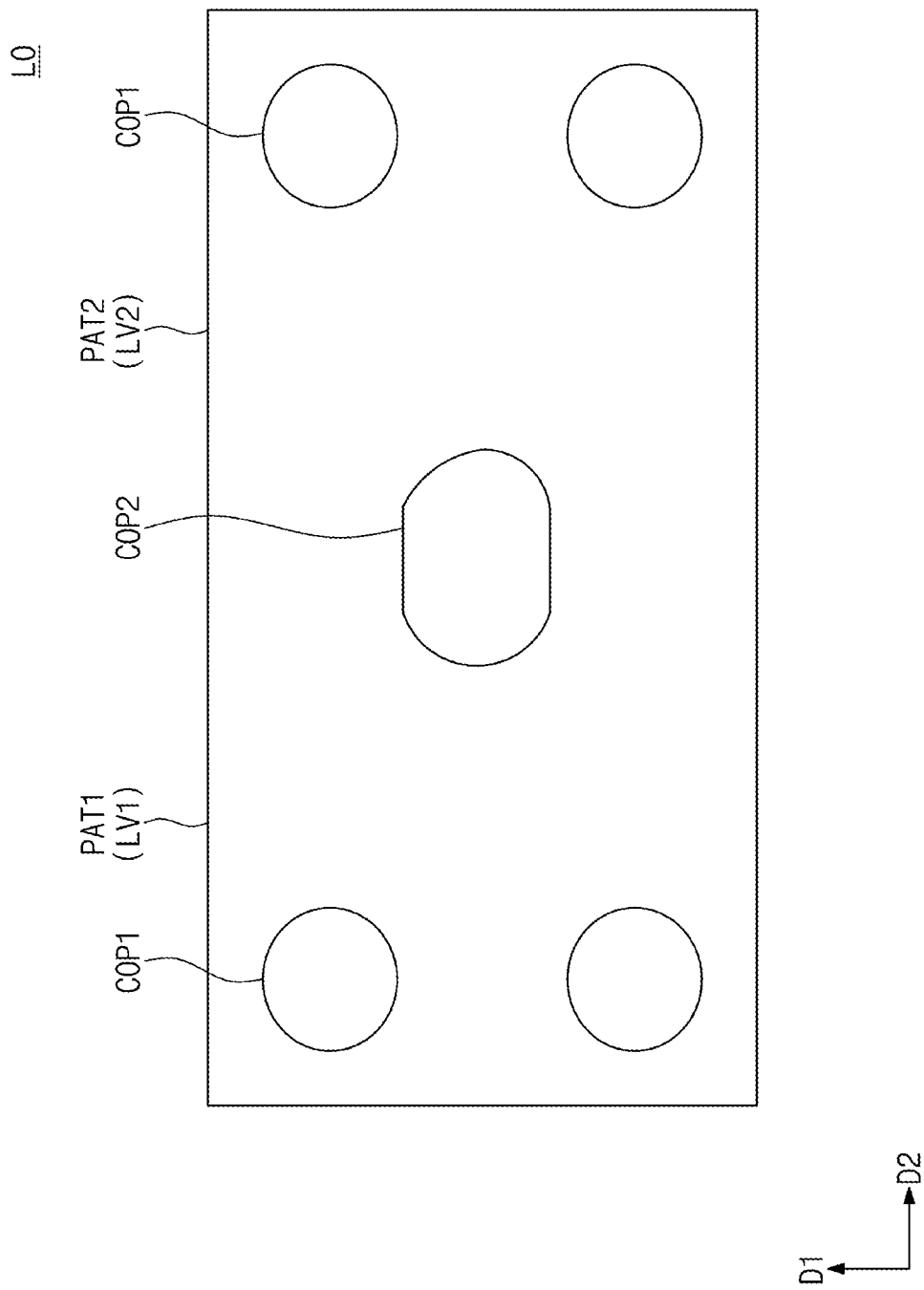

Referring to FIGS. 4 and 11, a single correction pattern, which will be referred to as a boundary correction pattern COP2, may be generated by conforming one of the first and second boundary correction patterns COP2_LL and COP2_HL to the other (in S35). As shown in FIG. 11, the final result of the OPC operation may be generated by gathering and combining the results, which are obtained by the first and second OPC operations.

Figure 12:
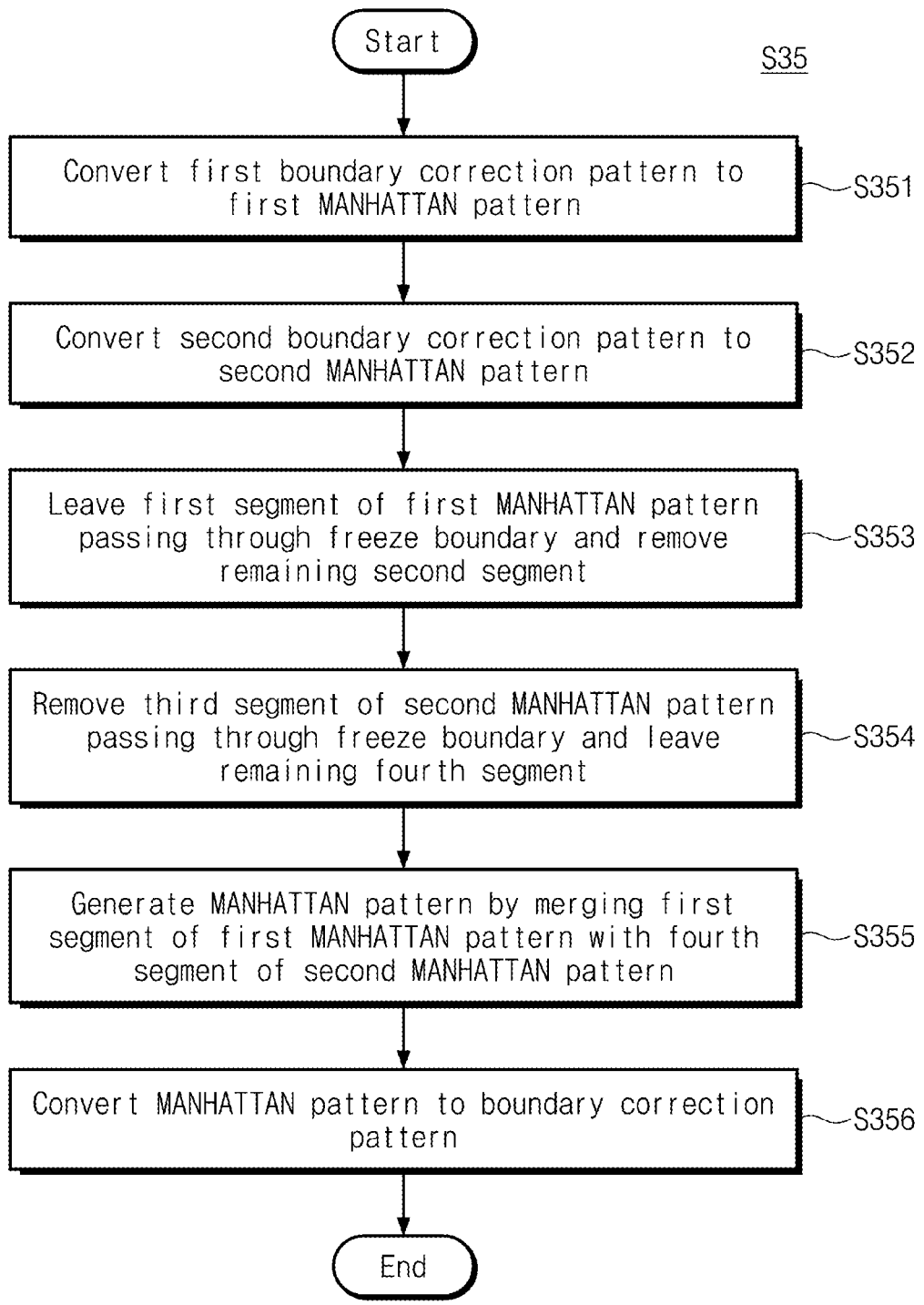
FIG. 12 is a flow chart schematically illustrating a process of generating a boundary correction pattern of FIG. 4.

Hereinafter, the process of conforming the first and second boundary correction patterns COP2_LL and COP2_HL to each other to generate the boundary correction pattern COP2 will be described in more detail. FIG. 12 is a flow chart schematically illustrating a process of generating a boundary correction pattern of FIG. 4. FIGS. 13, 14, 15, 16, and 17 are layout plan views schematically illustrating a process of generating the boundary correction pattern of FIG. 12.

Figure 13:
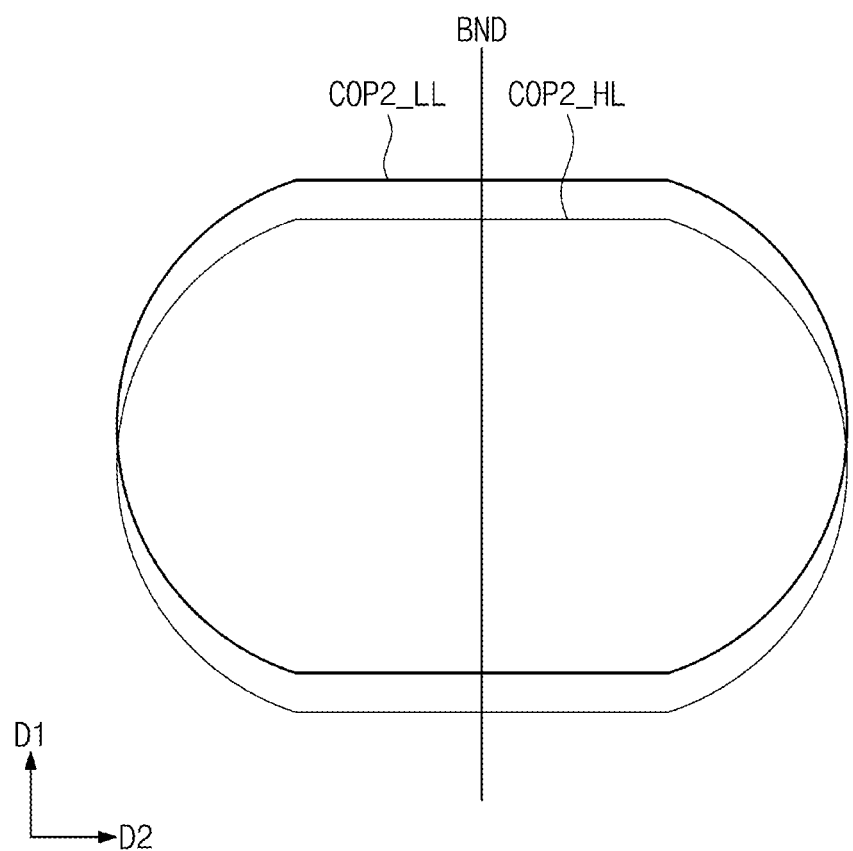
FIGS. 13, 14, 15, 16, and 17 are layout plan views schematically illustrating a process of generating the boundary correction pattern of FIG. 12.

Referring to FIGS. 12 and 13, the first and second boundary correction patterns COP2_LL and COP2_HL described above may be provided on the boundary BND. The first boundary correction pattern COP2_LL may be a result of the first OPC operation, and the second boundary correction pattern COP2_HL may be a result of the second OPC operation. The first and second boundary correction patterns COP2_LL and COP2_HL may not conform to each other as described above.

Figure 14:
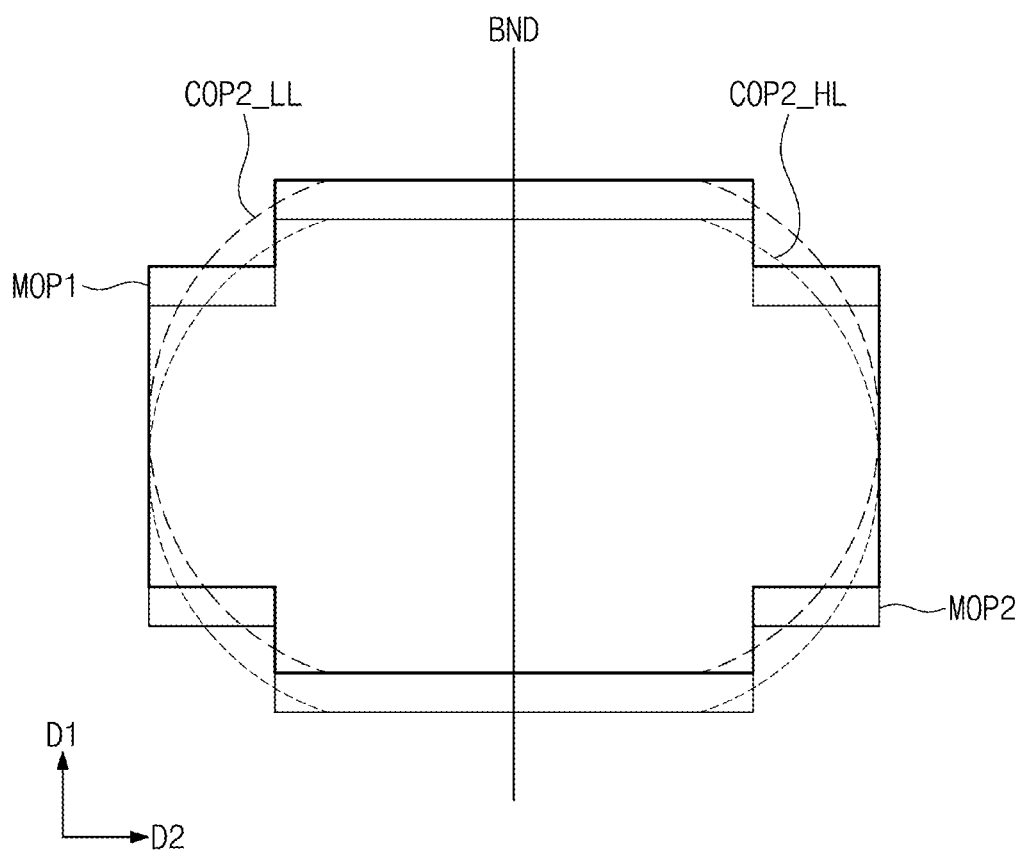

Referring to FIGS. 12 and 14, the first boundary correction pattern COP2_LL may be converted to a first Manhattan pattern MOP1 (in S351). The first Manhattan pattern MOP1 may be generated from the first boundary correction pattern COP2_LL through an OPC simulation process. For example, the first Manhattan pattern MOP1 may be generated by an OPC simulation process performed based on the second simulation image DIM2 of the first boundary correction pattern COP2_LL.

The second boundary correction pattern COP2_HL may be converted to a second Manhattan pattern MOP2 (in S352). The second Manhattan pattern MOP2 may be generated from the second boundary correction pattern COP2_HL through an OPC simulation process.

Each of the first and second Manhattan patterns MOP1 and MOP2 may be composed of a plurality of linear segments. For example, each of the first and second Manhattan patterns MOP1 and MOP2 may include linear segments extending in a first direction D1 and linear segments extending in a second direction D2. The first Manhattan pattern MOP1 may not conform to the second Manhattan pattern MOP2.

Figure 15:
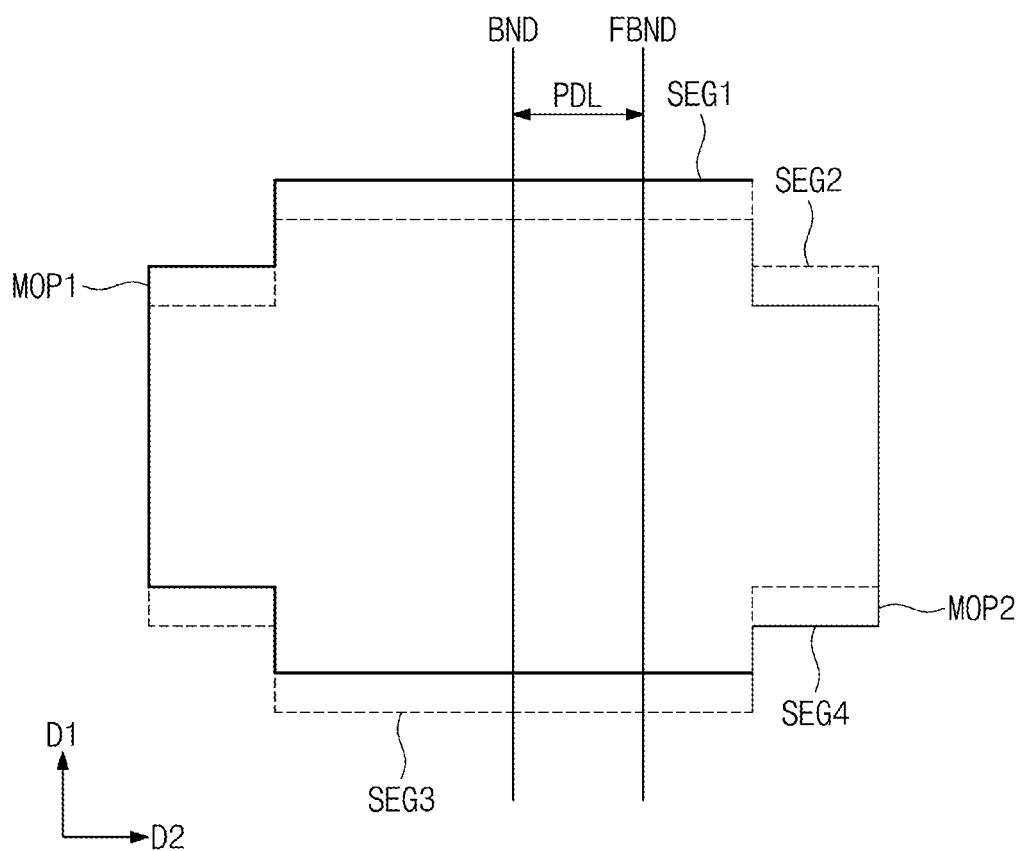

Referring to FIGS. 12 and 15, a freeze boundary FBND may be defined to be spaced apart from the boundary BND by a predetermined distance PDL in the second direction D2. The first Manhattan pattern MOP1 may include a first segment SEG1, which is located to the left of the freeze boundary FBND and is extended to pass through the freeze boundary FBND. The first Manhattan pattern MOP1 may include a second segment SEG2, which is located to the right of the freeze boundary FBND and does not pass through the freeze boundary FBND. For the first Manhattan pattern MOP1, the first segment SEG1 may be left for storage, and the second segment SEG2 may be removed (in S353). In other words, only the first segment SEG1 of the first Manhattan pattern MOP1, while excluding the second segment SEG2, may be stored.

The second Manhattan pattern MOP2 may include a third segment SEG3, which is located to the left of the freeze boundary FBND and is extended to pass through the freeze boundary FBND. The second Manhattan pattern MOP2 may include a fourth segment SEG4, which is located to the right of the freeze boundary FBND and does not pass through the freeze boundary FBND. For the second Manhattan pattern MOP2, the fourth segment SEG4 may be left for storage, and the third segment SEG3 may be removed (in S354). In other words, only the fourth segment SEG4 of the second Manhattan pattern MOP2, while excluding the third segment SEG3, may be stored.

Figure 16:
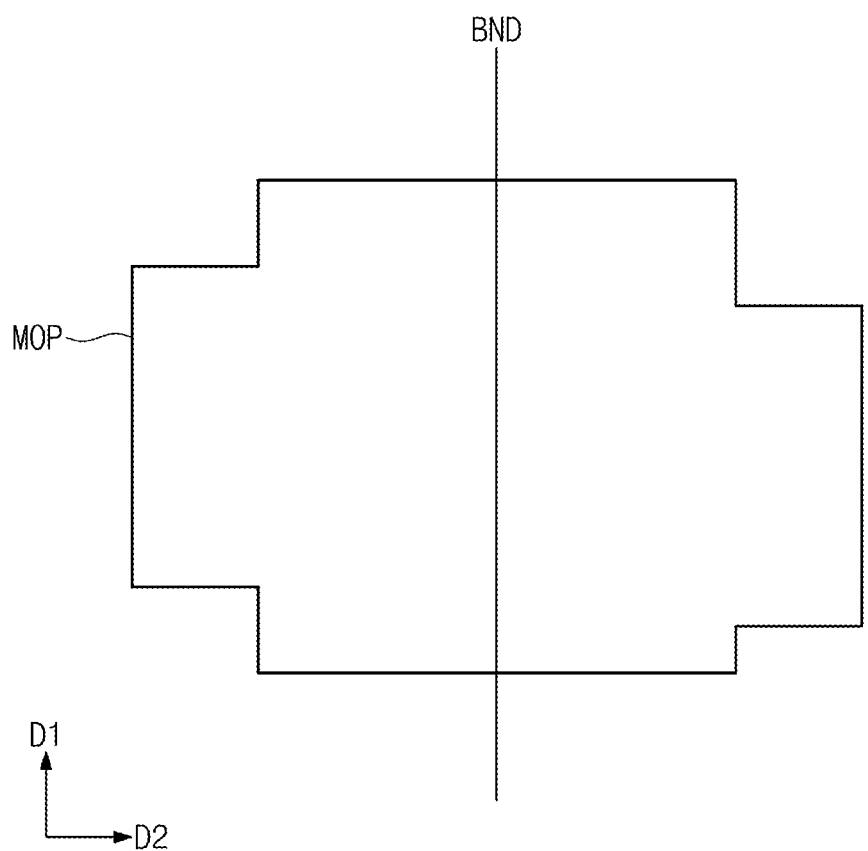

Referring to FIGS. 12 and 16, a single continuous pattern, which will be referred to as a Manhattan pattern MOP, may be generated by merging the first segment SEG1 of the first Manhattan pattern MOP1 with the fourth segment SEG4 of the second Manhattan pattern MOP2 (in S355). In detail, the generation of the Manhattan pattern MOP may include loading and freezing the stored first segment SEG1 of the first Manhattan pattern MOP1 and forming the remaining portion of the Manhattan pattern MOP using the fourth segment SEG4 of the second Manhattan pattern MOP2. As a result, the first and second Manhattan patterns MOP1 and MOP2 may be merged to generate the single Manhattan pattern MOP.

Figure 17:
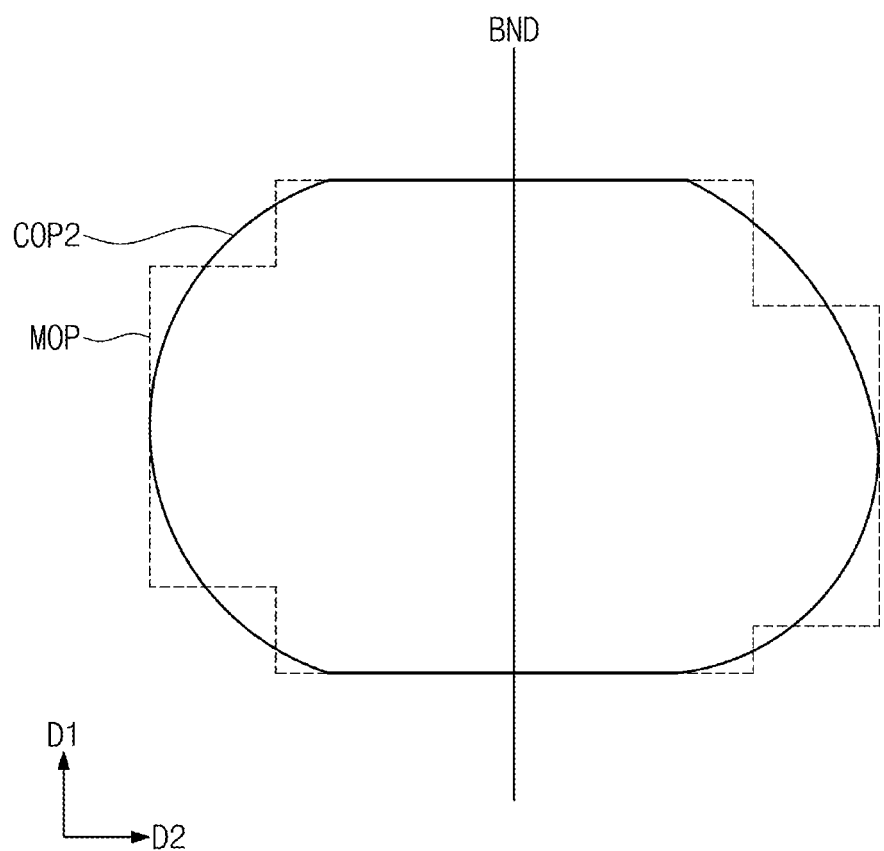

Referring to FIGS. 12 and 17, the Manhattan pattern MOP may be converted to a boundary correction pattern COP2 (in S356). In detail, the Manhattan pattern MOP may be converted to the boundary correction pattern COP2 through an OPC simulation process. For example, the boundary correction pattern COP2 may be generated by an OPC simulation process, which is performed based on a simulation image of the Manhattan pattern MOP. As a result, a single curvilinear boundary correction pattern (i.e., the boundary correction pattern COP2) may be generated by merging or conforming the first and second boundary correction patterns COP2_LL and COP2_HL of the curvilinear shapes to each other. The boundary correction pattern COP2 may have a continuously curvilinear shape, without any discontinuity on the boundary BND. The boundary correction pattern COP2, which is the result of FIG. 17, may be applied to the final result of the OPC process shown in FIG. 11.

Figure 18:
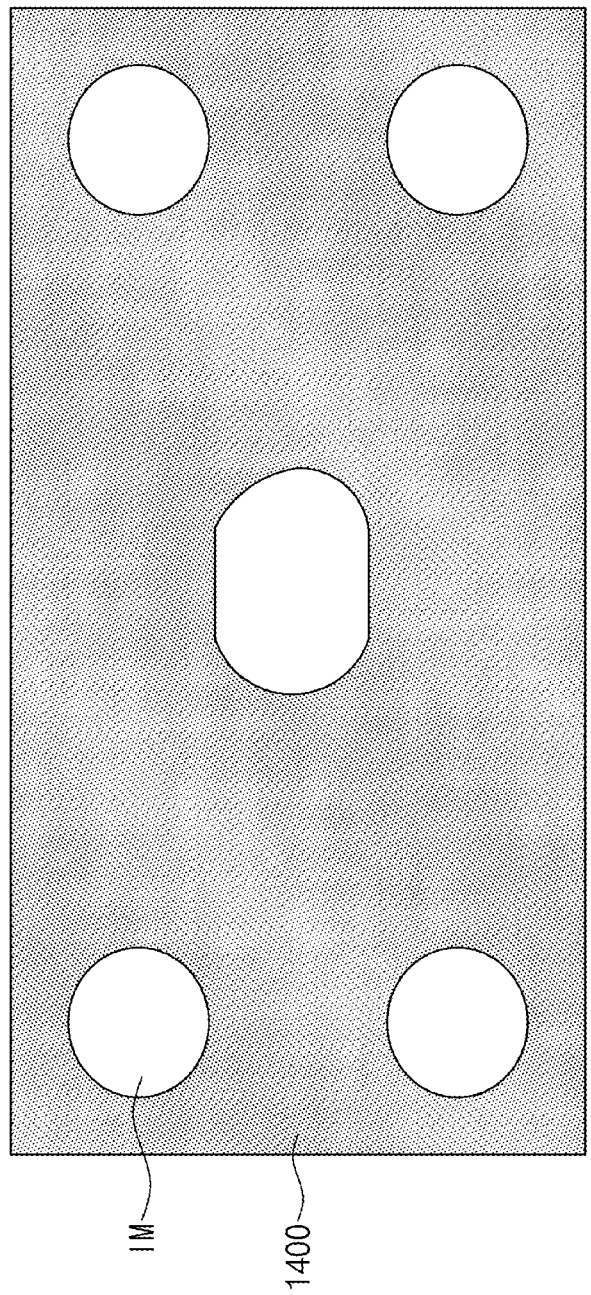
FIG. 18 is a plan view illustrating a photomask according to an embodiment of the inventive concept.

FIG. 18 is a plan view illustrating a photomask according to an embodiment of the inventive concept. Referring to FIGS. 2 and 18, the photomask 1400 may be manufactured based on the final OPC patterns (e.g., the first and second correction patterns COP1 and COP2 of FIG. 11) (in S40). The photomask 1400 may include image patterns IM. The image patterns IM may be image patterns that are formed according to the first and second correction patterns COP1 and COP2 previously described with reference to FIG. 11.

The photomask 1400 may include a transparent region and an opaque region. The opaque region may be configured to reduce or prevent the light from passing therethrough. By contrast, the transparent region may be configured to allow light, which is incident from the light source 1200 of FIG. 3, to pass therethrough. Light passing through the photomask 1400 may be irradiated onto the substrate SUB of FIG. 3. For example, when the photolithography process is performed using a negative-type photoresist, the image patterns IM may be the transparent region of the photomask 1400.

Figure 19:
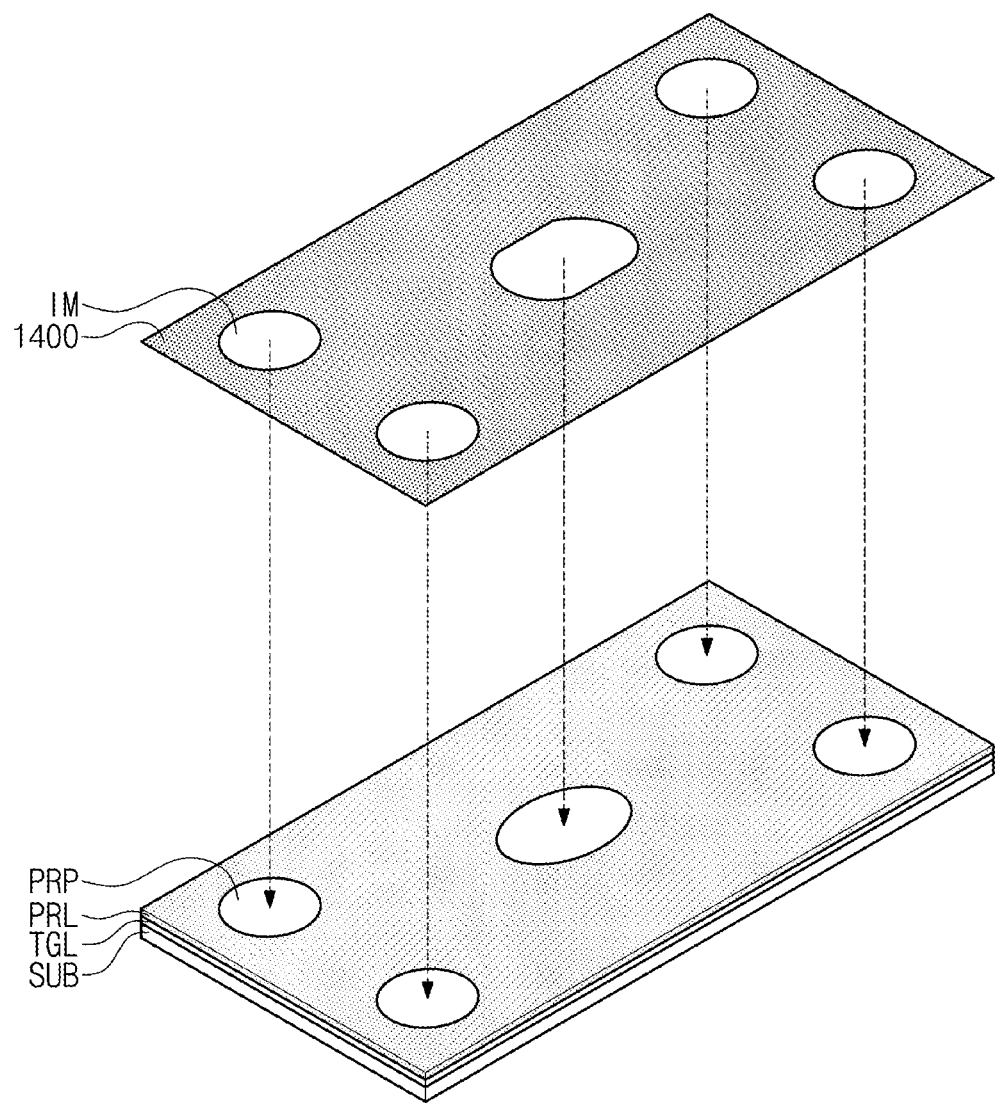
FIG. 19 is a conceptual diagram schematically illustrating a method of forming photoresist patterns on a substrate using the photomask of FIG. 18.
Figure 20:
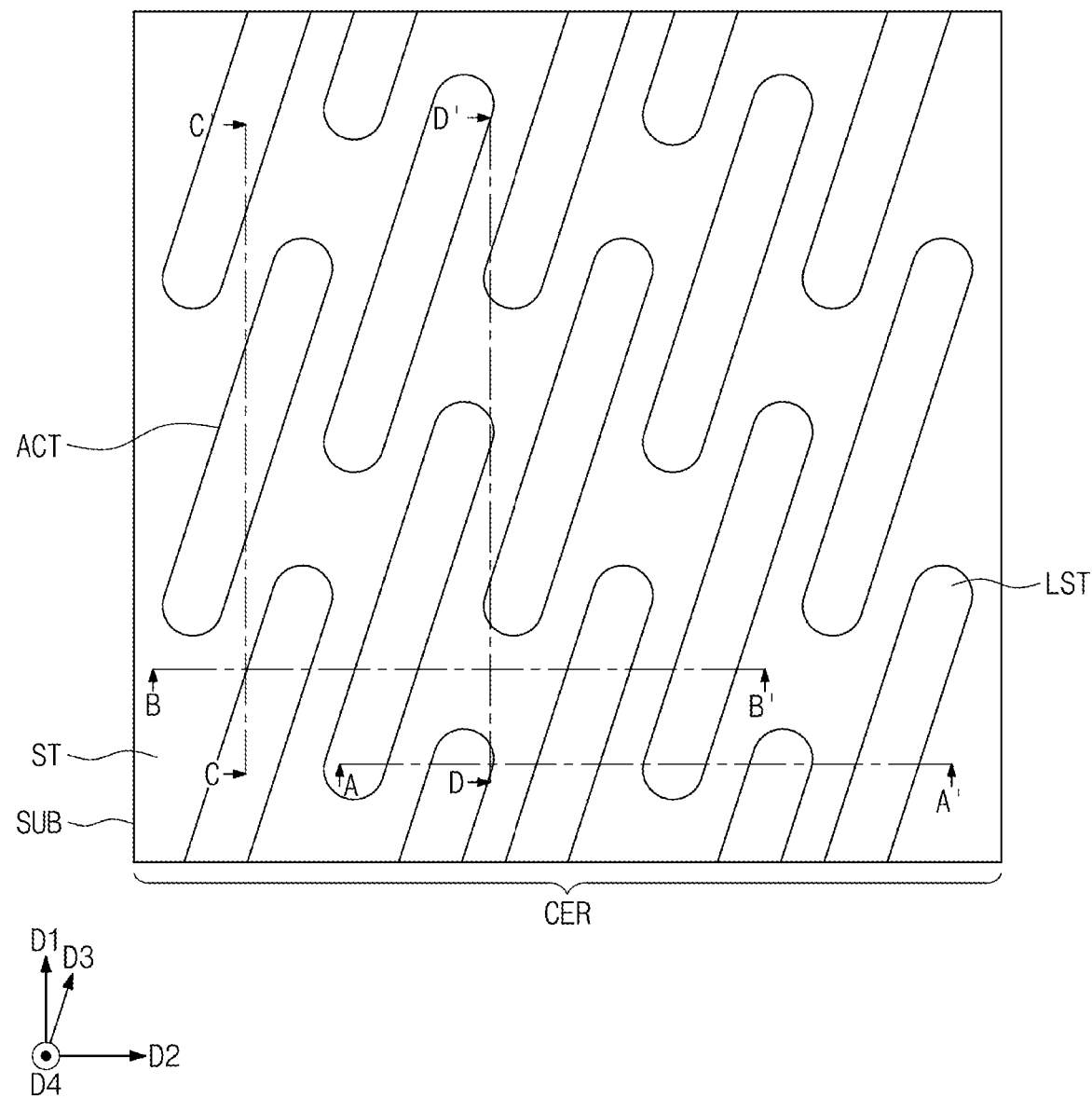
FIGS. 20, 22, 22, 24, 26, 28, 30, 32, and 34 are plan views illustrating a method of fabricating a semiconductor device, according to an embodiment of the inventive concept.
Figure 21A:
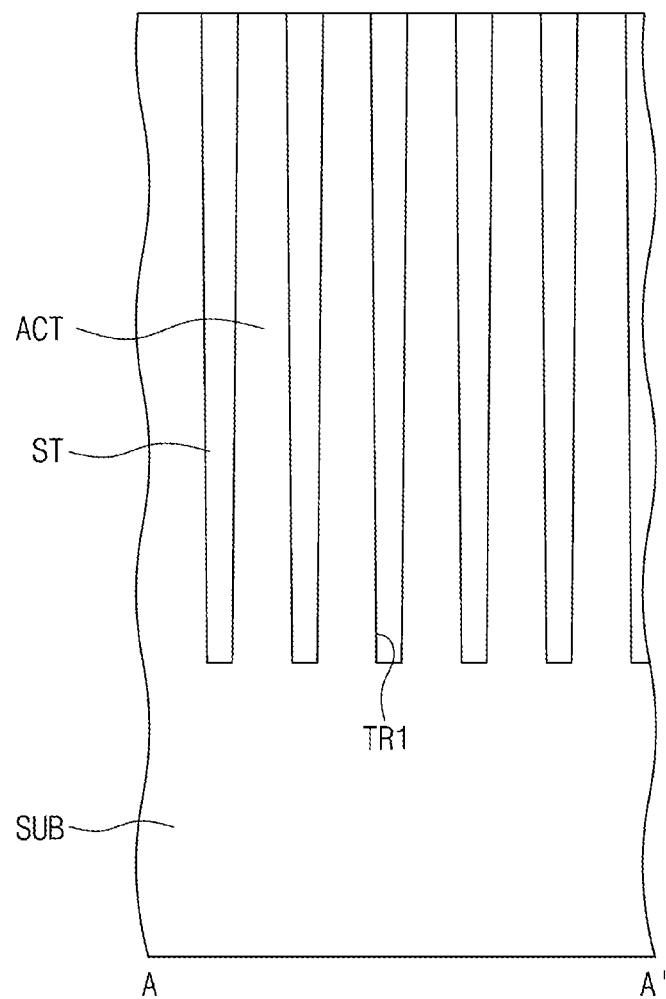
Figure 21B:
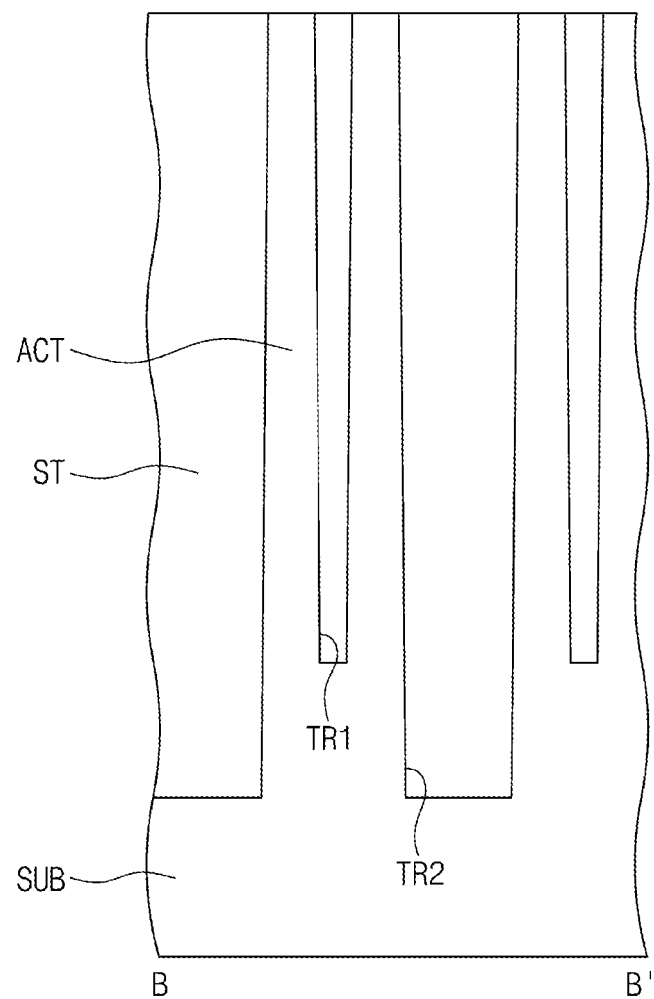
Figure 21C:
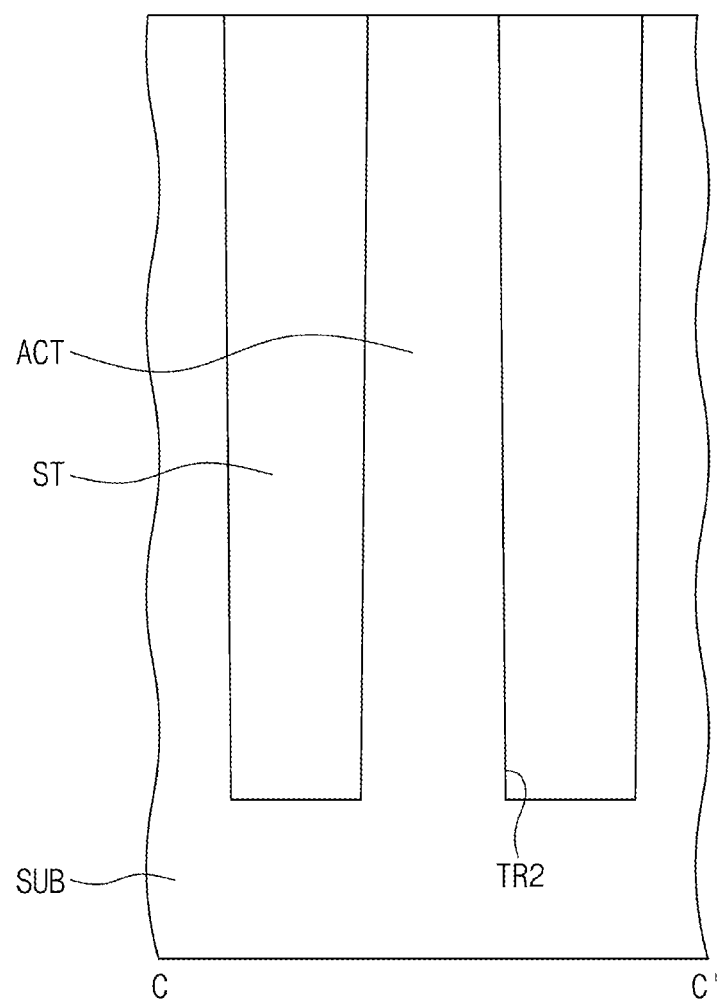
FIGS. 21C, 23C, 25C, 27C, 29C, 31C, 33C, and 35C are sectional views taken along lines C-C' of FIGS. 20, 22, 22, 24, 26, 28, 30, 32, and 34, respectively.
Figure 21D:
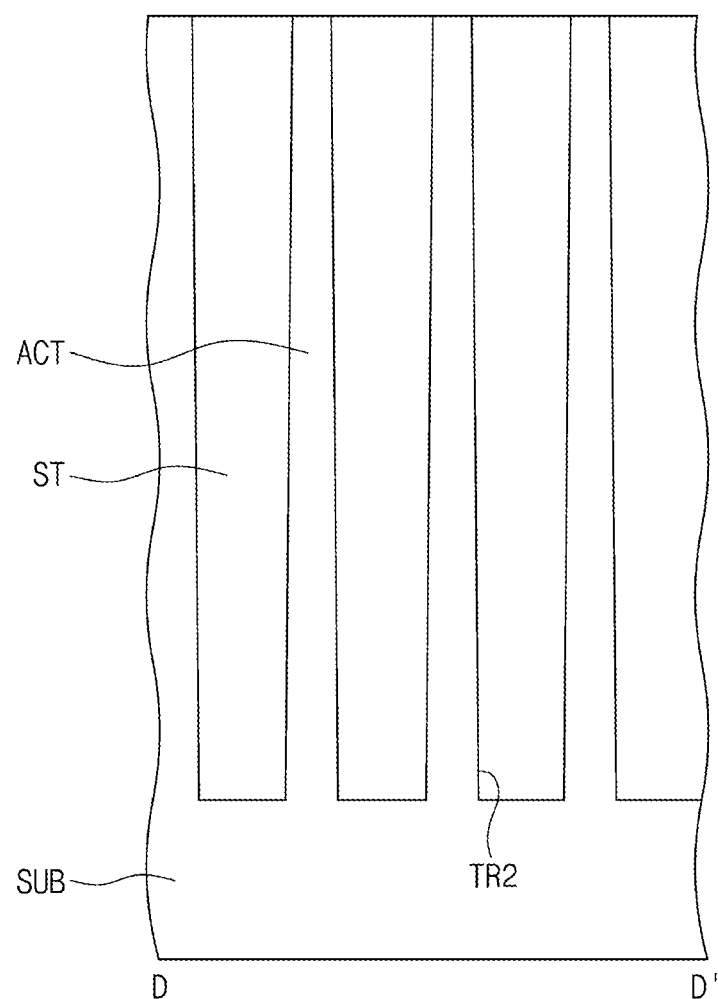
FIGS. 21D, 23D, 25D, 27D, 29D, 31D, 33D, and 35D are sectional views taken along lines D-D' of FIGS. 20, 22, 22, 24, 26, 28, 30, 32, and 34, respectively.
Figure 22:
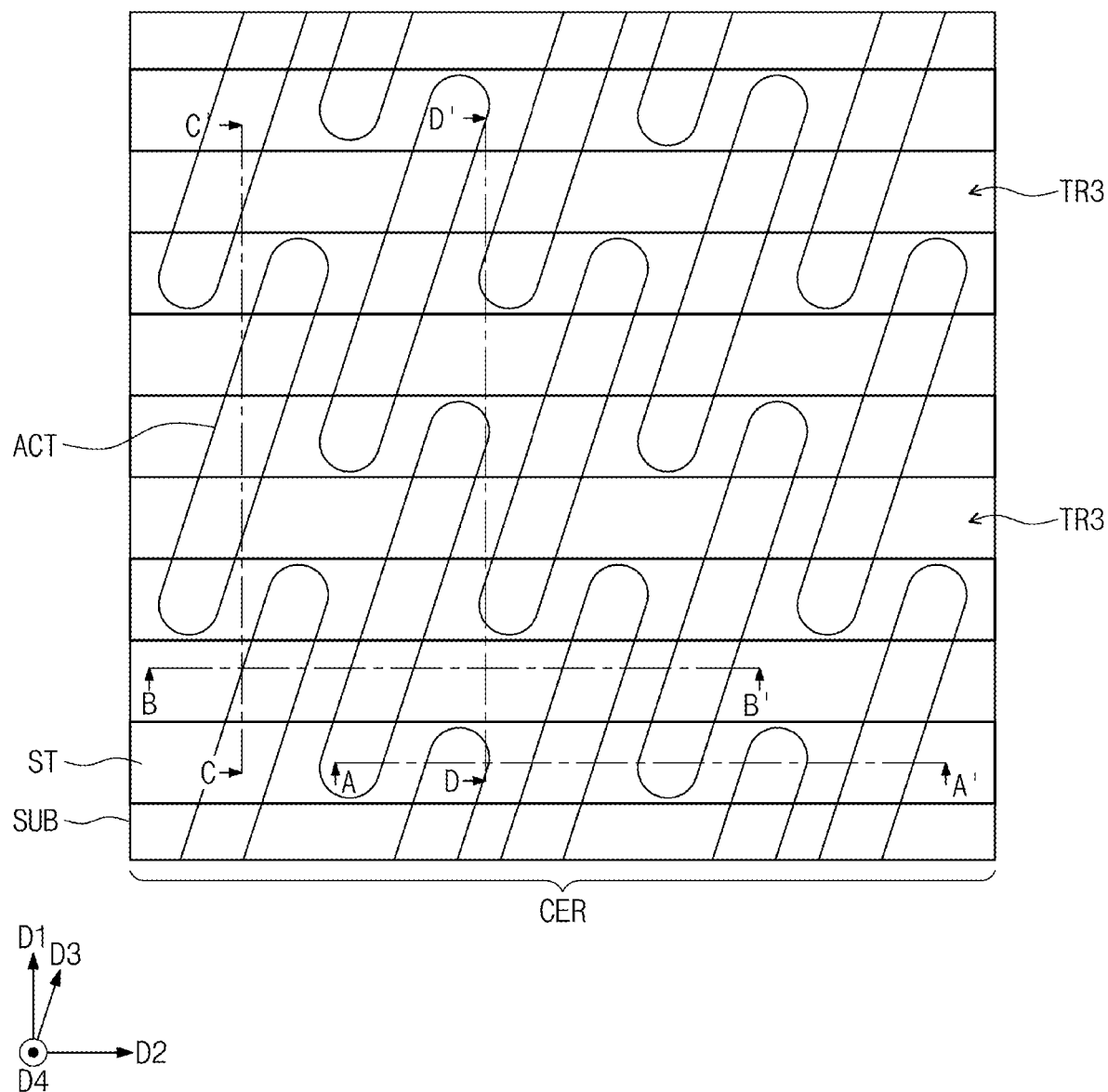
Figure 23A:
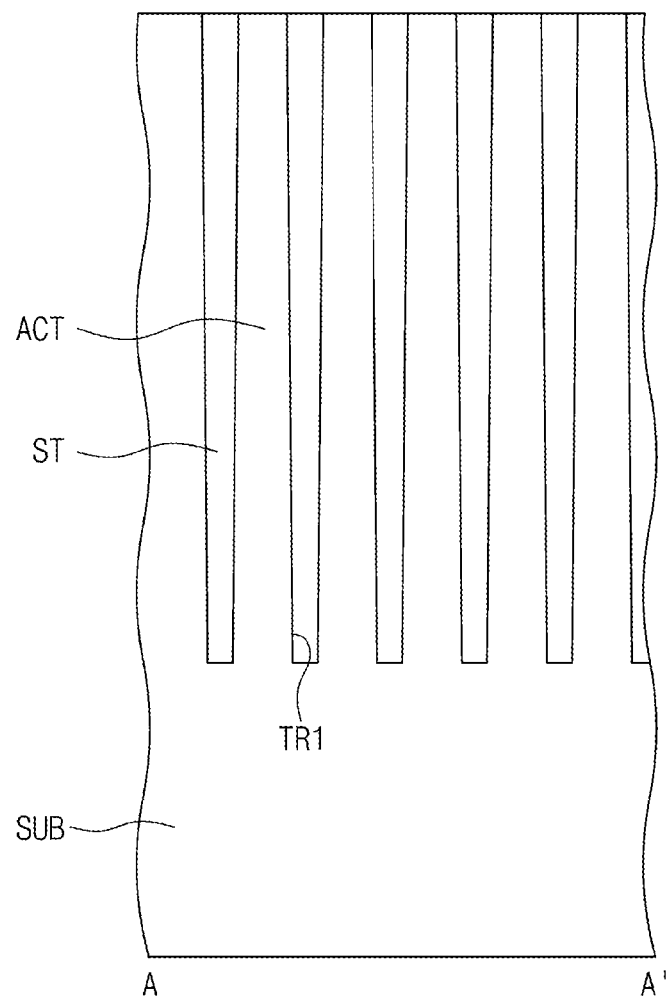
Figure 23B:
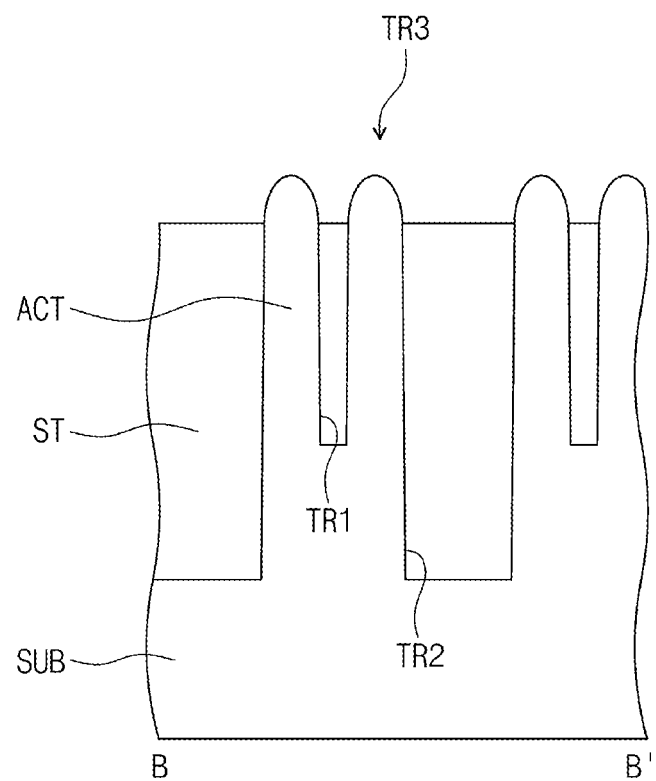
Figure 23C:
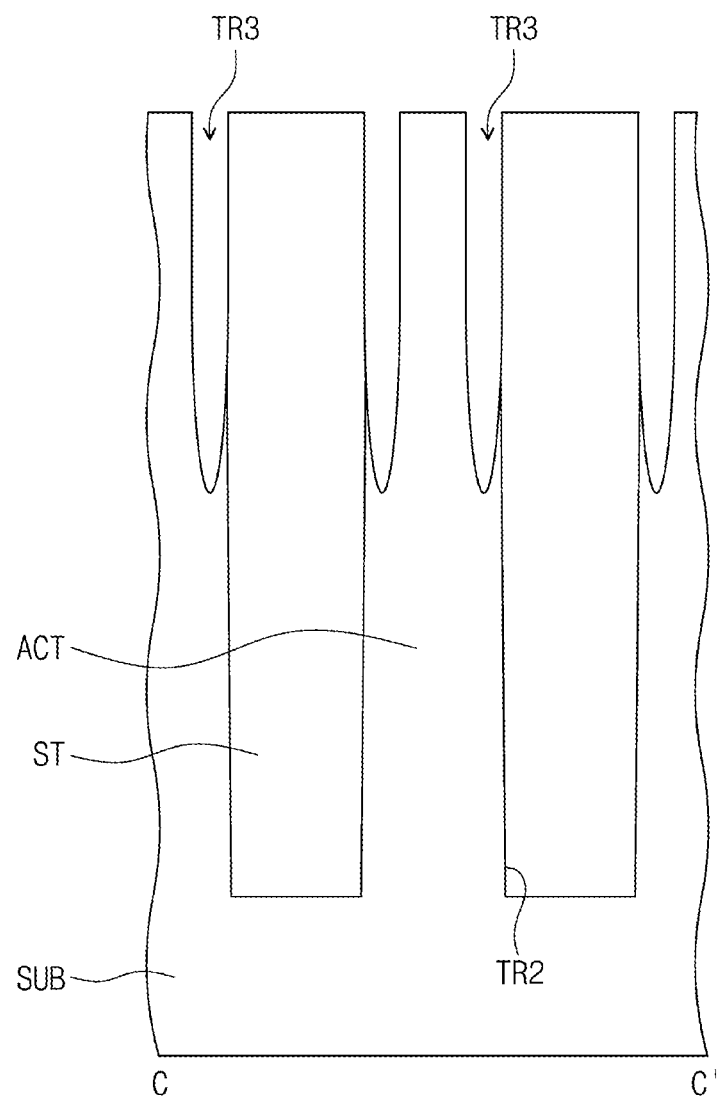
Figure 23D:
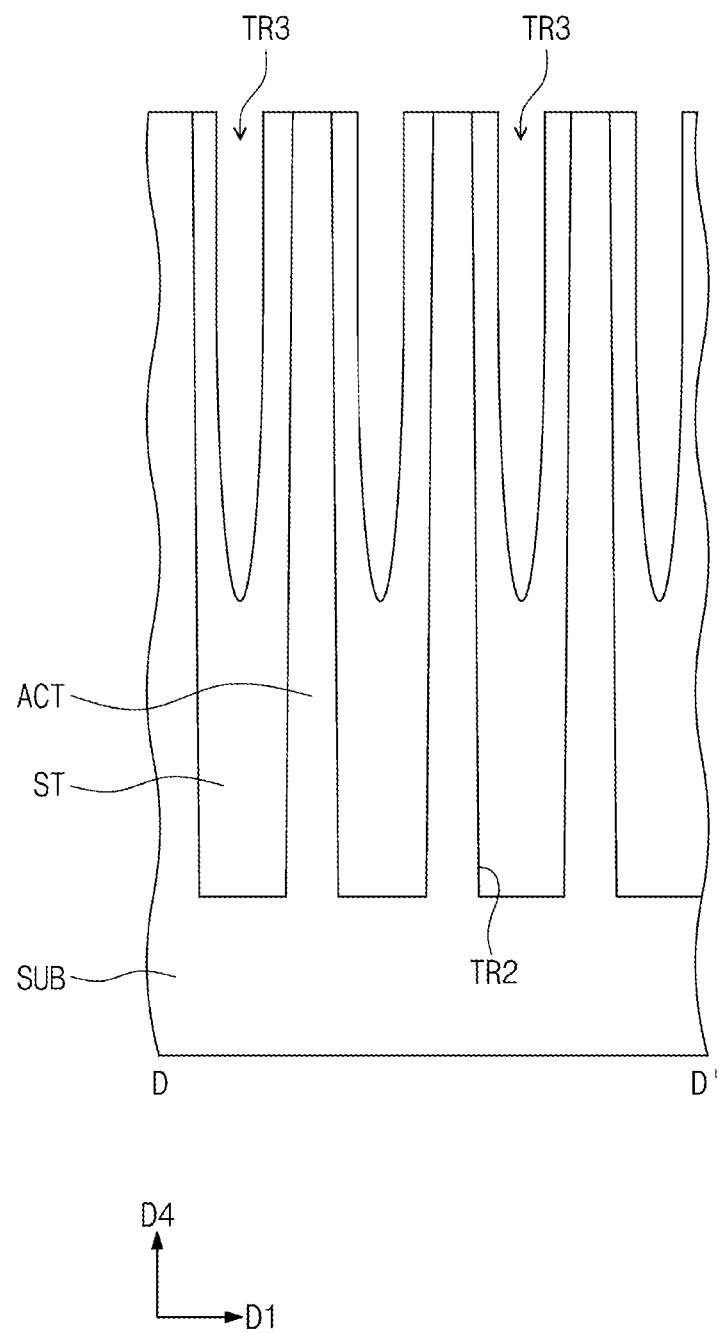
Figure 24:
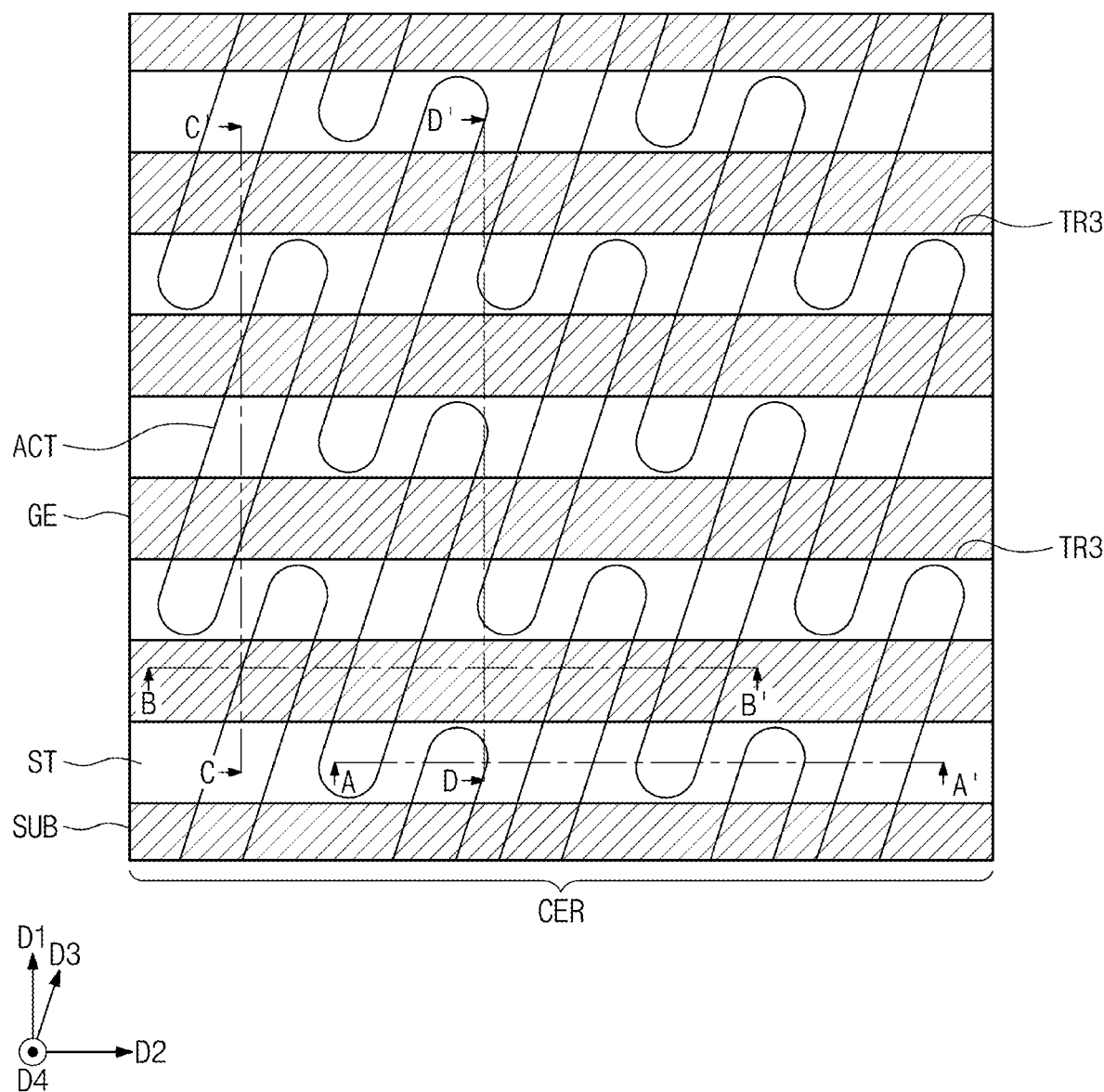
Figure 25A:
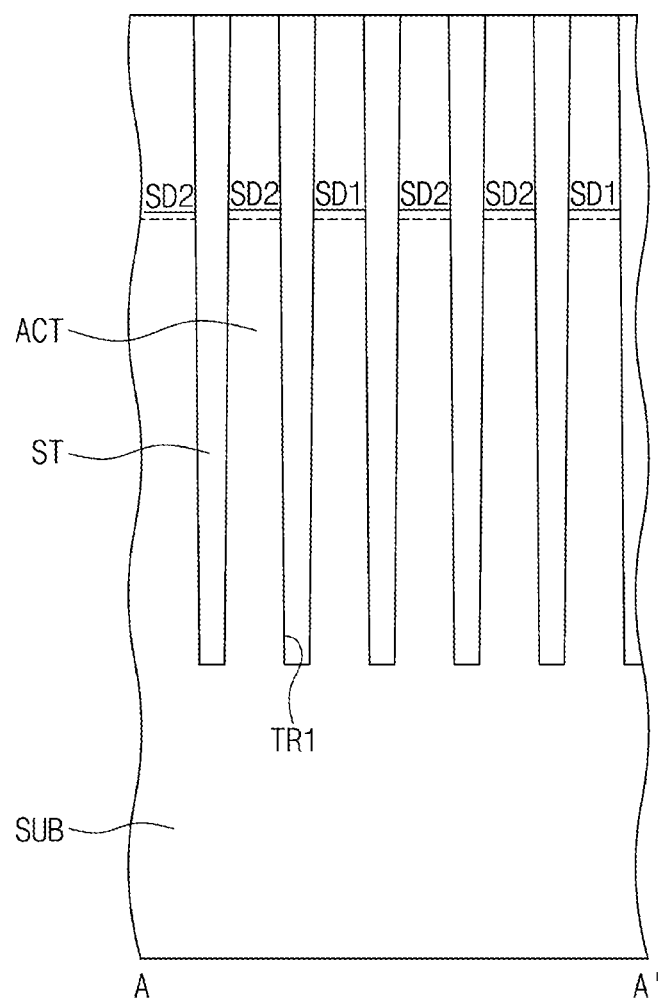
Figure 25B:
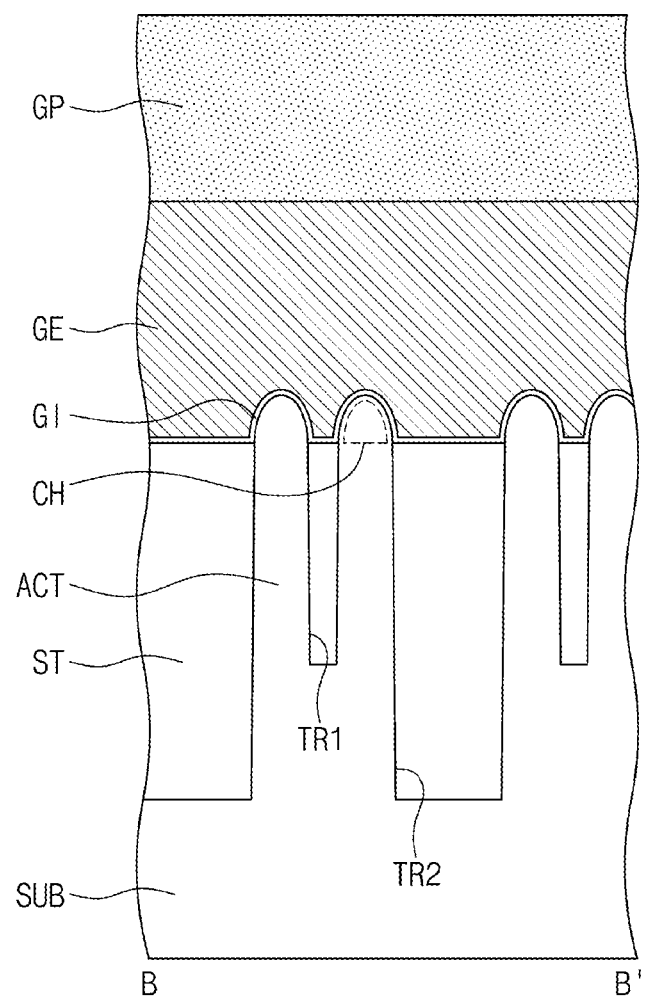
Figure 25C:
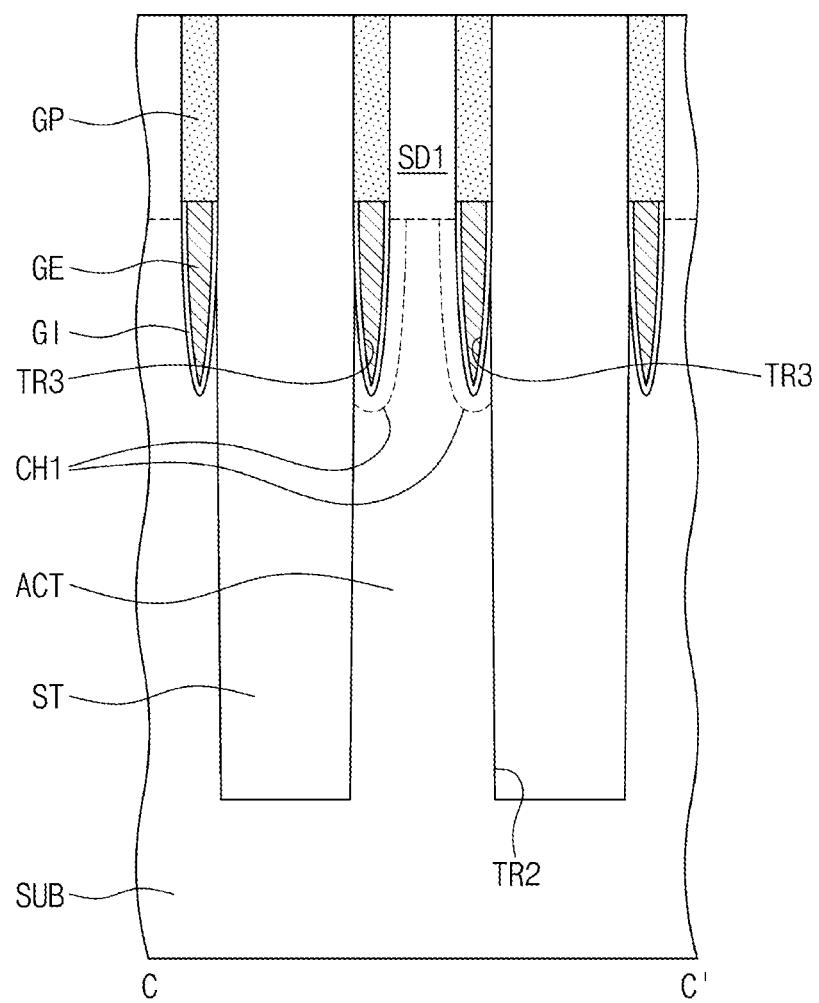
Figure 25D:
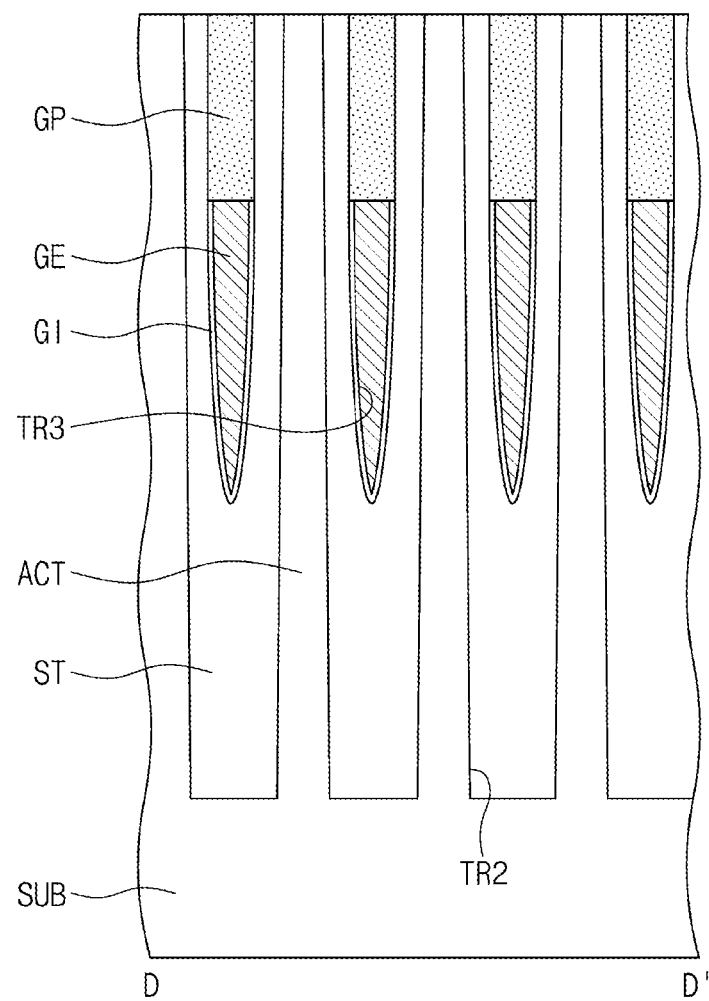
Figure 26:
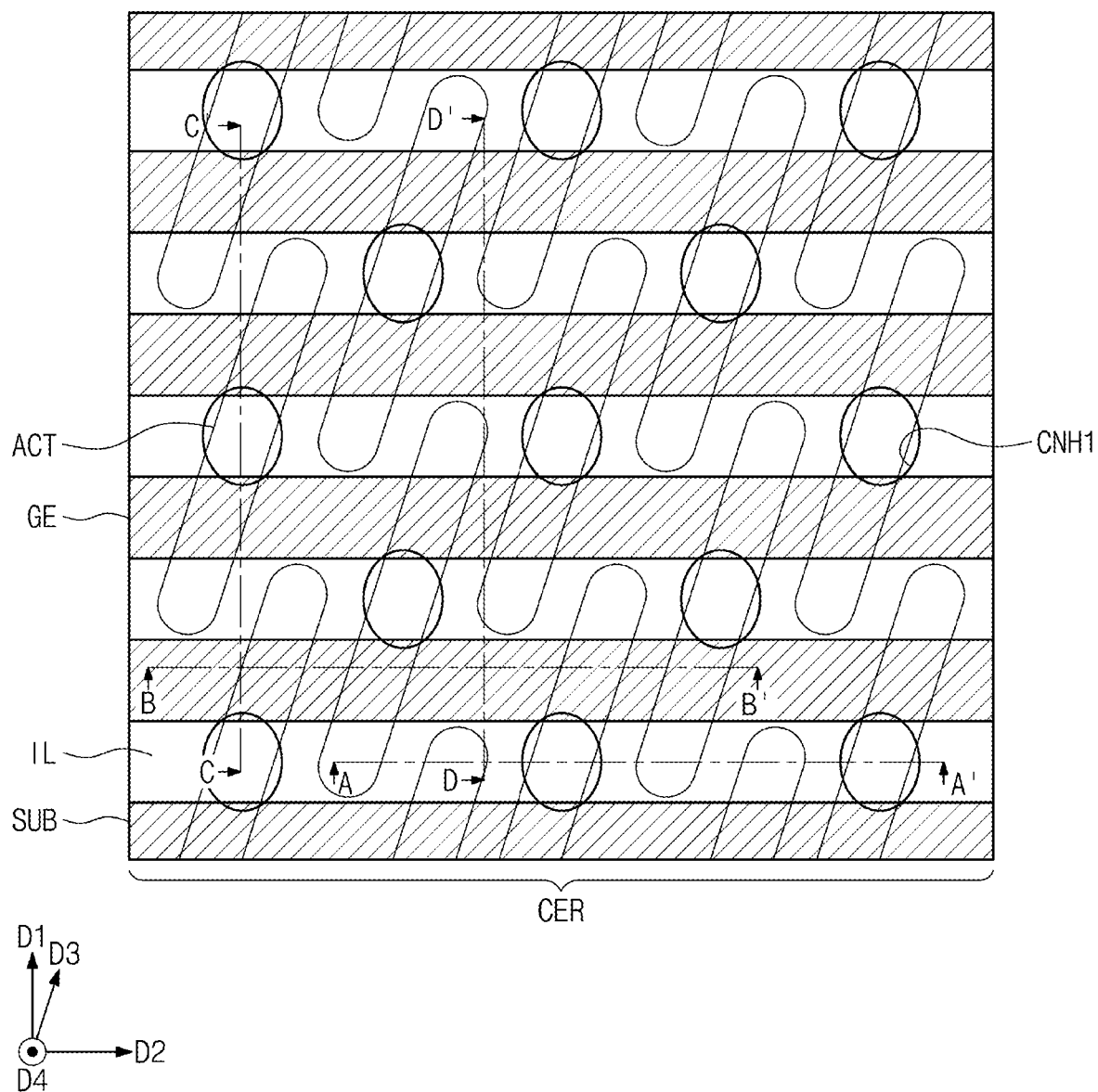
Figure 27A:
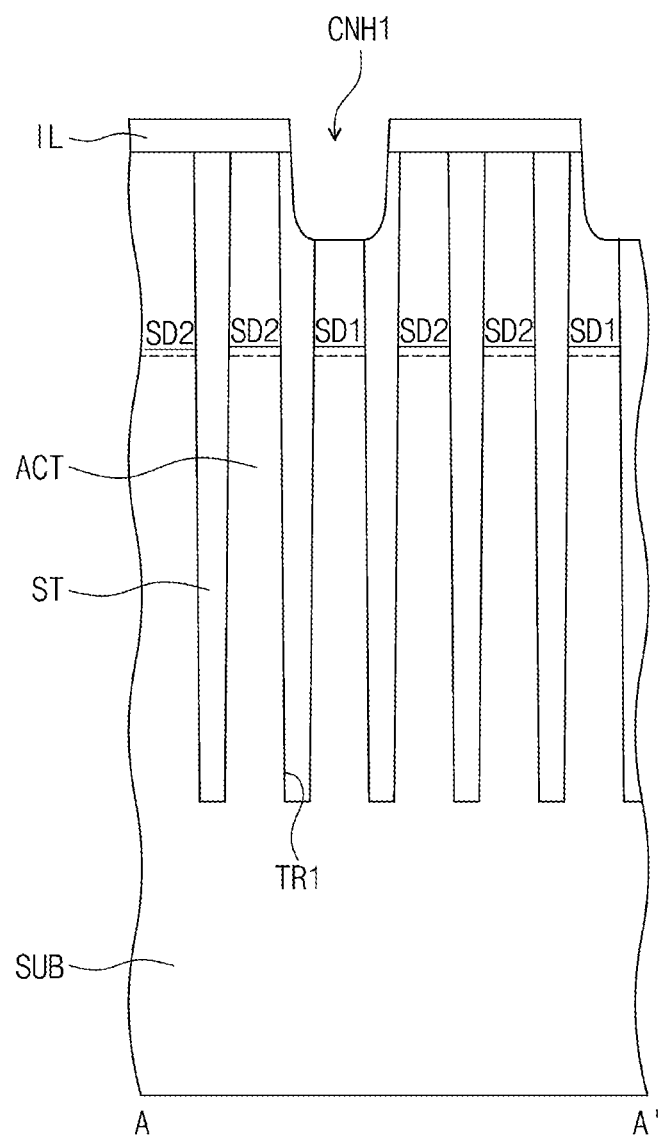
Figure 27B:
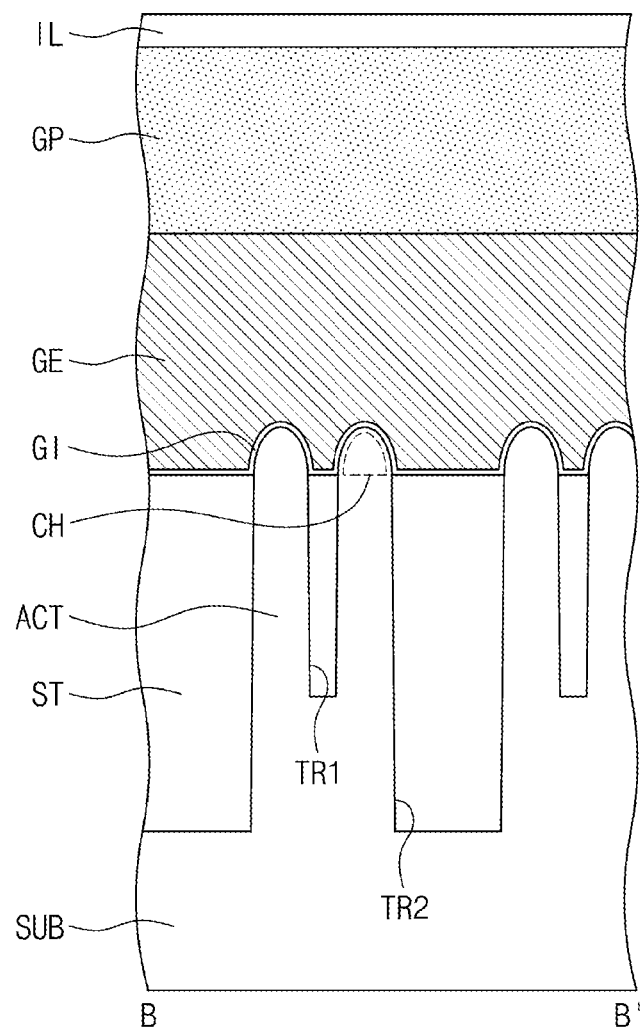
Figure 27C:
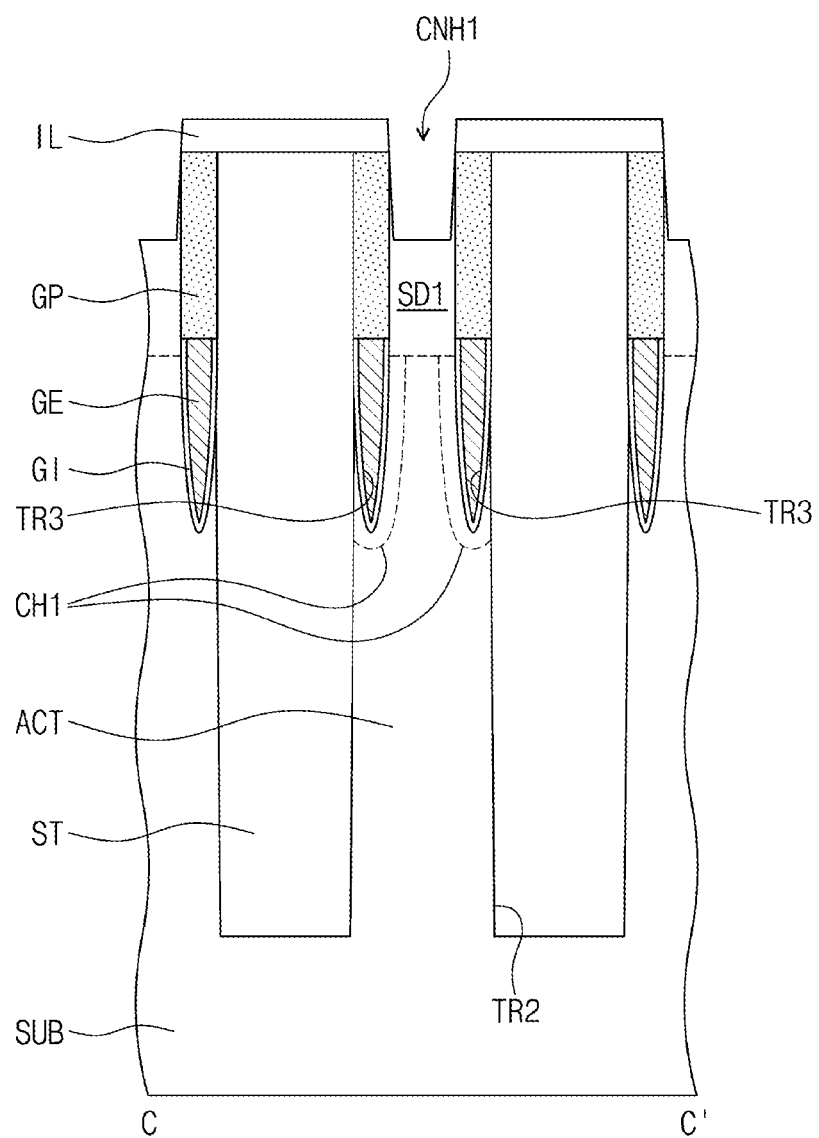
Figure 27D:
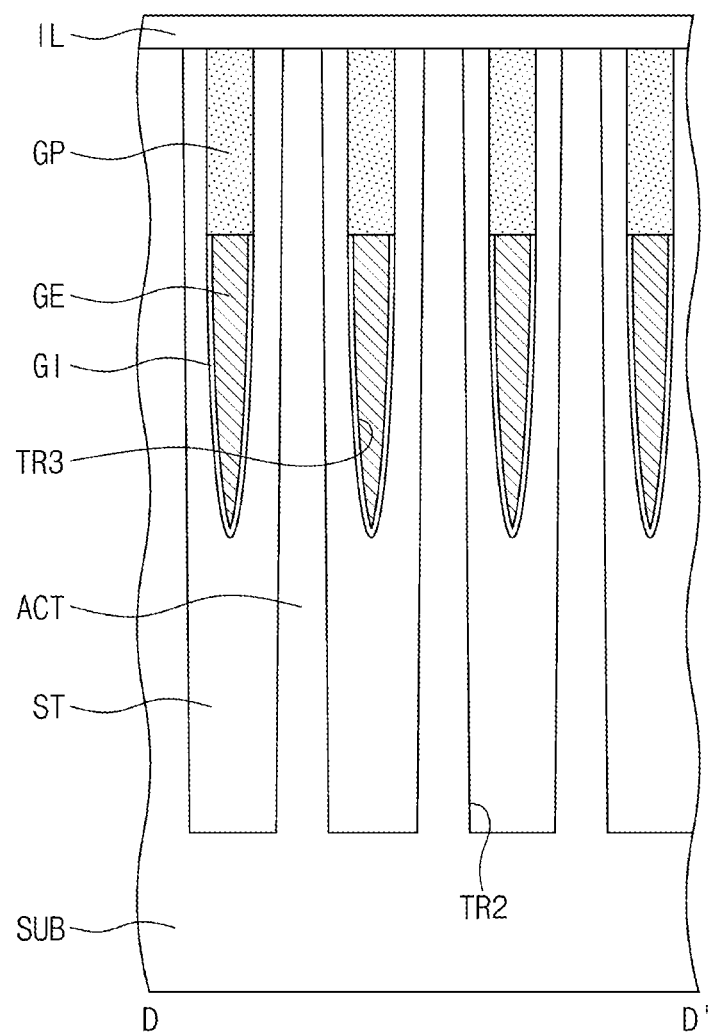
Figure 28:
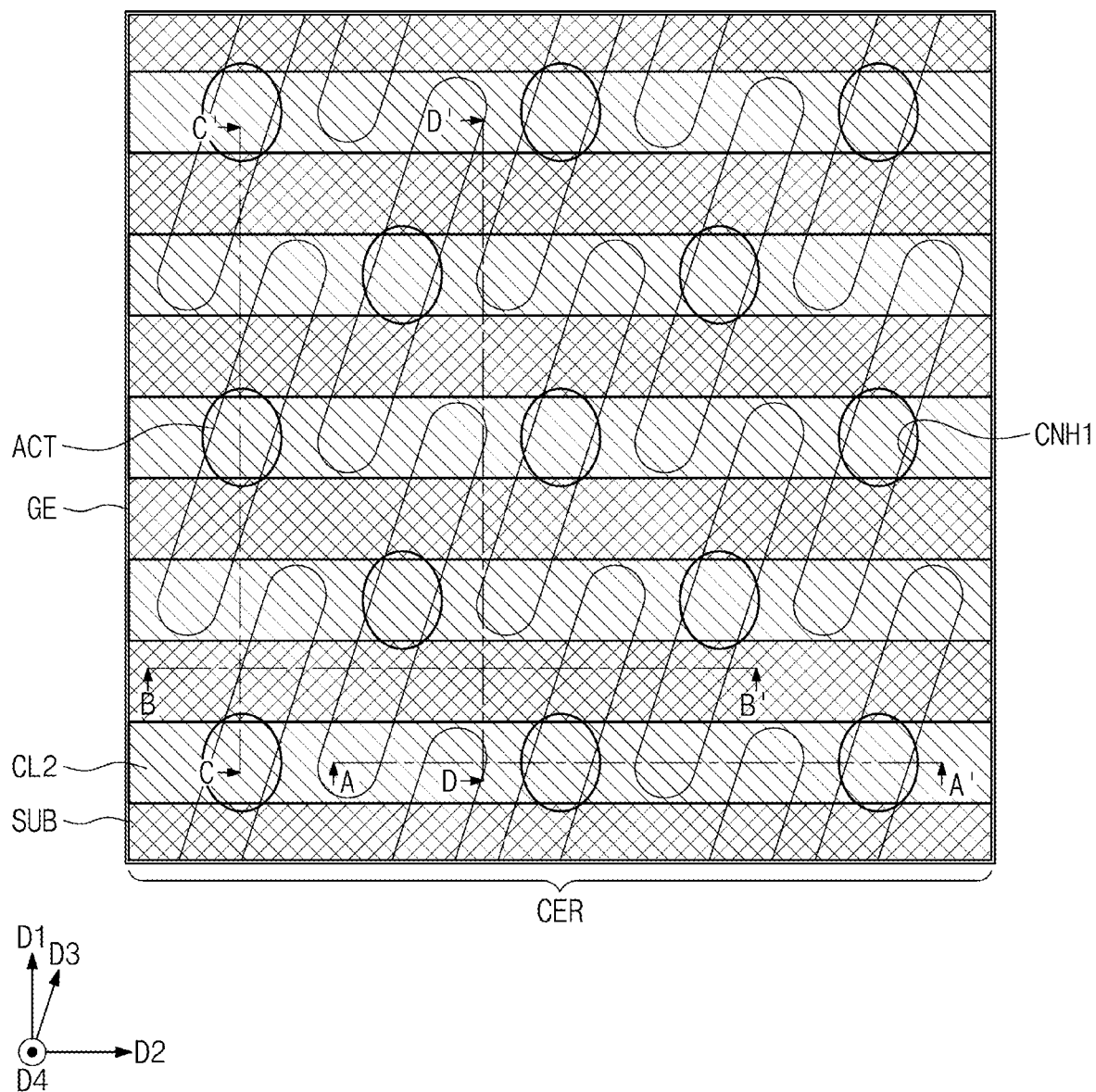
Figure 29A:
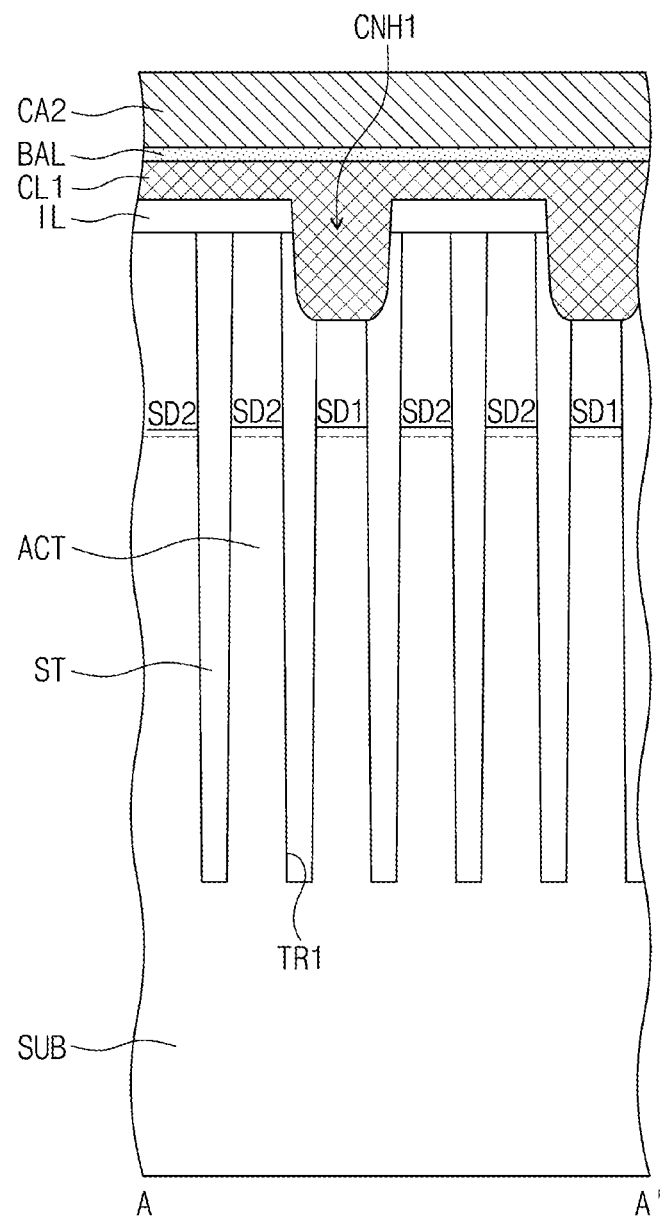
Figure 29B:
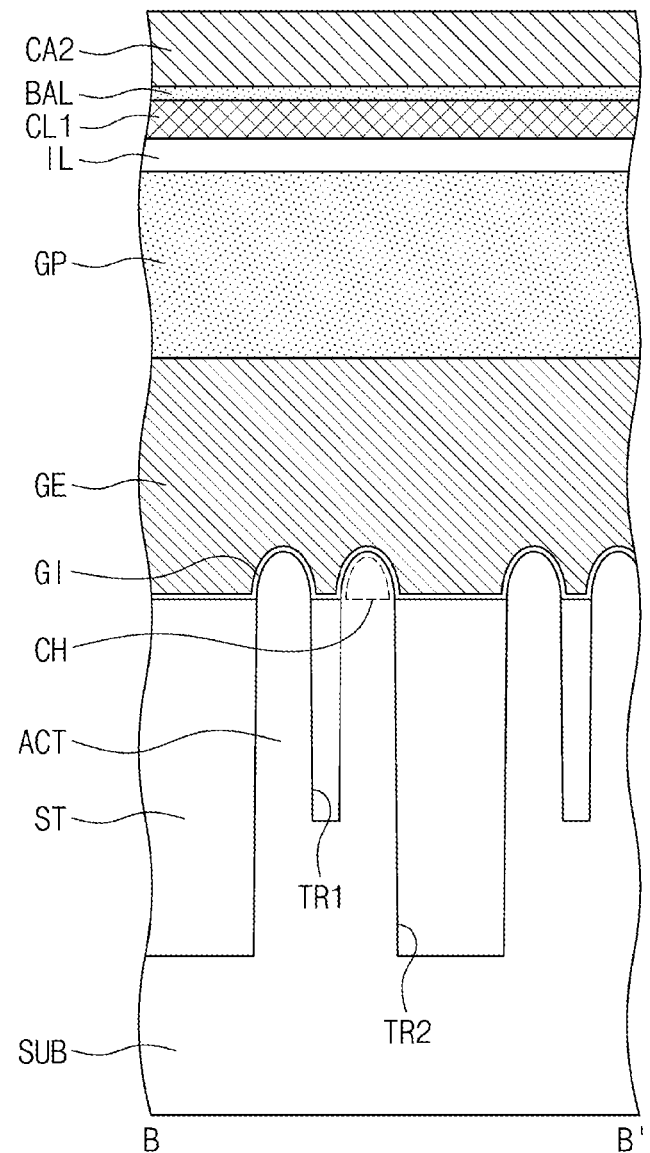
Figure 29C:
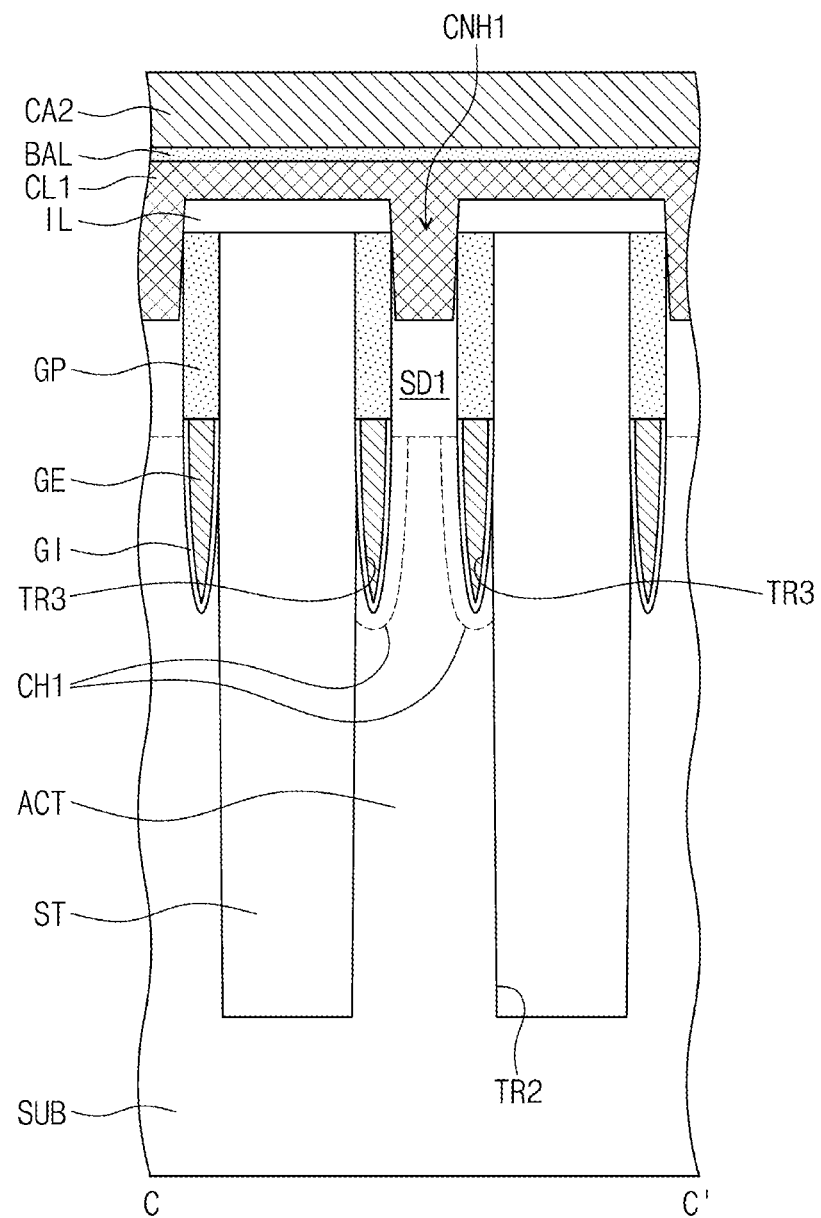
Figure 29D:
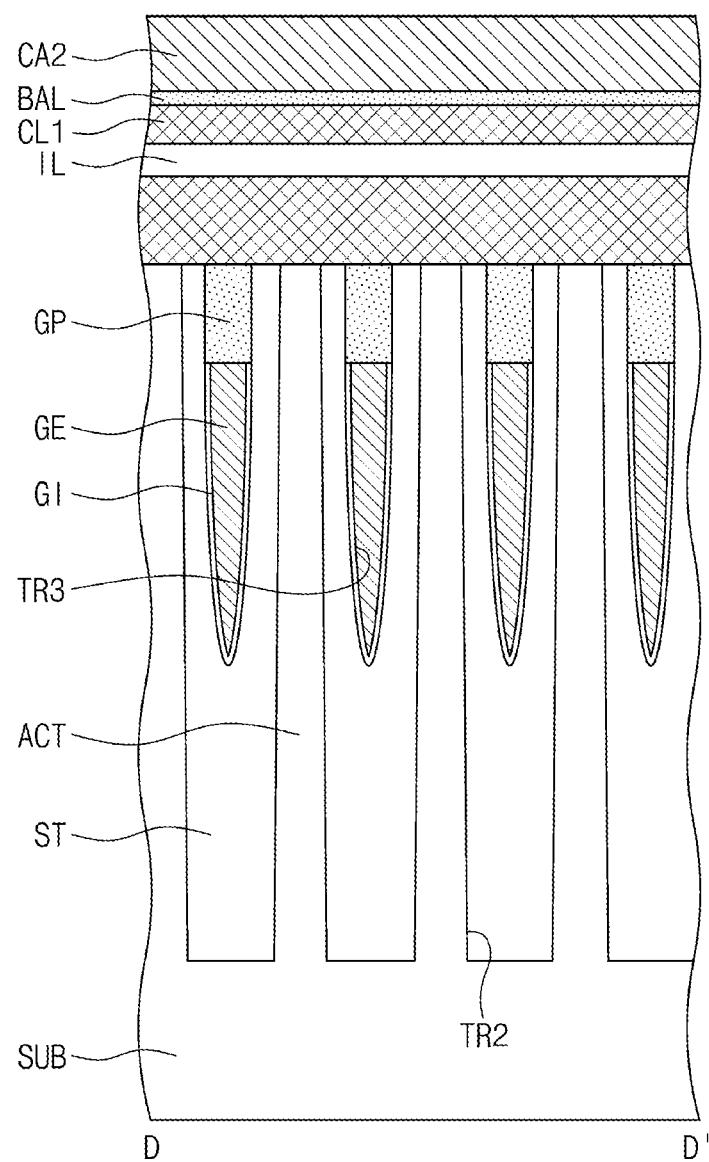
Figure 30:
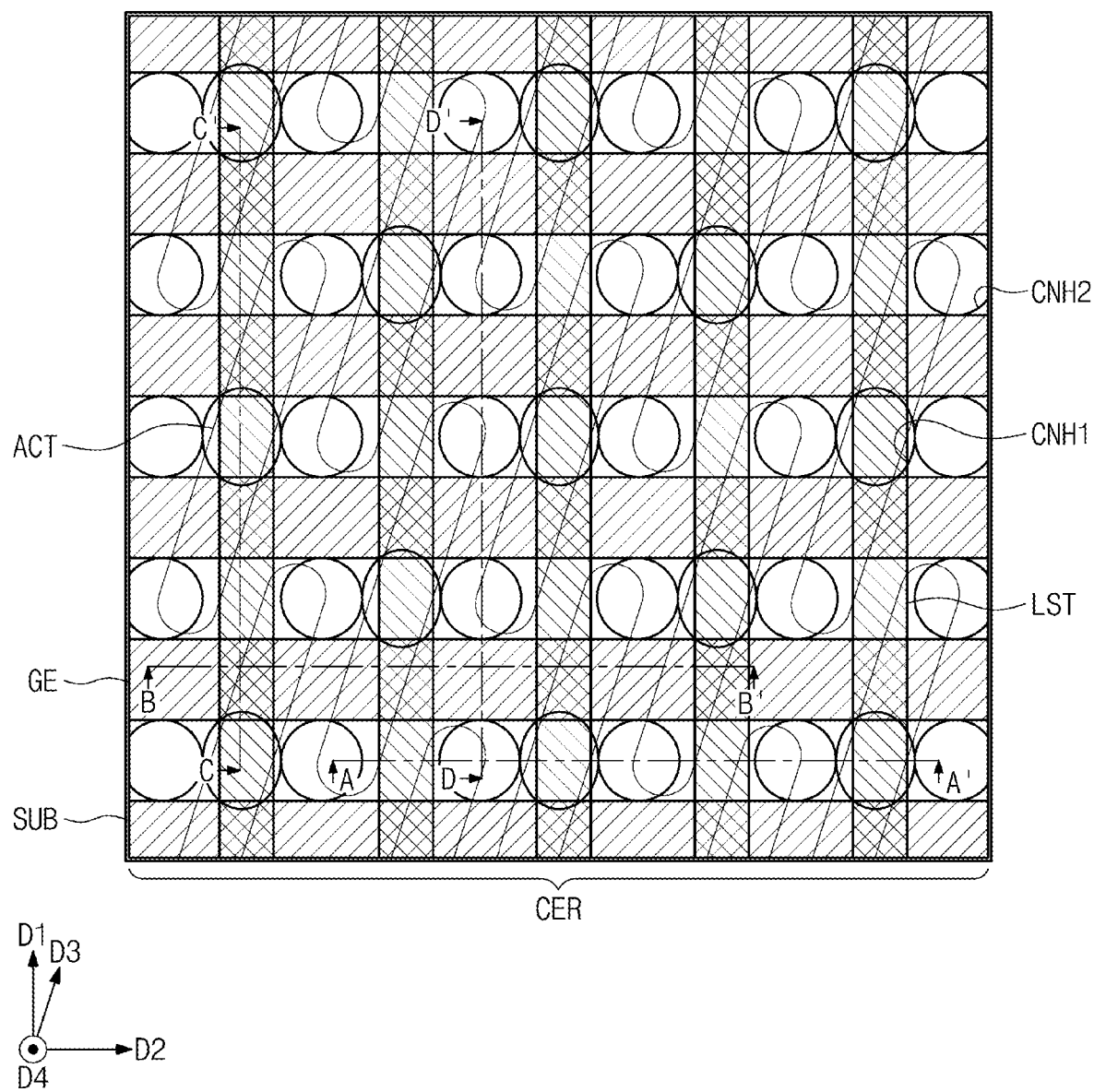
Figure 31A:
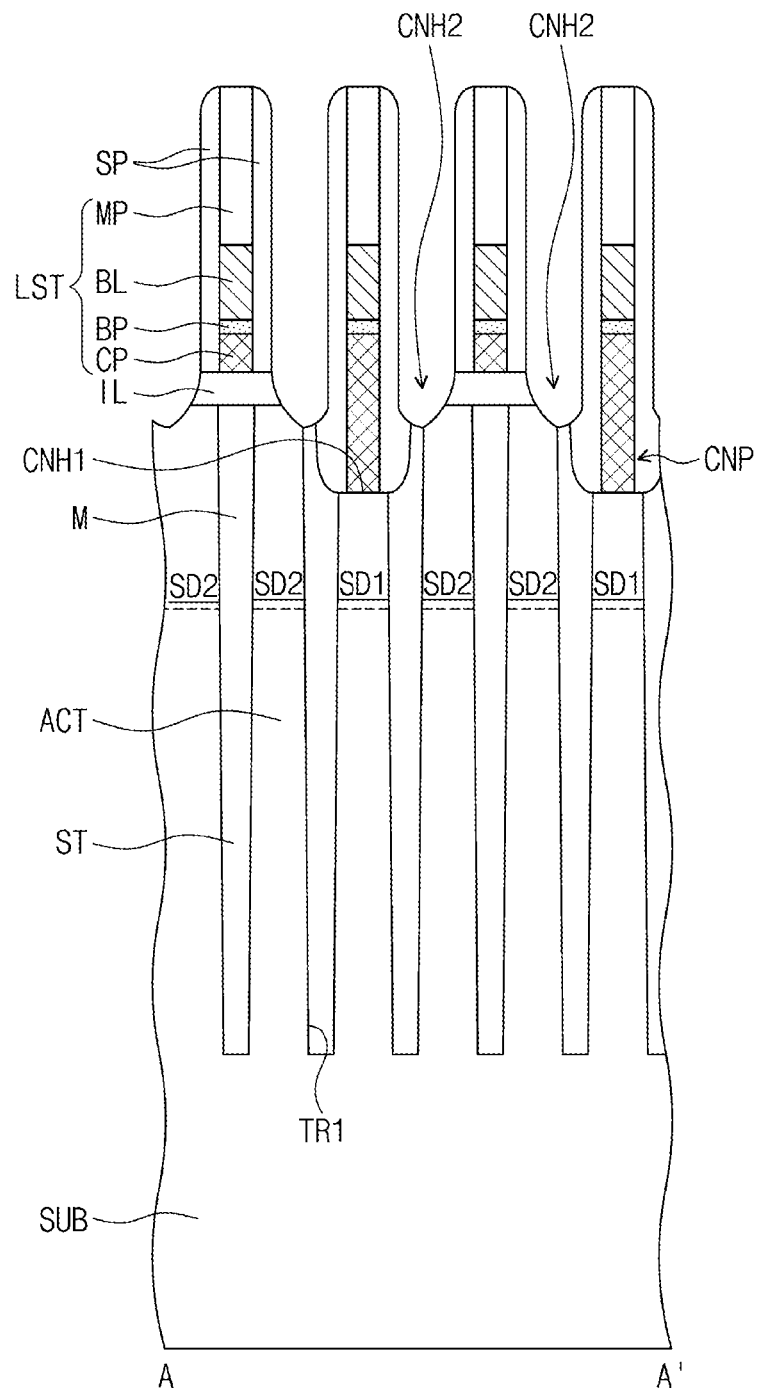
Figure 31B:
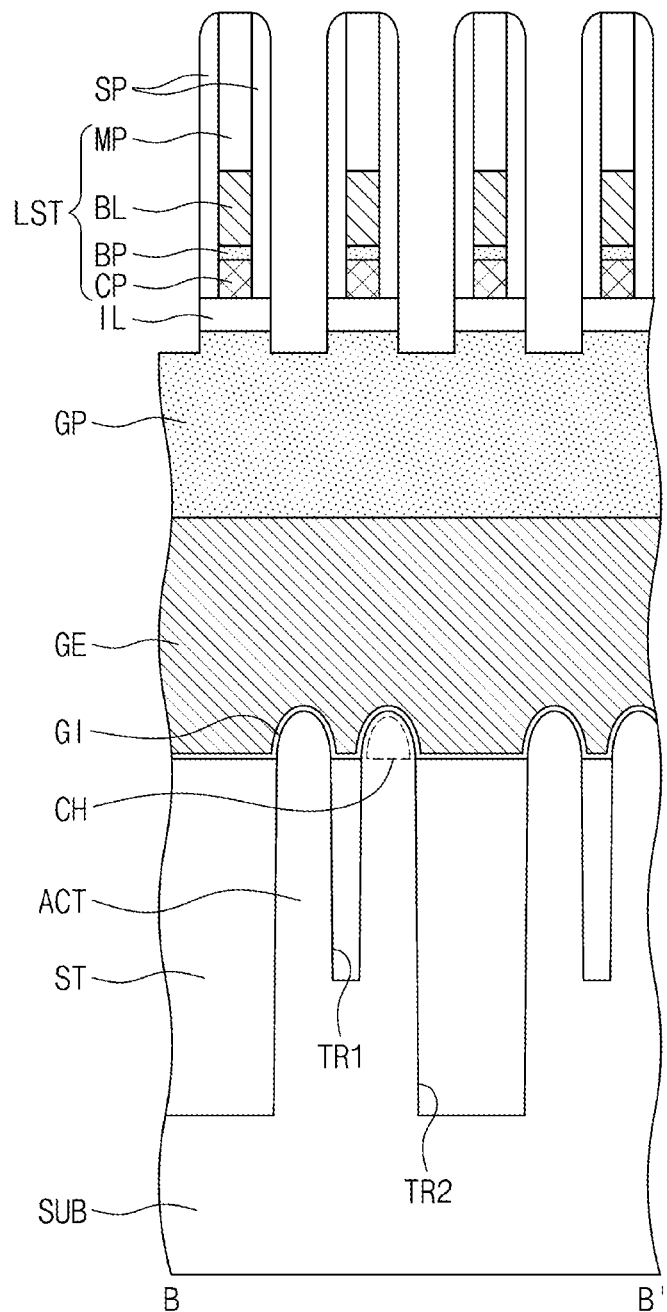
Figure 31C:
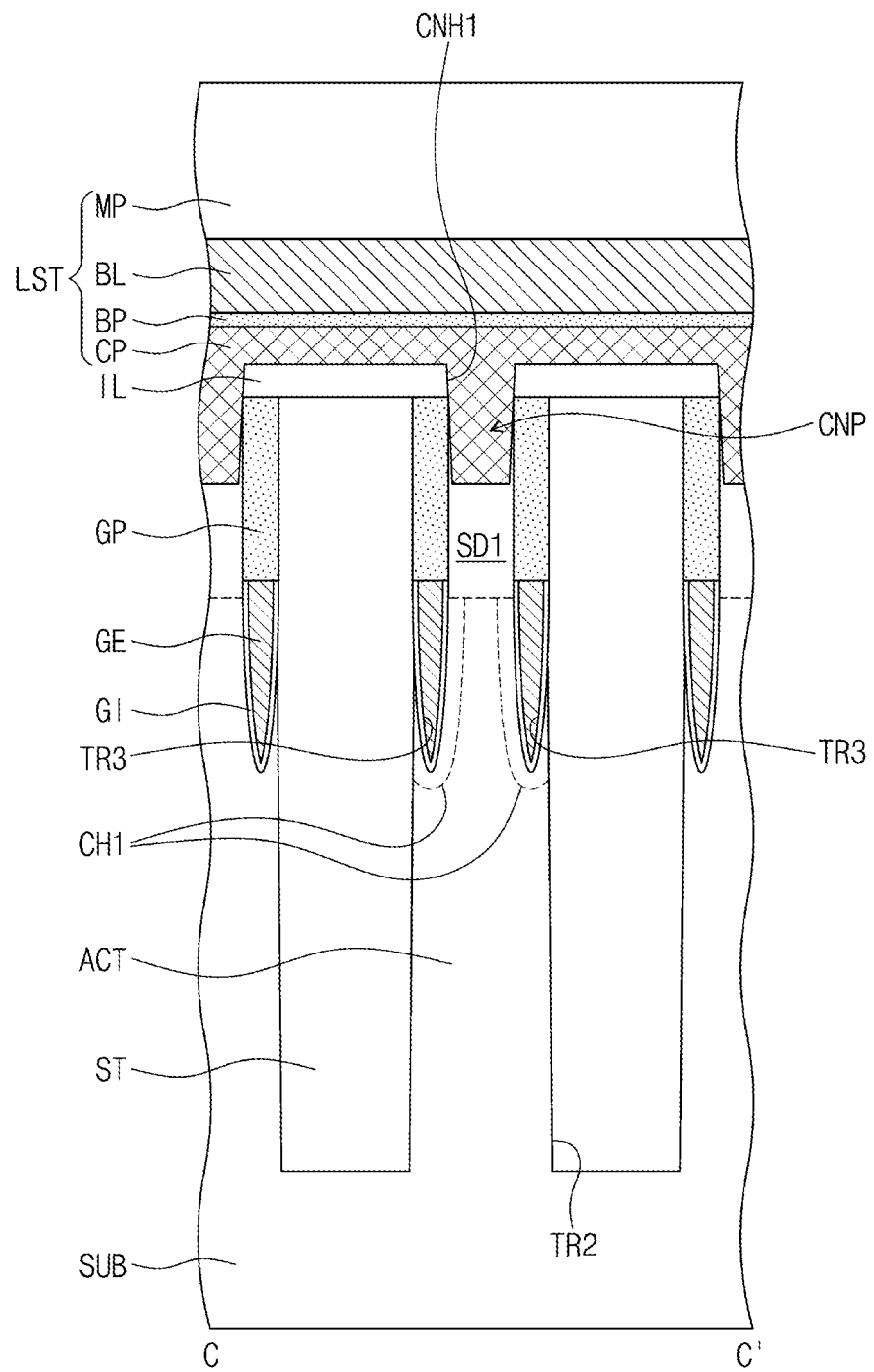
Figure 31D:
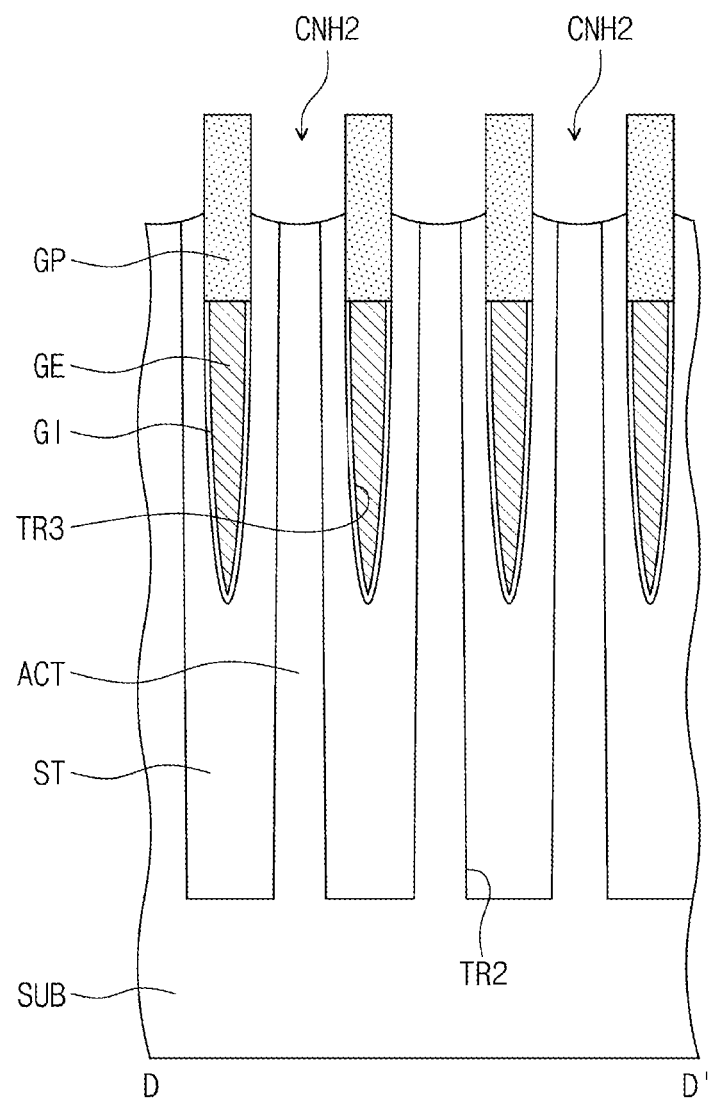
Figure 32:
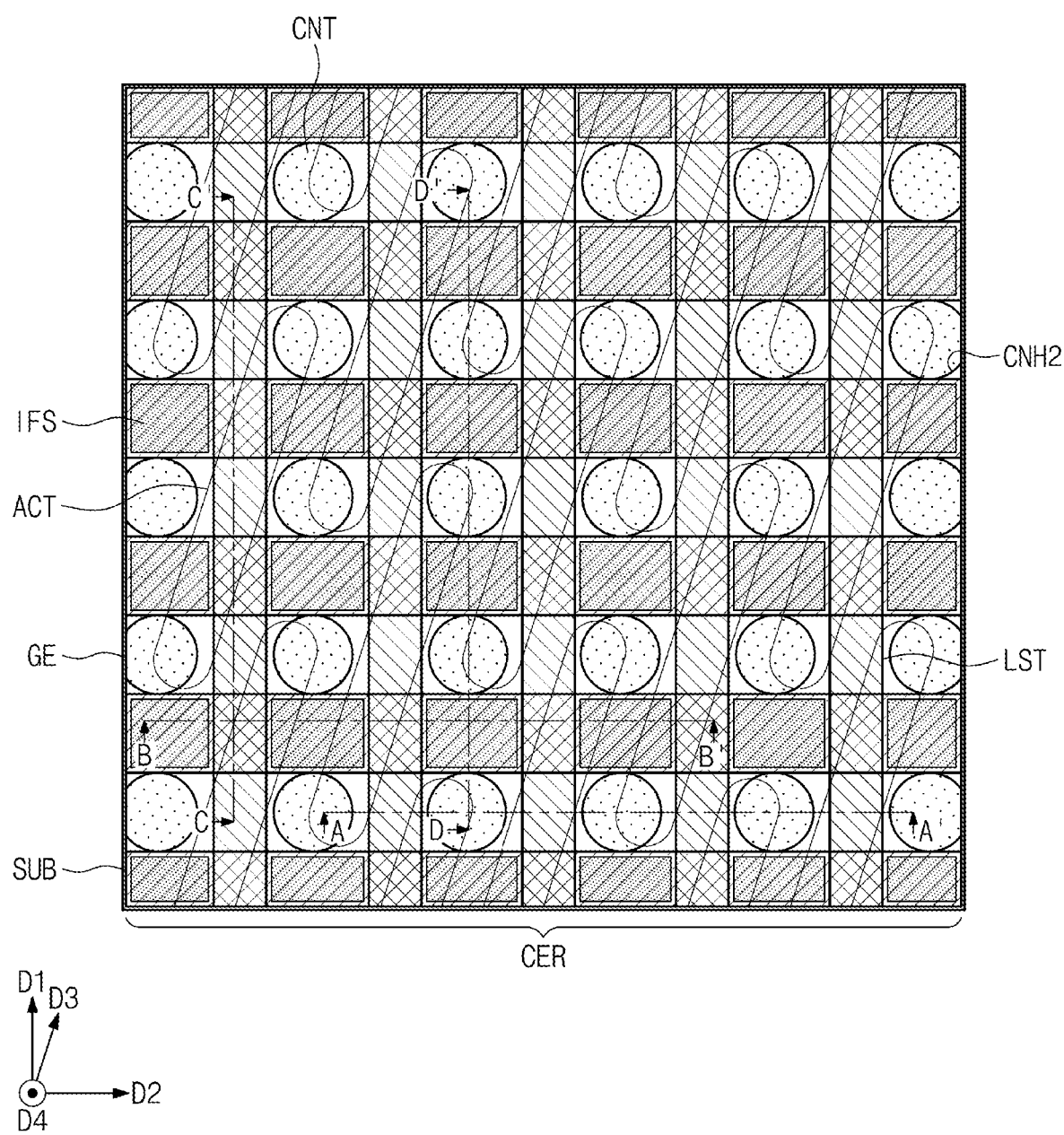
Figure 33C:
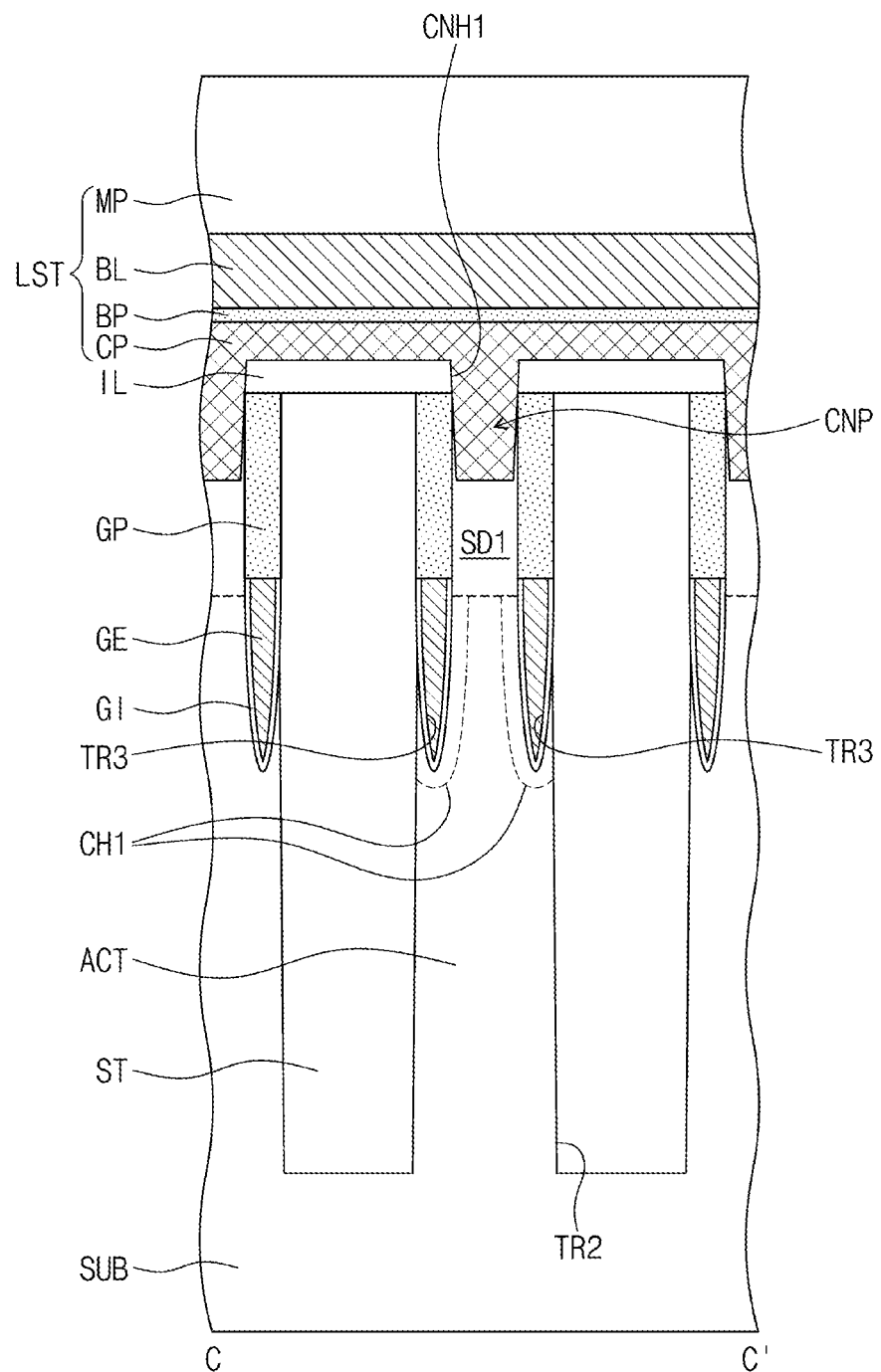
Figure 33D:
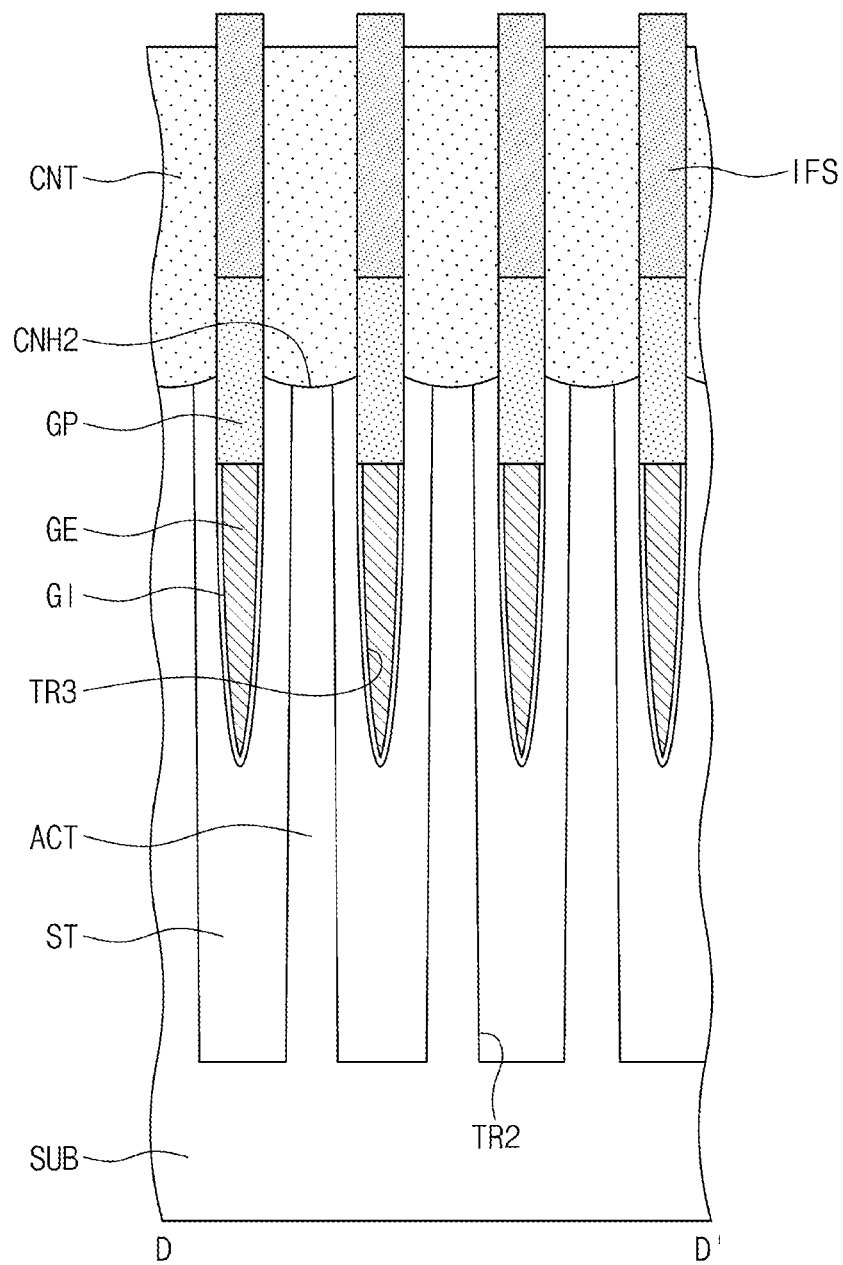

FIG. 19 is a conceptual diagram schematically illustrating a method of forming photoresist patterns on a substrate using the photomask of FIG. 18. Referring to FIG. 19, the light source 1200 of FIG. 3 may emit light toward the photomask 1400. The emitted light may pass through the transparent region of the image patterns IM and may be irradiated onto a photoresist layer PRL on the substrate SUB (e.g., through an exposure process). A region of the photoresist layer PRL, onto which the light is irradiated, may become a photoresist pattern PRP. The photoresist patterns PRP may be formed to have the same shapes and sizes as the simulation images DIM1 and DIM2 previously described with reference to FIGS. 8 and 9.

Next, a developing process may be performed to leave the photoresist patterns PRP and to remove all regions of the photoresist layer PRL other than the photoresist patterns PRP. An etching target layer TGL on the substrate SUB may be patterned using the photoresist patterns PRP as an etch mask. Thus, desired target patterns may be formed on the substrate SUB. As a result, a semiconductor device may be fabricated by forming target patterns in each layer using this method (in S50 of FIG. 2).

In the OPC method according to an embodiment of the inventive concept, it may be possible to address an incongruity issue between OPC patterns, which are located on a boundary between a low-level patch and a high-level patch when a curvilinear OPC pattern is generated. Accordingly, the OPC pattern on the patch boundary may be formed in a single continuous curvilinear shape. All of the OPC patterns on the layout LO of the full-chip size may be stably generated, and this may make it possible to realize an OPC result with high precision and a photolithography process with high precision. In the OPC method according to an embodiment of the inventive concept, it may be possible to realize a highly-integrated and highly-reliable semiconductor device.

FIGS. 20, 22, 22, 24, 26, 28, 30, 32, and 34 are plan views illustrating a method of fabricating a semiconductor device, according to an embodiment of the inventive concept. FIGS. 21A, 23A, 25A, 27A, 29A, 31A, 33A, and 35A are sectional views taken along lines A-A' of FIGS. 20, 22, 22, 24, 26, 28, 30, 32, and 34, respectively. FIGS. 21B, 23B, 25B, 27B, 29B, 31B, 33B, and 35B are sectional views taken along lines B-B' of FIGS. 20, 22, 22, 24, 26, 28, 30, 32, and 34, respectively. FIGS. 21C, 23C, 25C, 27C, 29C, 31C, 33C, and 35C are sectional views taken along lines C-C' of FIGS. 20, 22, 22, 24, 26, 28, 30, 32, and 34, respectively. FIGS. 21D, 23D, 25D, 27D, 29D, 31D, 33D, and 35D are sectional views taken along lines D-D' of FIGS. 20, 22, 22, 24, 26, 28, 30, 32, and 34, respectively.

Referring to FIGS. 20 and 21A to 21D, active patterns ACT may be formed by patterning an upper portion of a substrate SUB. Each of the active patterns ACT may be extended in a third direction D3, which is parallel to a top surface of the substrate SUB. The active patterns ACT may be two-dimensionally arranged in a first direction D1 and a second direction D2. The active patterns ACT may be spaced apart from each other in the third direction D3.

The active patterns ACT may be realized using a photolithography process. A photomask, which is used in the photolithography process for realizing the active patterns ACT, may be manufactured through the OPC method described with reference to FIGS. 4 to 17.

In an embodiment, the patterning process to form the active patterns ACT may include an EUV lithography process. The EUV lithography process may include performing an exposing process of irradiating the EUV light onto a photoresist layer and performing a developing process of developing the photoresist layer. As an example, the photoresist layer may be an organic photoresist layer containing an organic polymer (e.g., polyhydroxystyrene). The organic photoresist layer may further include a photosensitive compound, which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but embodiments of the inventive concept are not limited to these examples.

Mask patterns may be formed by patterning at least one layer, which is disposed below the photoresist patterns, using the photoresist patterns as an etch mask. Desired patterns may be formed on a wafer by patterning a target layer using the mask patterns as an etch mask.

For example, the minimum pitch between the active patterns ACT, which are realized by the EUV lithography process according to the present embodiment, may be less than or equal to 45 nm. In other words, by using the EUV lithography process, it may be possible to precisely and finely form the active patterns ACT, using just one photomask.

First and second trenches TR1 and TR2 may be defined between the active patterns ACT. The first trench TR1 may be defined between a pair of active patterns ACT, which are adjacent to each other in the second direction D2. The second trench TR2 may be defined between a pair of active patterns ACT, which are adjacent to each other in the third direction D3.

A device isolation layer ST may be formed to at least partially fill the first and second trenches TR1 and TR2. The device isolation layer ST may be formed in the first and second trenches TR1 and TR2 and may be on and at least partially cover the active patterns ACT. In some embodiments, the device isolation layer ST may completely fill the first and second trenches TR1 and TR2. A planarization process may be performed on the device isolation layer ST to expose the top surfaces of the active patterns ACT.

Referring to FIGS. 22 and 23A to 23D, third trenches TR3 may be formed by patterning the active patterns ACT and the device isolation layer ST. When viewed in a plan view, each of the third trenches TR3 may have a line shape extending in the second direction D2.

The formation of the third trenches TR3 may include forming a hard mask pattern with openings and etching the exposed portions of the active patterns ACT and the device isolation layer ST using the hard mask pattern as an etch mask. The third trench TR3 may be formed to be shallower than the first trench TR1.

Referring to FIGS. 24 and 25A to 25D, a gate insulating layer GI, a gate electrode GE, and a gate capping layer GP may be sequentially formed in each of the third trenches TR3. In detail, the gate insulating layer GI may be formed on and may conformally cover the third trench TR3. The gate insulating layer GI may include a silicon oxide layer, a silicon nitride layer, a silicon oxynitride layer, and/or a high-k dielectric layer.

The gate electrode GE may be formed on the gate insulating layer GI by forming a conductive layer to at least partially fill the third trench TR3. The conductive layer may be formed of or include conductive metal nitrides and/or metallic materials.

The gate insulating layer GI and the gate electrode GE may be recessed to form an empty region and the gate capping layer GP may be formed in the empty region or on the recessed gate electrode GE. The gate capping layer GP may be formed to have a top surface that is coplanar with the top surface of the active pattern ACT.

An ion implantation process may be performed on the active patterns ACT to form a first source/drain region SD1 and a pair of second source/drain regions SD2 in an upper portion of the active pattern ACT. The pair of second source/drain regions SD2 may be spaced apart from each other in the third direction D3, with the first source/drain region SD1 interposed therebetween. In an embodiment, the first and second source/drain regions SD1 and SD2 may be doped with the same impurities.

A channel region CH may be defined in a portion of the active pattern ACT located below the gate electrode GE. When viewed in a plan view, the channel region CH may be interposed between the first source/drain region SD1 and the second source/drain region SD2. The gate electrode GE may be provided on the top surface and opposite side surfaces of the channel region CH (e.g., see FIG. 25B).

Referring to FIGS. 26 and 27A to 27D, an insulating layer IL may be formed on the substrate SUB. As an example, the insulating layer IL may be a multi-layered structure, in which a silicon oxide layer and a silicon oxynitride layer are stacked. The insulating layer IL may be patterned to form first contact holes CNH1, each of which exposes a corresponding one of the first source/drain regions SD1 of the active patterns ACT. When the first contact hole CNH1 is formed, an upper portion of the first source/drain region SD1 may be partially recessed. Similarly, when the first contact hole CNH1 is formed, an upper portion of the device isolation layer ST around the first source/drain region SD1 may be partially recessed.

Referring to FIGS. 28 and 29A to 29D, a first conductive layer CL1, a barrier layer BAL, and a second conductive layer CL2 may be sequentially formed on the insulating layer IL. The first conductive layer CL1 may at least partially fill the first contact holes CNH1. In other words, the first conductive layer CL1 may be in physical contact with the first source/drain regions SD1 of the active patterns ACT. The first conductive layer CL1 may be vertically spaced apart from the second source/drain regions SD2 of the active patterns ACT by the insulating layer IL. The first conductive layer CL1 may be formed of or include one or more doped semiconductor materials.

The barrier layer BAL may be formed to be interposed between the first conductive layer CL1 and the second conductive layer CL2. The barrier layer BAL may be formed of or include one or more conductive metal nitrides. The second conductive layer CL2 may be formed of or include one or more metallic materials. The barrier layer BAL may prevent or suppress a metallic material in the second conductive layer CL2 from being diffused into the first conductive layer CL1.

Referring to FIGS. 30 and 31A to 31D, line structures LST may be formed on the insulating layer IL to be extended in the first direction D1 and parallel to each other. The line structures LST may be arranged in the second direction D2.

In detail, mask patterns MP may be formed on the second conductive layer CL2. The mask patterns MP may be formed in a line shape extending in the first direction D1. As an example, the mask patterns MP may be formed of or include silicon nitride and/or silicon oxynitride.

A bit line BL, a barrier pattern BP, and a conductive pattern CP may be formed by sequentially patterning the second conductive layer CL2, the barrier layer BAL, and the first conductive layer CL1 using the mask patterns MP as a mask. The mask pattern MP, the bit line BL, the barrier pattern BP, and the conductive pattern CP may be vertically overlapped with each other in the cross-sectional views of FIGS. 31A-31C. The mask pattern MP, the bit line BL, the barrier pattern BP, and the conductive pattern CP may constitute the line structure LST. When viewed in a plan view, the bit lines BL may be extended to cross the gate electrodes GE.

The conductive pattern CP may include contact portions CNP at least partially filling the first contact holes CNH1, respectively. The conductive pattern CP may be connected to the first source/drain region SD1 through the contact portion CNP. In other words, the bit line BL may be electrically connected to the first source/drain region SD1 through the conductive pattern CP.

A pair of spacers SP may be formed on opposite side surfaces of each of the line structures LST. The formation of the spacers SP may include conformally forming a spacer layer on the entire top surface of the substrate SUB and anisotropically etching the spacer layer.

An etching process using the spacers SP and the mask patterns MP as a mask may be performed on the entire top surface of the substrate 100 to form second contact holes CNH2 exposing the second source/drain regions SD2, respectively. In detail, the second contact hole CNH2 may be formed to penetrate the insulating layer IL and may be extended to a level lower than the top surface of the substrate SUB. When the second contact hole CNH2 is formed, an upper portion of the second source/drain region SD2 may be partially recessed. When the second contact hole CNH2 is formed, an upper portion of the device isolation layer ST around the second source/drain region SD2 may be partially recessed.

Referring to FIGS. 32 and 33A to 33D, a plurality of insulating fences IFS may be formed on the gate capping layer GP. The insulating fences IFS may not overlap the second contact holes CNH2 in the D4 direction and may expose the second contact holes CNH2.

Contacts CNT may be respectively formed in the second contact holes CNH2 by at least partially filling the second contact holes CNH2 with a conductive material. The contacts CNT may be connected to the second source/drain regions SD2. In detail, the conductive material may be formed on the entire top surface of the substrate SUB and then may be recessed until a top surface of the conductive material is lower than top surfaces of the insulating fences IFS. In this case, the conductive material may be cut by the insulating fences IFS, and as a result, the contacts CNT may be formed in the second contact holes CNH2, respectively. The contacts CNT and the insulating fences IFS may be alternately arranged in the first direction D1.

The conductive material at least partially filling the second contact holes CNH2 may be formed of or include one or more doped semiconductor materials. In an embodiment, the second contact holes CNH2 may be at least partially filled with a doped semiconductor material, and then, impurities in the semiconductor material may be diffused into the second source/drain regions SD2.

Referring to FIGS. 34 and 35A to 35D, landing pads LP may be formed on the contacts CNT, respectively. In detail, a metal layer may be formed on the contacts CNT and the insulating fences IFS. The landing pads LP may be formed by patterning the metal layer.

The patterning of the metal layer may be performed using the photolithography process previously described with reference to FIGS. 18 and 19. For example, the photomask 1400 described with reference to FIG. 18 may be used as a photomask for forming the landing pads LP. In other words, the photomask for forming the landing pads LP may be manufactured through the OPC method described with reference to FIGS. 4 to 17.

Because the photomask manufactured through the afore-described OPC method is used to form the landing pads LP, the landing pads LP may be precisely formed, even when the landing pads LP have fine sizes and fine pitches. Thus, it may be possible to form the landing pads LP on the contacts CNT, respectively, without a process defect issue.

An insulating pattern INP may be formed by at least partially filling a space between the landing pads LP with an insulating material. First electrodes LEL may be formed on the landing pads LP, respectively. The afore-described photolithography process may be used as a part of a patterning process to form the first electrodes LEL.

A dielectric layer HDL may be conformally formed on the first electrodes LEL. A second electrode TEL may be formed on the dielectric layer HDL. The first electrode LEL, the dielectric layer HDL, and the second electrode TEL may constitute a data storing element DS (e.g., a capacitor). Although not shown, metal layers (e.g., M1, M2, M3, M4, and so forth) may be further formed on the second electrode TEL.

Figure 36:
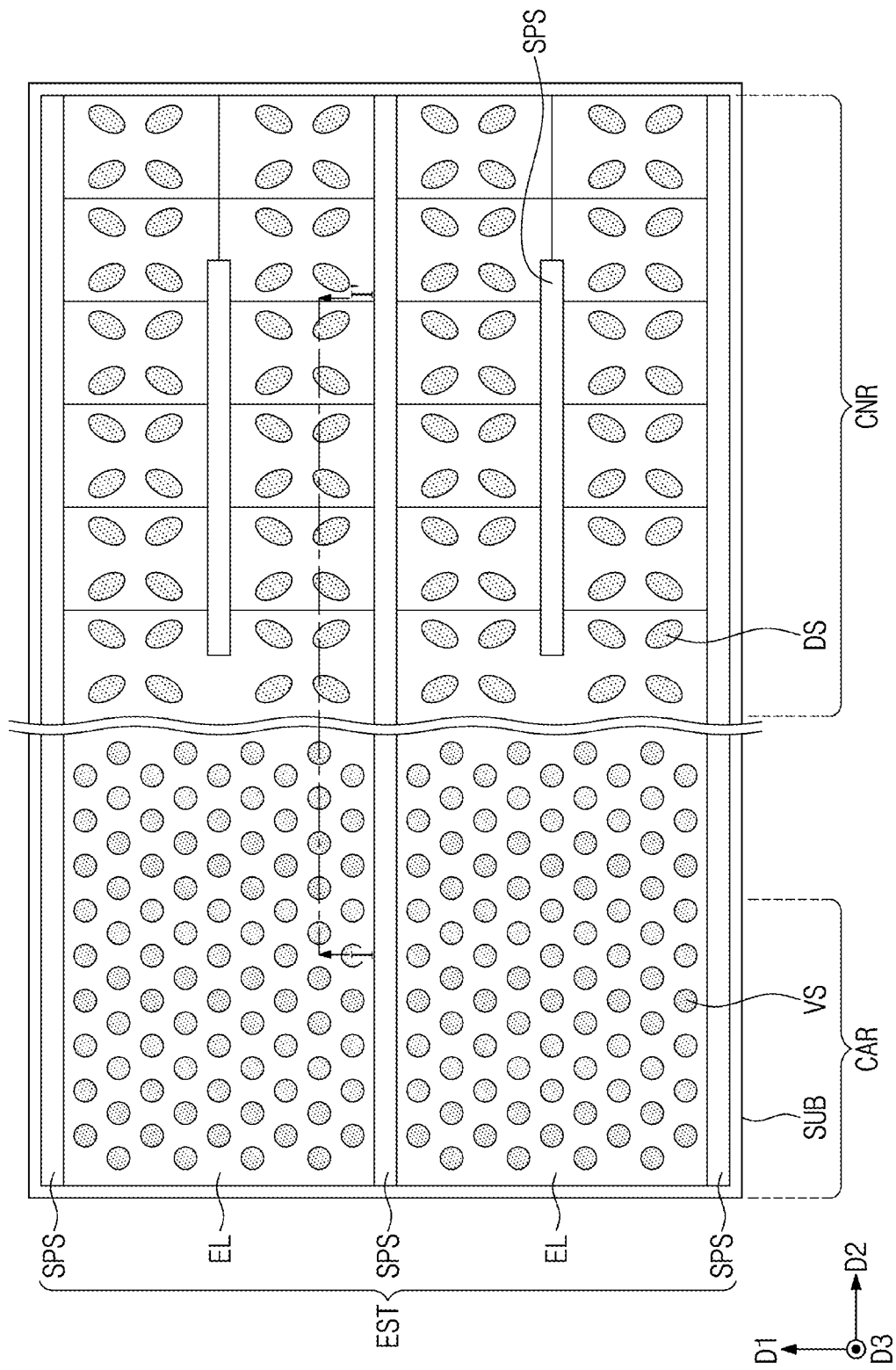
FIG. 36 is a plan view illustrating a method of fabricating a three-dimensional semiconductor memory device, according to an embodiment of the inventive concept.

FIG. 36 is a plan view illustrating a method of fabricating a three-dimensional semiconductor memory device, according to an embodiment of the inventive concept. FIGS. 37 to 42 are sectional views, which are taken along a line I-I' of FIG. 36 to illustrate a method of fabricating a three-dimensional semiconductor memory device, according to an embodiment of the inventive concept.

Figure 37:
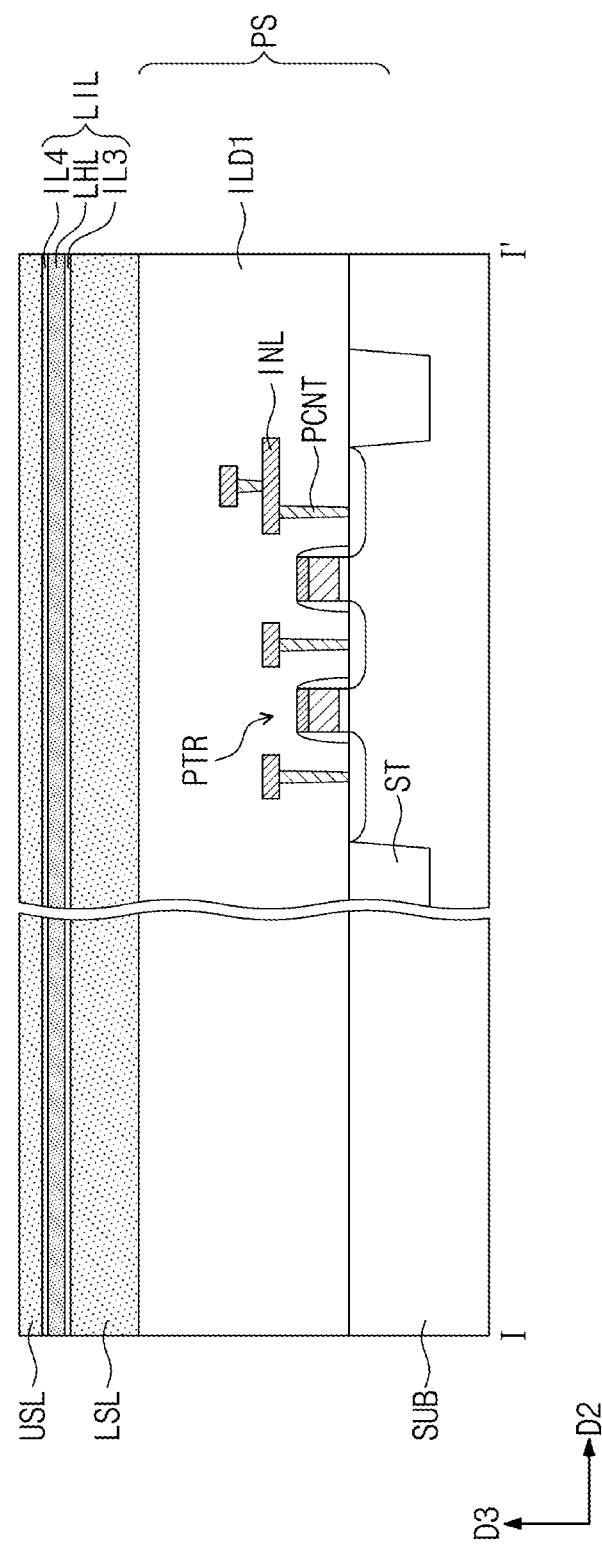
FIGS. 37 to 42 are sectional views, which are taken along a line I-I' of FIG. 36 to illustrate a method of fabricating a three-dimensional semiconductor memory device, according to an embodiment of the inventive concept.

Referring to FIGS. 36 and 37, a peripheral circuit structure PS may be formed on a substrate SUB. The formation of the peripheral circuit structure PS may include forming peripheral transistors PTR on the substrate SUB and forming lower interconnection lines INL on the peripheral transistors PTR. For example, the formation of the peripheral transistors PTR may include forming a device isolation layer ST on the substrate SUB to define active regions, forming a gate insulating layer and a gate electrode on the active regions, and doping upper portions of the active regions with impurities to form source/drain regions. A first interlayer insulating layer ILD1 may be formed on to at least partially cover the peripheral transistors PTR and the lower interconnection lines INL.

A lower semiconductor layer LSL may be formed on the first interlayer insulating layer ILD1. For example, the lower semiconductor layer LSL may be formed of or include a semiconductor material (e.g., polysilicon). A lower insulating layer LIL may be formed on the lower semiconductor layer LSL. The formation of the lower insulating layer LIL may include sequentially forming a third insulating layer IL3, a lower sacrificial layer LHL, and a fourth insulating layer IL4 on the lower semiconductor layer LSL. The third and fourth insulating layers IL3 and IL4 may be formed of or include silicon oxide, and the lower sacrificial layer LHL may be formed of or include silicon nitride or silicon oxynitride. An upper semiconductor layer USL may be conformally formed on the lower sacrificial layer LHL. For example, the upper semiconductor layer USL may be formed of or include a semiconductor material (e.g., polysilicon).

Figure 38:
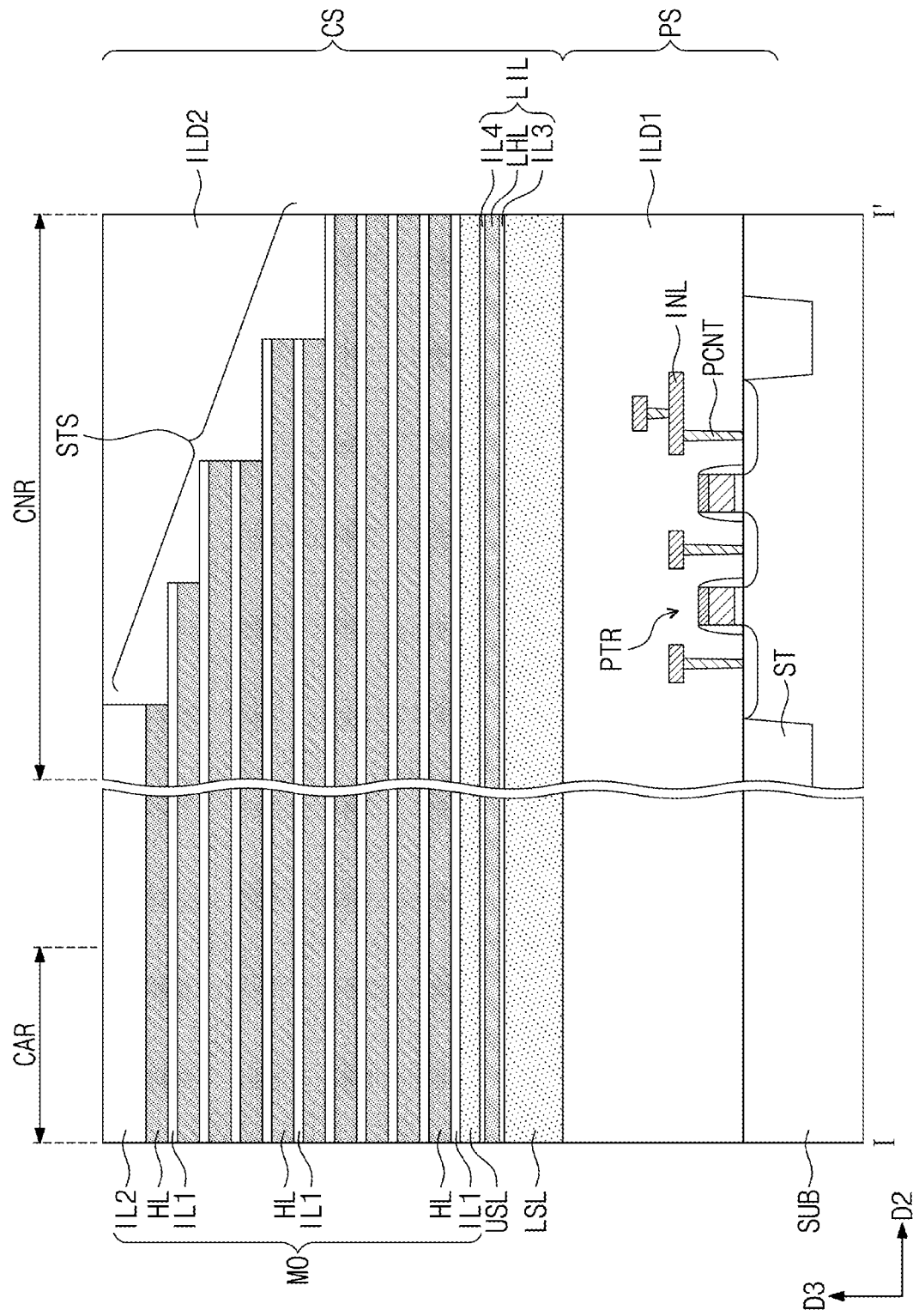

Referring to FIGS. 36 and 38, a stack MO may be formed on the upper semiconductor layer USL. In detail, the stack MO may be formed by alternately stacking first insulating layers IL1 and sacrificial layers HL on the upper semiconductor layer USL. A second insulating layer IL2 may be formed at a topmost level of the stack MO.

The first insulating layers Ill, the sacrificial layers HL, and the second insulating layer IL2 may be deposited using at least one of thermal chemical vapor deposition, plasma-enhanced chemical vapor deposition, physical chemical vapor deposition, or atomic layer deposition processes. The first and second insulating layers IL1 and IL2 may be formed of or include silicon oxide, and the sacrificial layers HL may be formed of or include at least one of silicon nitride or silicon oxynitride.

A staircase structure STS may be formed in the stack MO on a connection region CNR. In detail, the staircase structure STS may be formed on the connection region CNR by performing a cycle process on the stack MO. The formation of the staircase structure STS may include forming a mask pattern (not shown) on the stack MO and repeatedly performing a patterning process using the mask pattern. Each patterning process may include a step of etching a portion of the stack MO using the mask pattern as an etch mask and a trimming step of reducing a size (e.g., a width) of the mask pattern.

A second interlayer insulating layer ILD2 may be formed on the stack MO. The formation of the second interlayer insulating layer ILD2 may include forming an insulating layer on to at least partially cover the stack MO and performing a planarization process on the insulating layer to expose the second insulating layer IL2.

Figure 39:
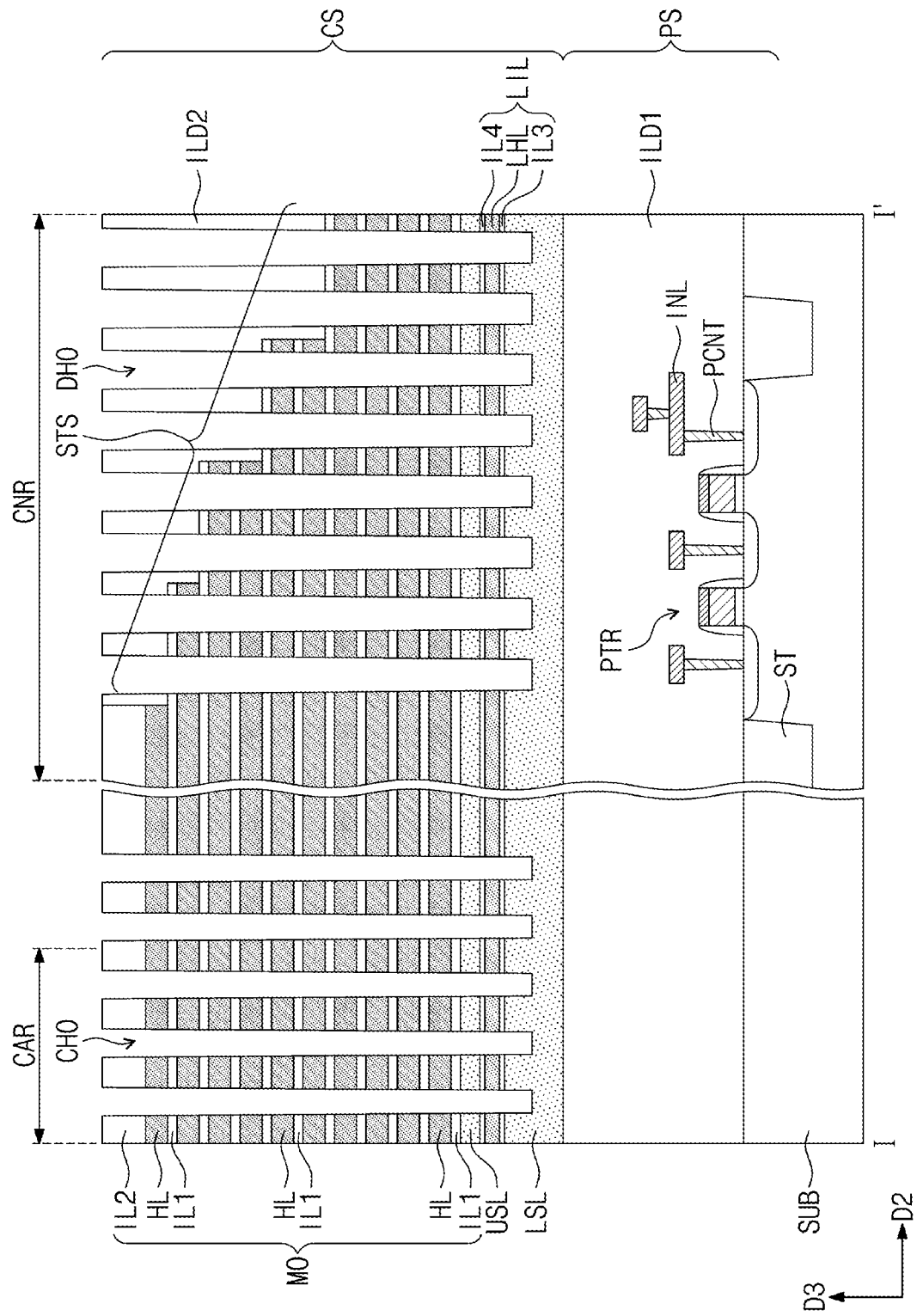

Referring to FIGS. 36 and 39, channel holes CHO may be formed on a cell array region CAR to penetrate the stack MO. In addition, dummy holes DHO may be formed on the connection region CNR to penetrate the stack MO. The dummy holes DHO may be formed to penetrate the staircase structure STS of the stack MO. Each of the channel and dummy holes CHO and DHO may expose the lower semiconductor layer LSL.

In detail, the patterning process for forming the channel holes CHO may be performed using the photolithography process previously described with reference to FIGS. 18 and 19. The photomask 1400 previously described with reference to FIG. 18 may be used as a photomask for forming the channel holes CHO. In other words, the photomask for forming the channel holes CHO may be manufactured through the OPC method described with reference to FIGS. 4 to 17.

Because the photomask manufactured through the afore-described OPC method is used to form the channel holes CHO, the channel holes CHO may be precisely formed, even when the channel holes CHO have fine sizes and fine pitches. Accordingly, it may be possible to form the channel holes CHO precisely penetrating the stack MO without a process defect issue.

When viewed in a plan view, the channel holes CHO may be arranged in a specific direction or in a zigzag shape. The largest diameter of each of the channel holes CHO may be smaller than the largest diameter of each of the dummy holes DHO.

Figure 40:
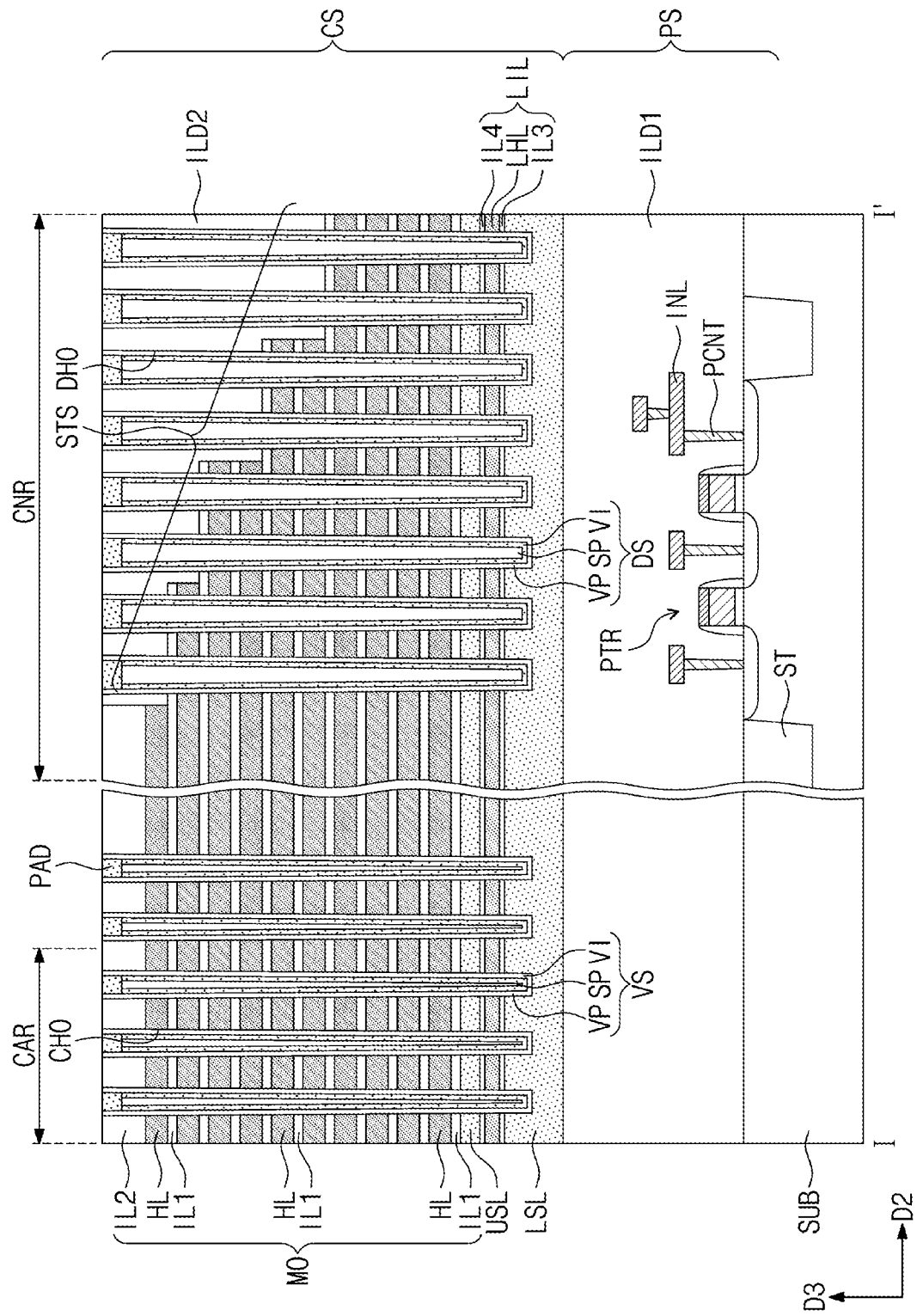

Referring to FIGS. 36 and 40, vertical channel structures VS may be formed in the channel holes CHO, respectively. Dummy structures DS may be formed in the dummy holes DHO, respectively. A conductive pad may be formed on each of the vertical channel structures VS and the dummy structures DS.

In detail, a vertical insulating pattern VP may be formed to conformally cover an inner surface of the channel hole CHO. The formation of the vertical insulating pattern VP may include sequentially forming a blocking insulating layer, a charge storing layer, and a tunnel insulating layer in the channel hole CHO. A vertical semiconductor pattern SP may be formed in the channel hole CHO to at least partially cover the vertical insulating pattern VP. The formation of the vertical semiconductor pattern SP may include forming a polysilicon layer in the channel hole CHO. Thereafter, a gap-fill insulating pattern VI may be formed in the channel hole CHO. The dummy structure DS in the dummy hole DHO may be formed simultaneously with the vertical channel structure VS.

Figure 41:
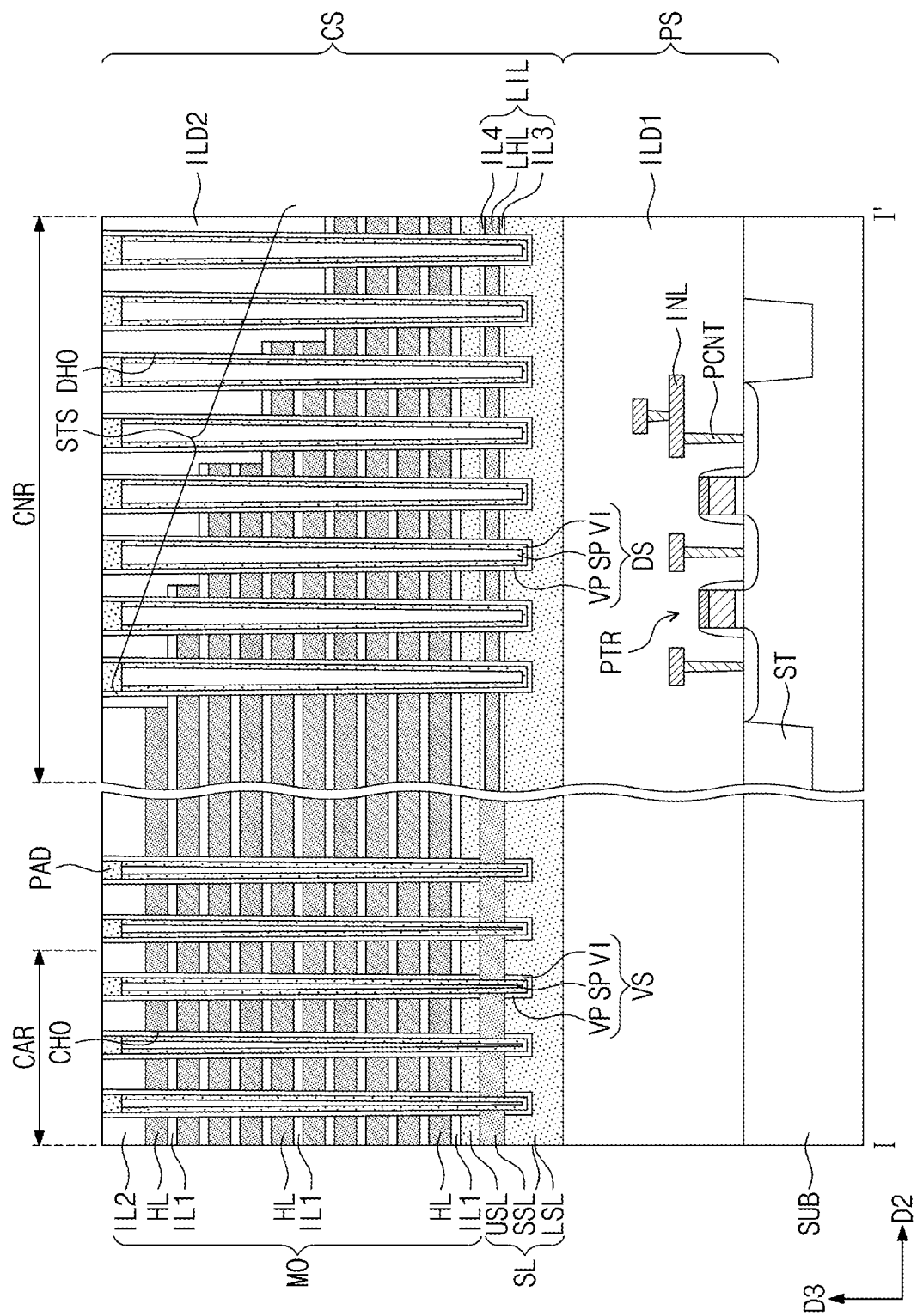

Referring to FIGS. 36 and 41, a third interlayer insulating layer ILD3 may be formed on the stack MO and the second interlayer insulating layer ILD2. The stack MO may be patterned to form cutting holes SPS penetrating the stack MO (e.g., see FIG. 36). The cutting hole SPS may be formed to expose the lower sacrificial layer LHL. The lower sacrificial layer LHL, which is exposed through the cutting hole SPS, may be replaced with a source semiconductor layer SSL. The source semiconductor layer SSL may be in direct physical contact with an exposed portion of the vertical semiconductor pattern SP. In an embodiment, the lower sacrificial layer LHL on the connection region CNR may not be removed. Thus, the source semiconductor layer SSL may not be formed on the connection region CNR.

Figure 42:
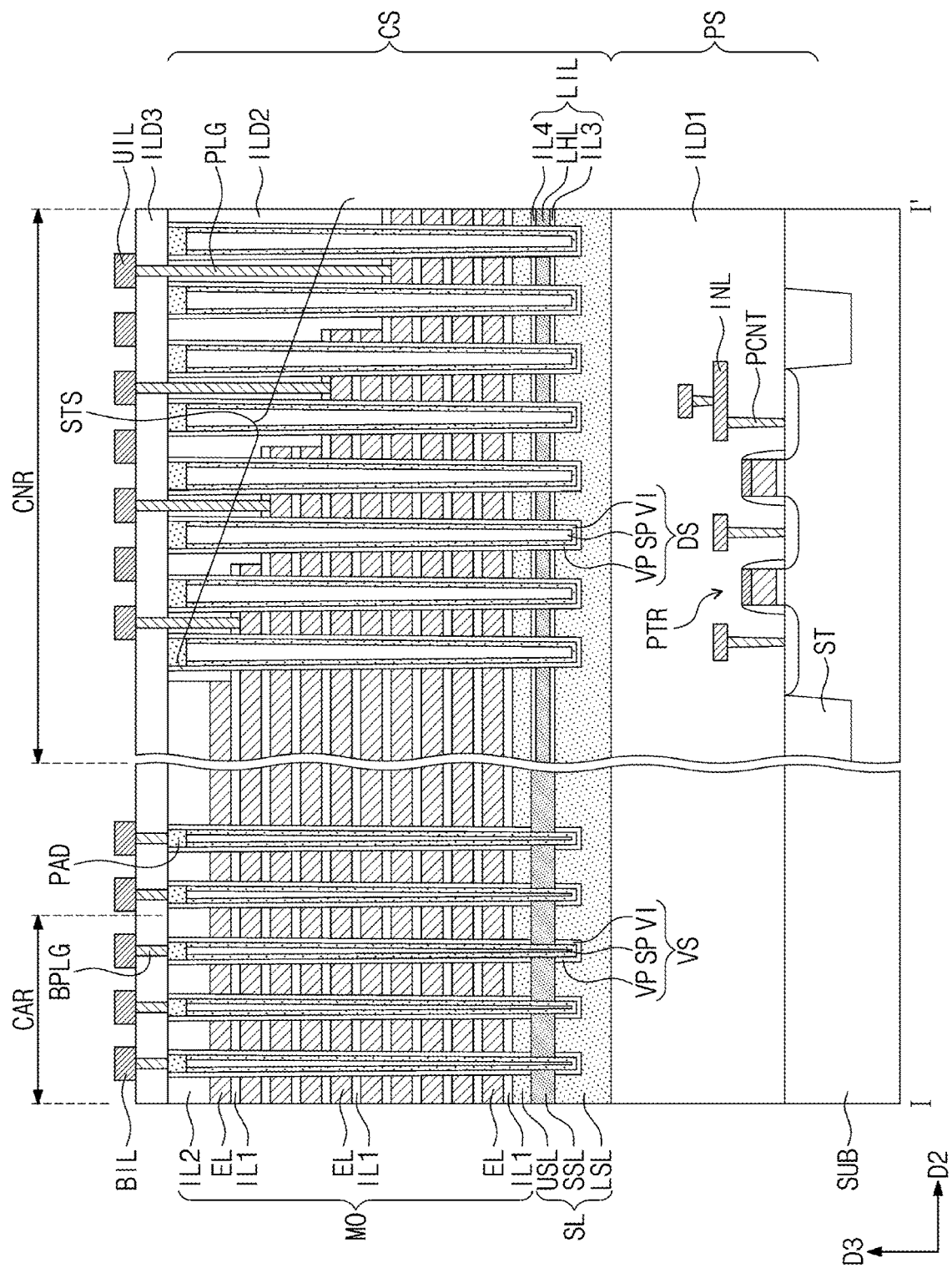

Referring to FIGS. 36 and 42, electrode structure EST may be formed by replacing the sacrificial layers HL, which are exposed through the cutting hole SPS, with electrodes EL. In detail, the sacrificial layers HL, which are exposed through the cutting hole SPS, may be selectively removed. The electrodes EL may be formed in spaces, which are formed by removing the sacrificial layers HL. Thereafter, the cutting hole SPS may be at least partially filled with an insulating material.

Bit line contact plugs BPLG may be formed on the cell array region CAR to penetrate the third interlayer insulating layer ILD3 and to be coupled to the conductive pads PAD, respectively. Cell contact plugs PLG may be formed on the connection region CNR to penetrate the second and third interlayer insulating layers ILD2 and ILD3 and to be respectively coupled to the electrodes EL of the staircase structure STS. Bit lines BL and upper interconnection lines UIL may be formed on the third interlayer insulating layer ILD3, and here, the bit lines BL may be electrically connected to the bit line contact plugs BPLG and the upper interconnection lines UIL may be electrically connected to the cell contact plugs PLG.

Figure 43:
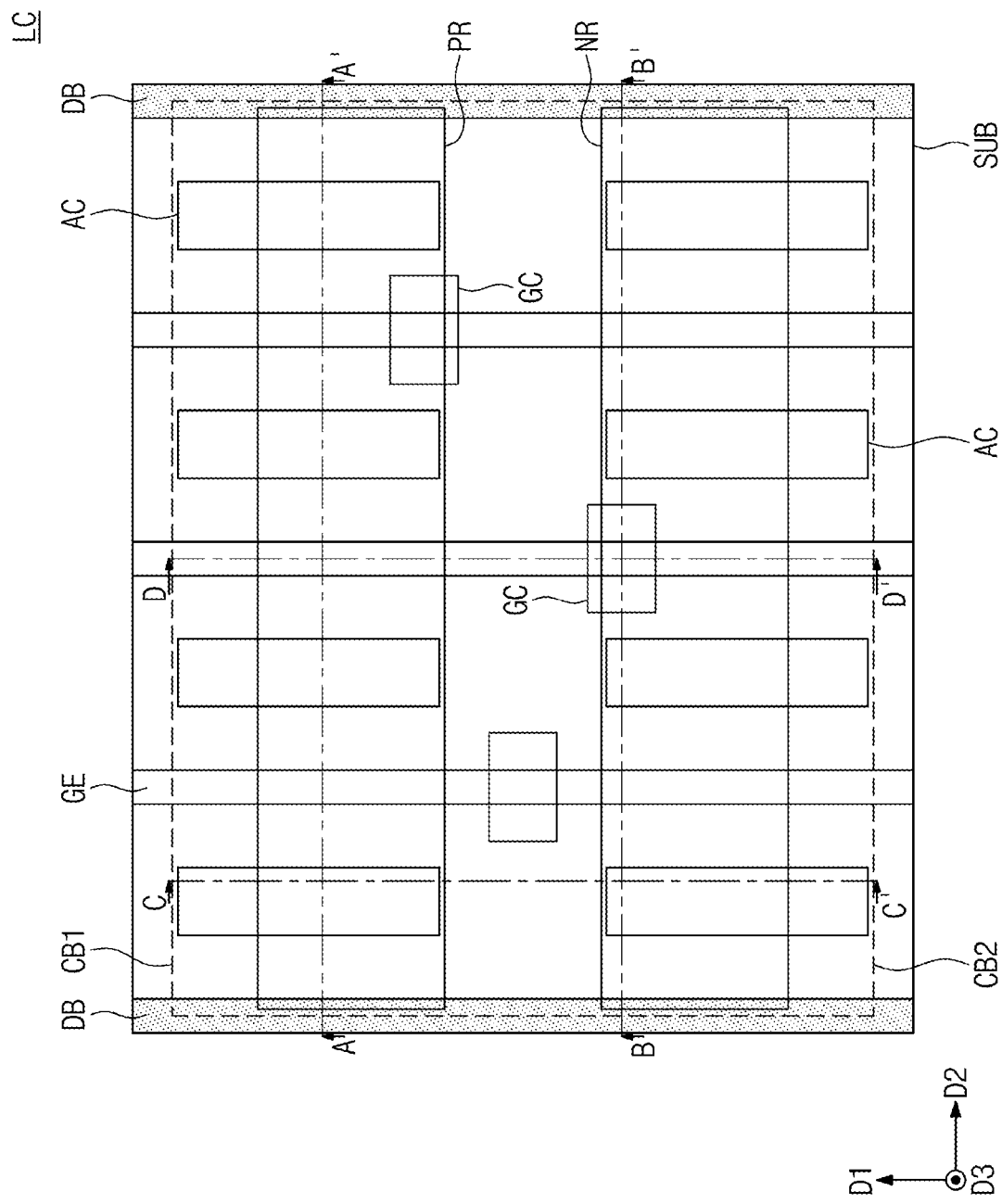
FIGS. 43, 45, and 47 are plan views illustrating a method of fabricating a semiconductor device, according to an embodiment of the inventive concept.
Figure 44A:
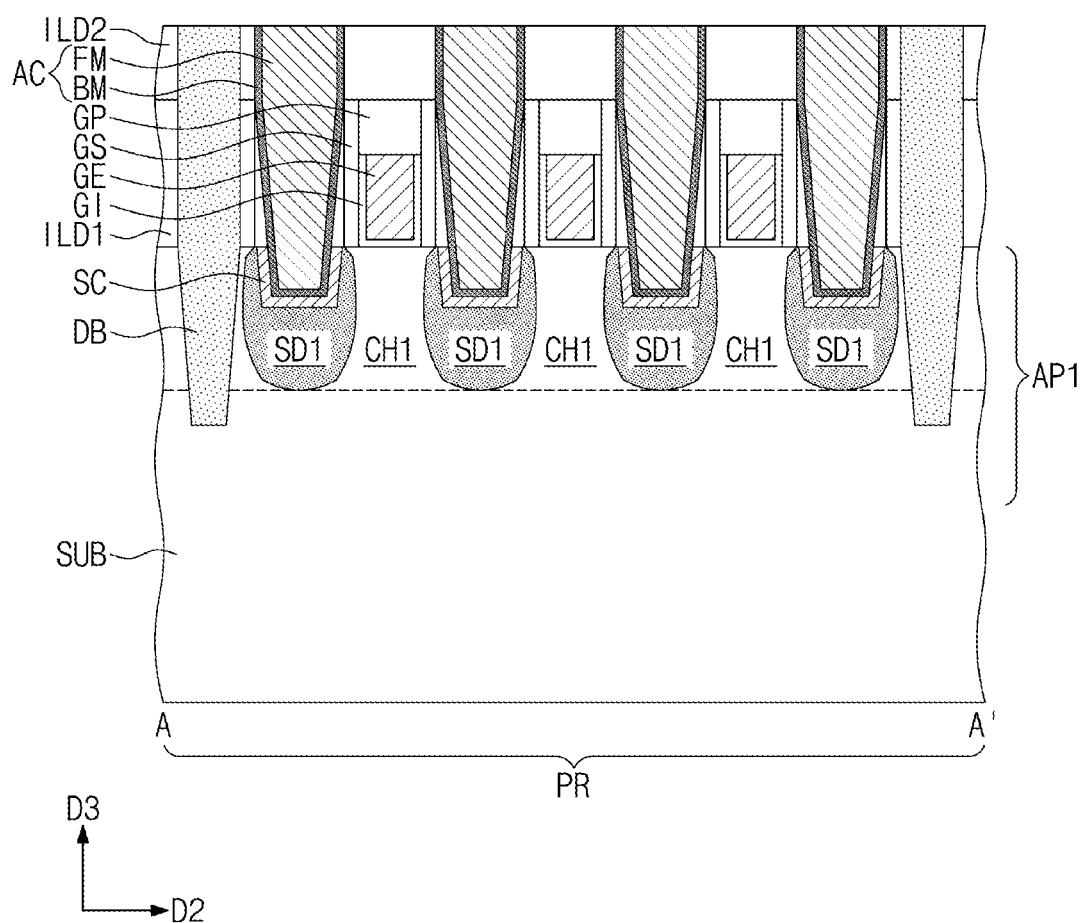
FIGS. 44A, 46A, and 48A are sectional views taken along lines A-A' of FIGS. 43, 45, and 47, respectively.
Figure 44B:
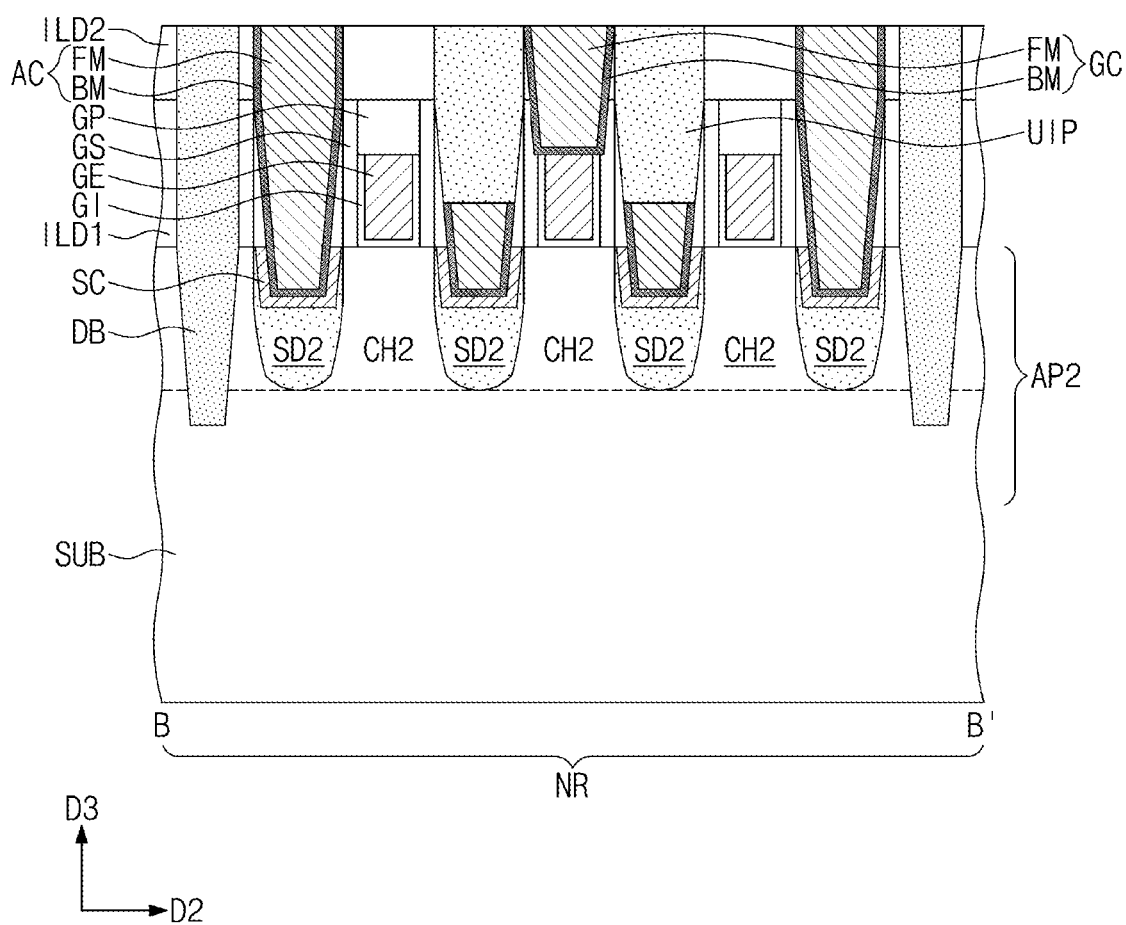
FIGS. 44B, 46B, and 48B are sectional views taken along lines B-B' of FIGS. 43, 45, and 47, respectively.
Figure 44C:
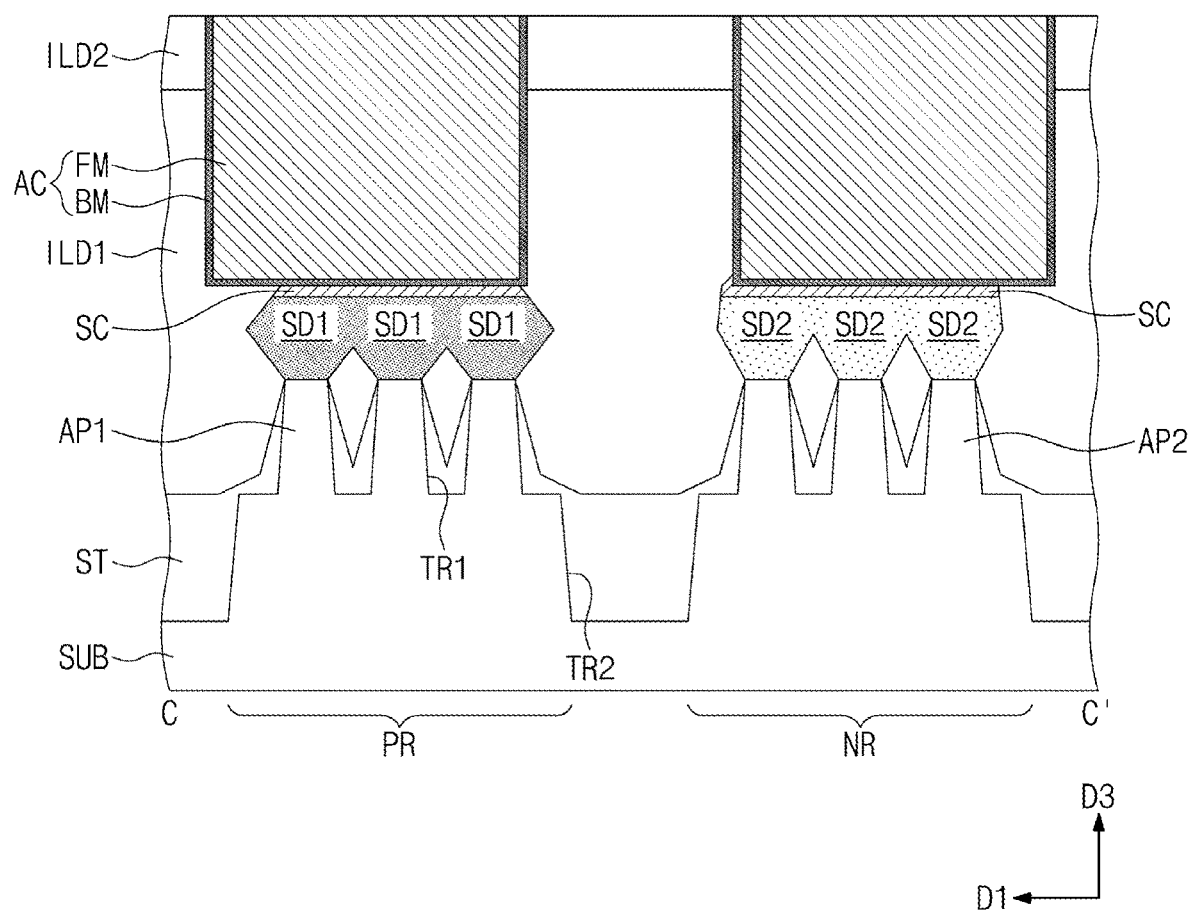
FIGS. 44C, 46C, and 48C are sectional views taken along lines C-C' of FIGS. 43, 45, and 47, respectively.
Figure 44D:
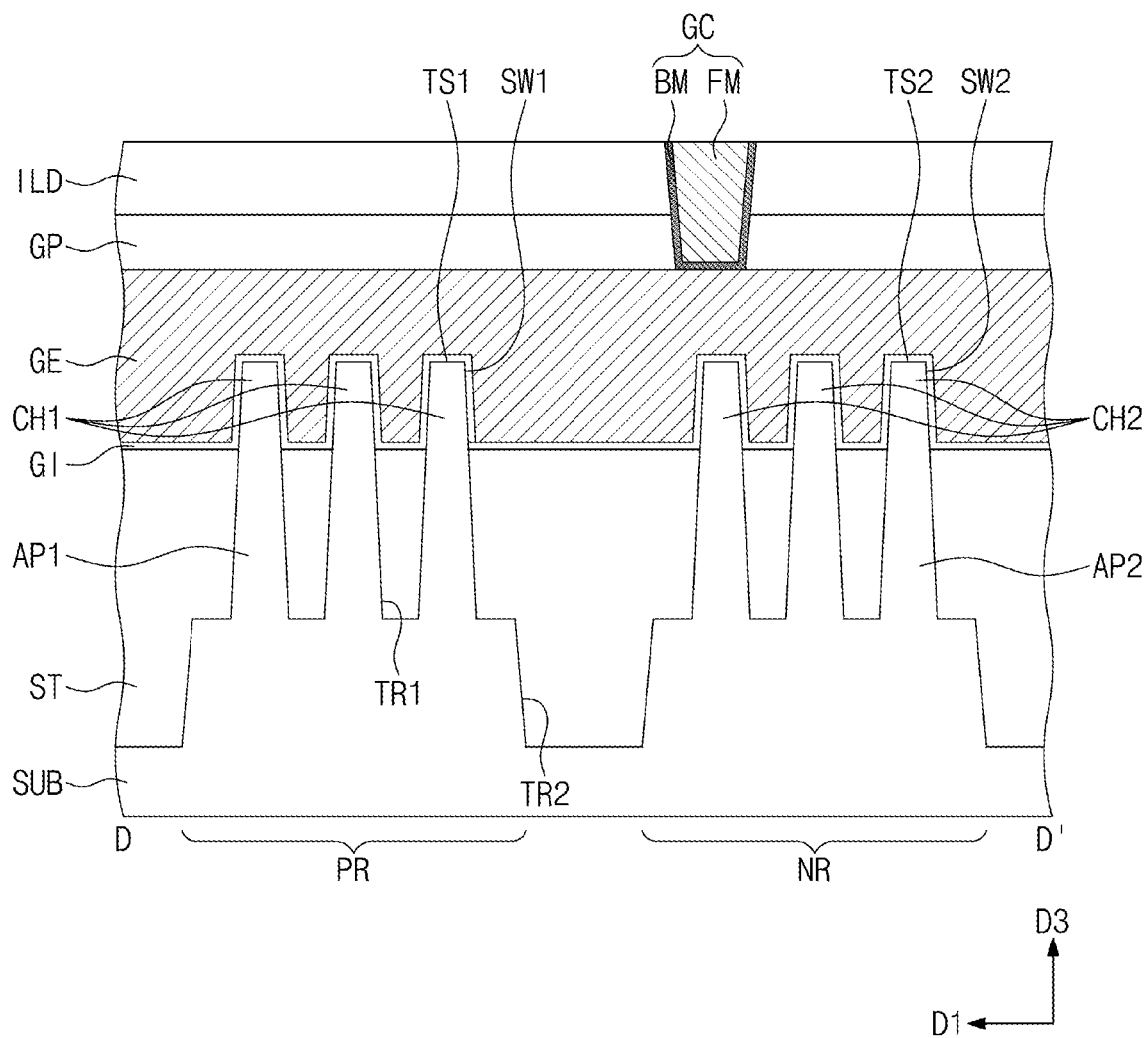
FIGS. 44D, 46D, and 48D are sectional views taken along lines D-D' of FIGS. 43, 45, and 47, respectively.
Figure 45:
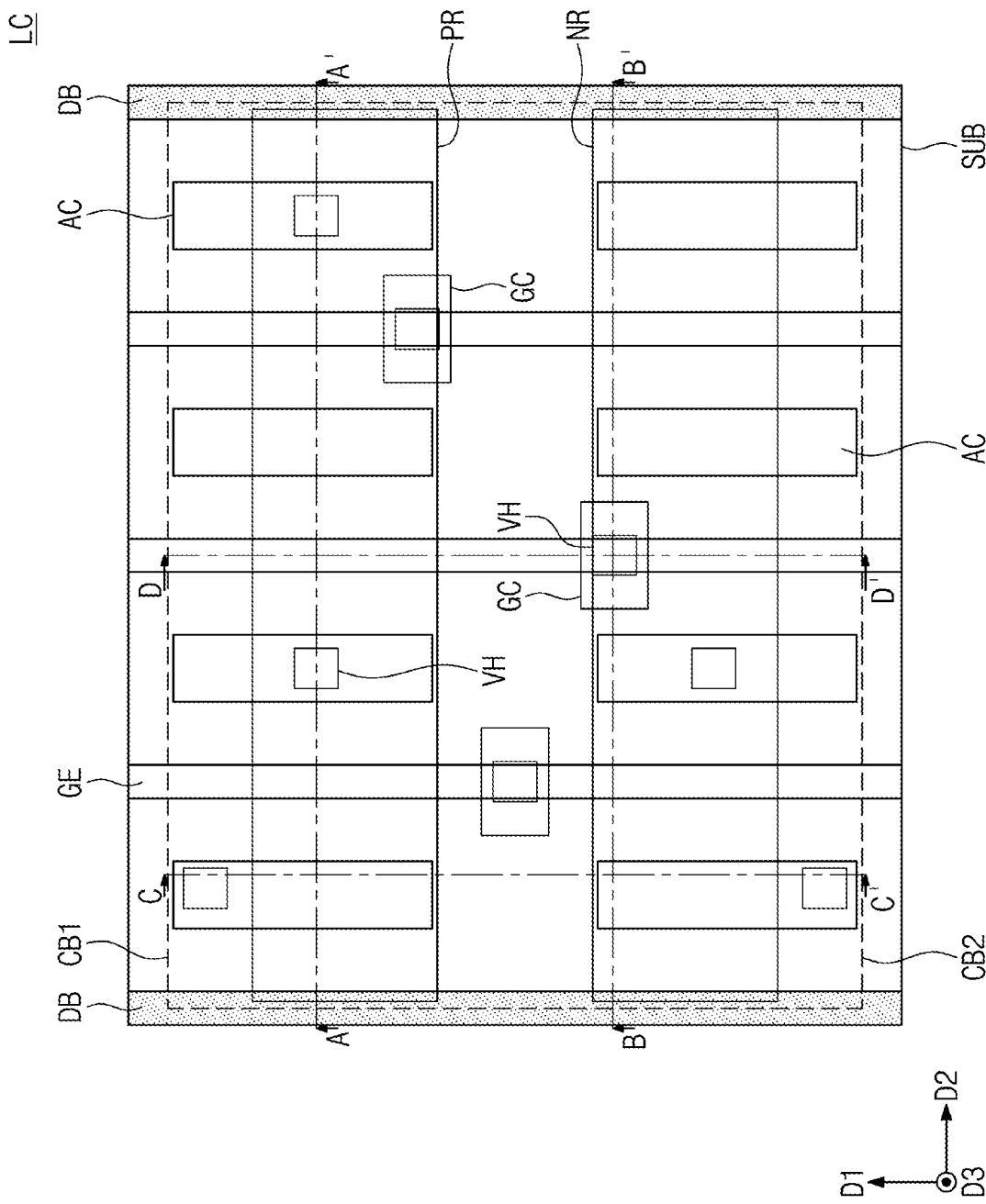
Figure 46A:
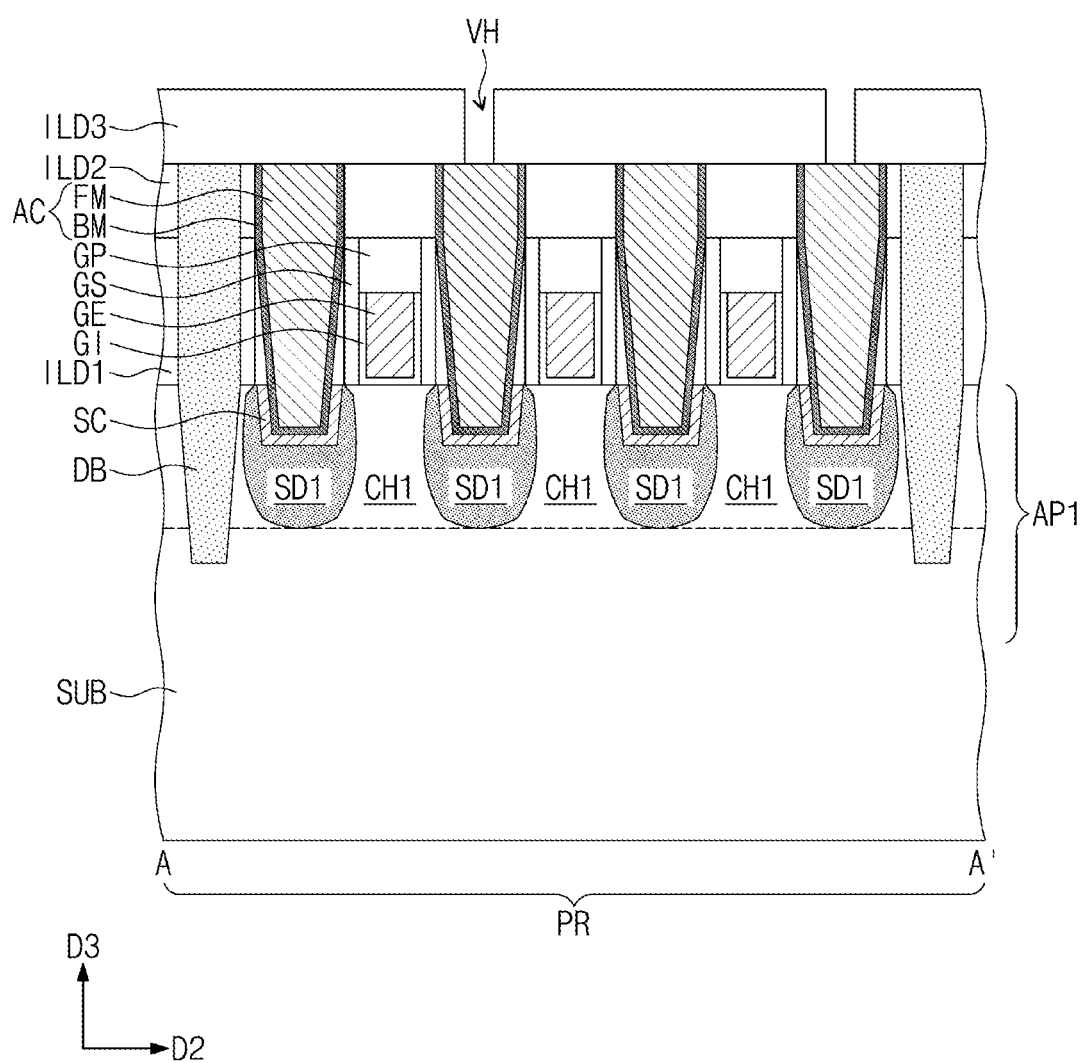
Figure 46B:
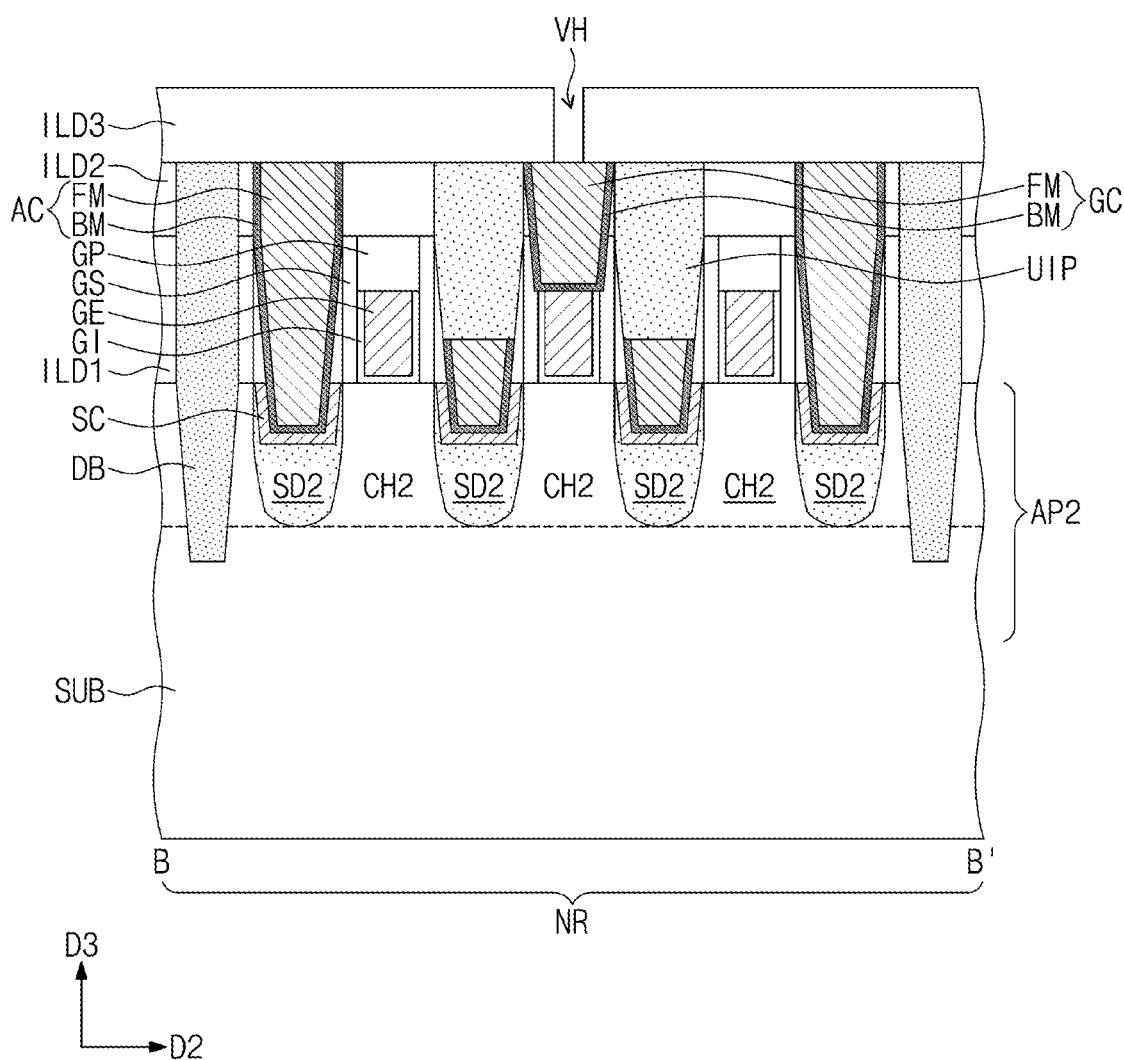
Figure 46C:
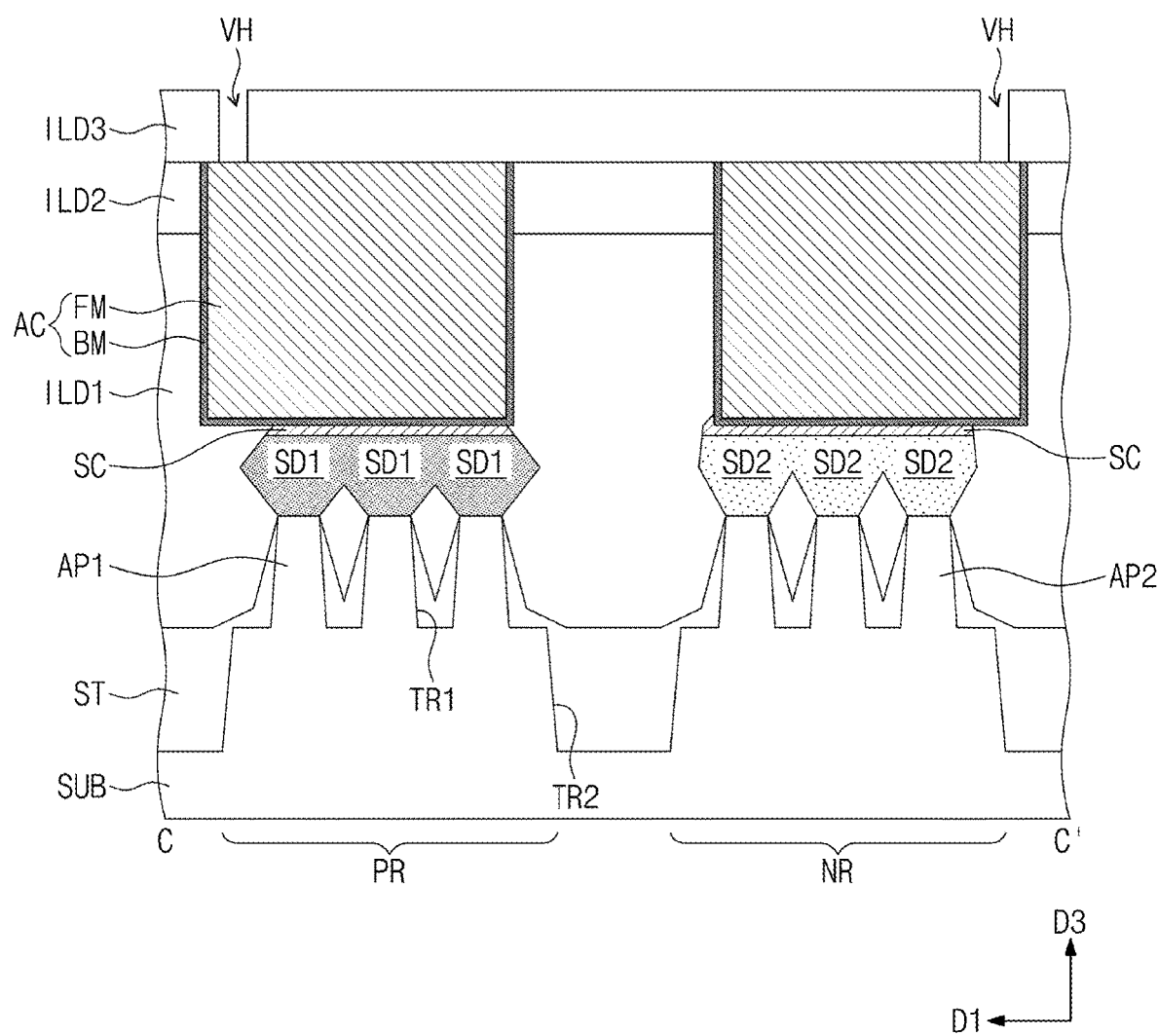
Figure 46D:
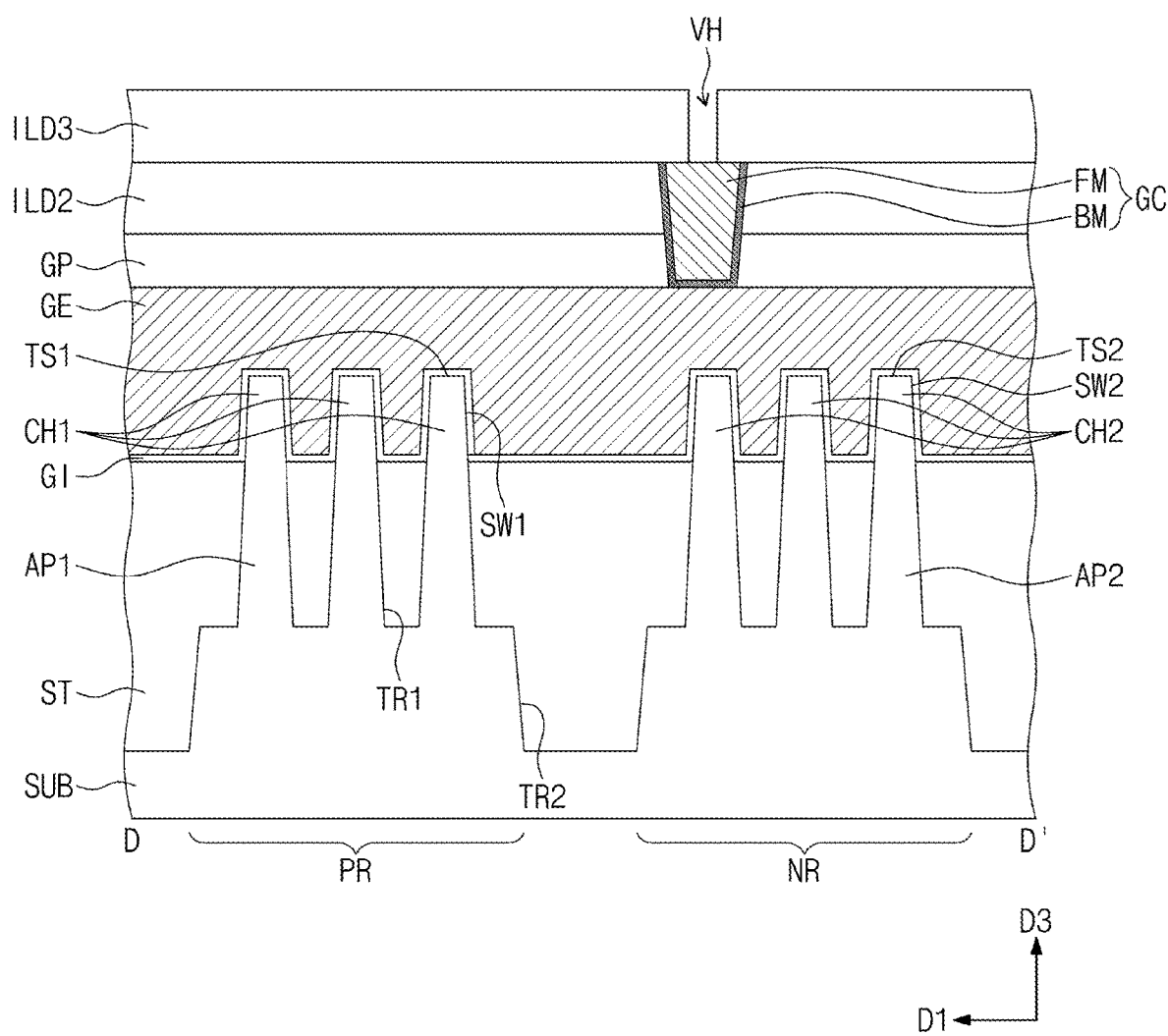
Figure 47:
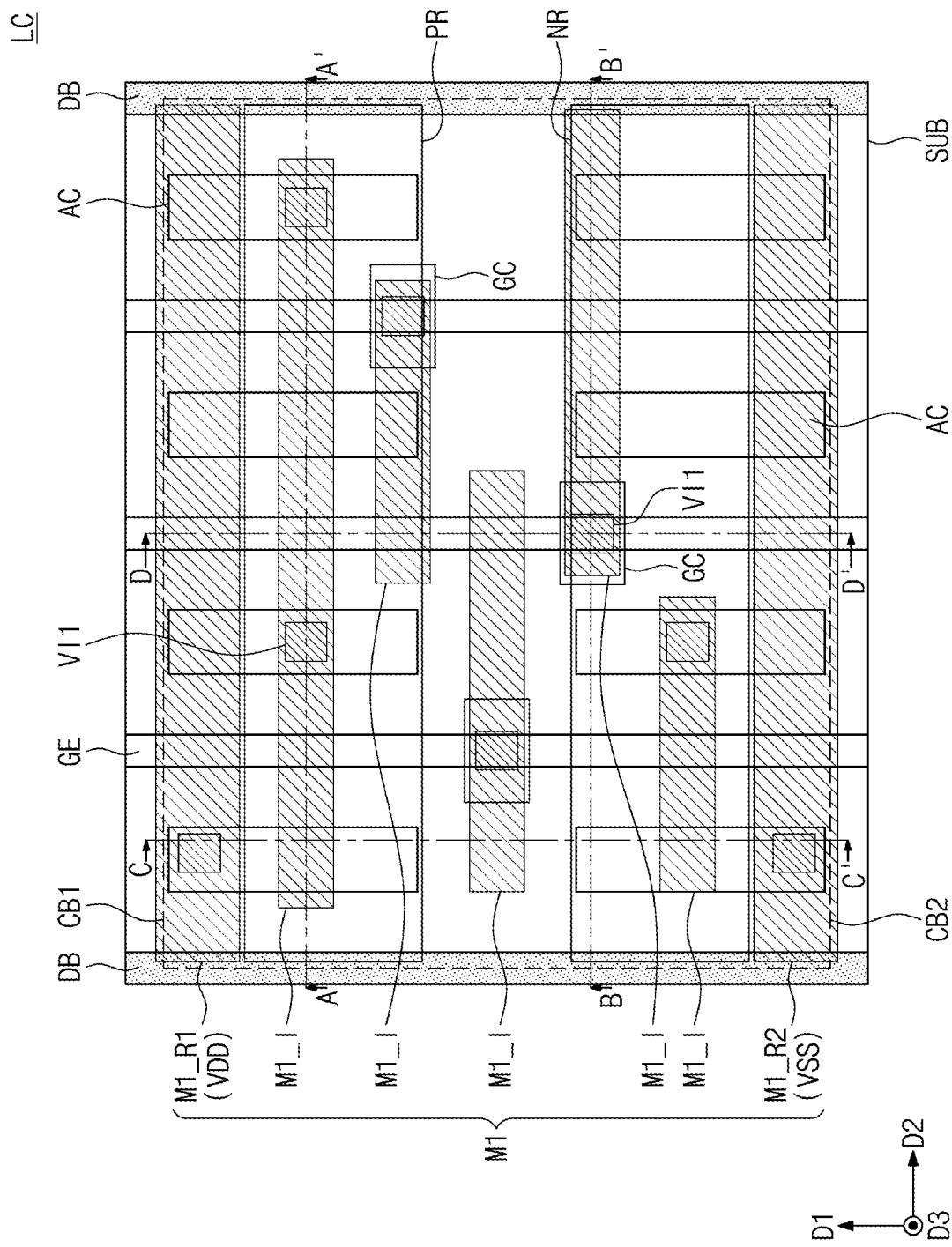
Figure 48A:
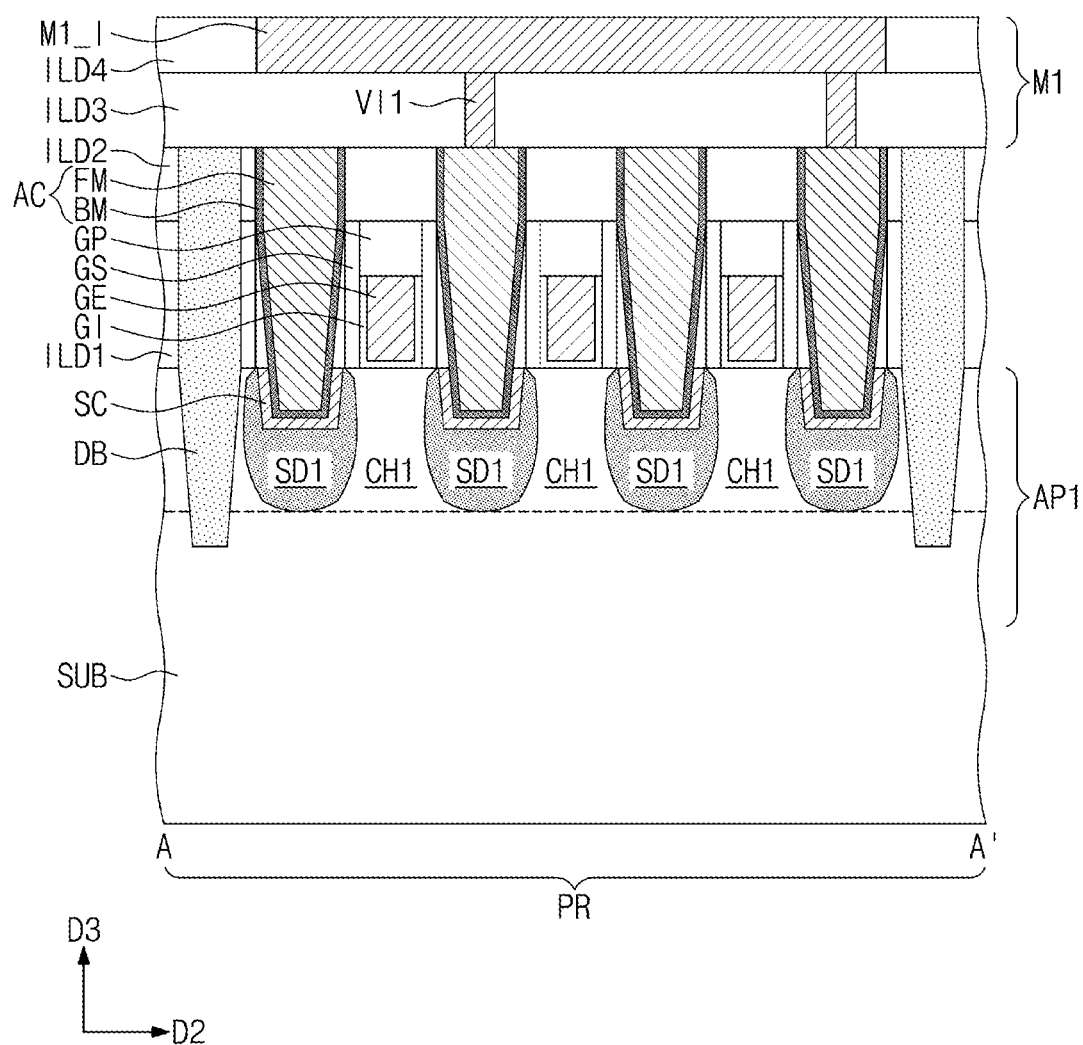
Figure 48B:
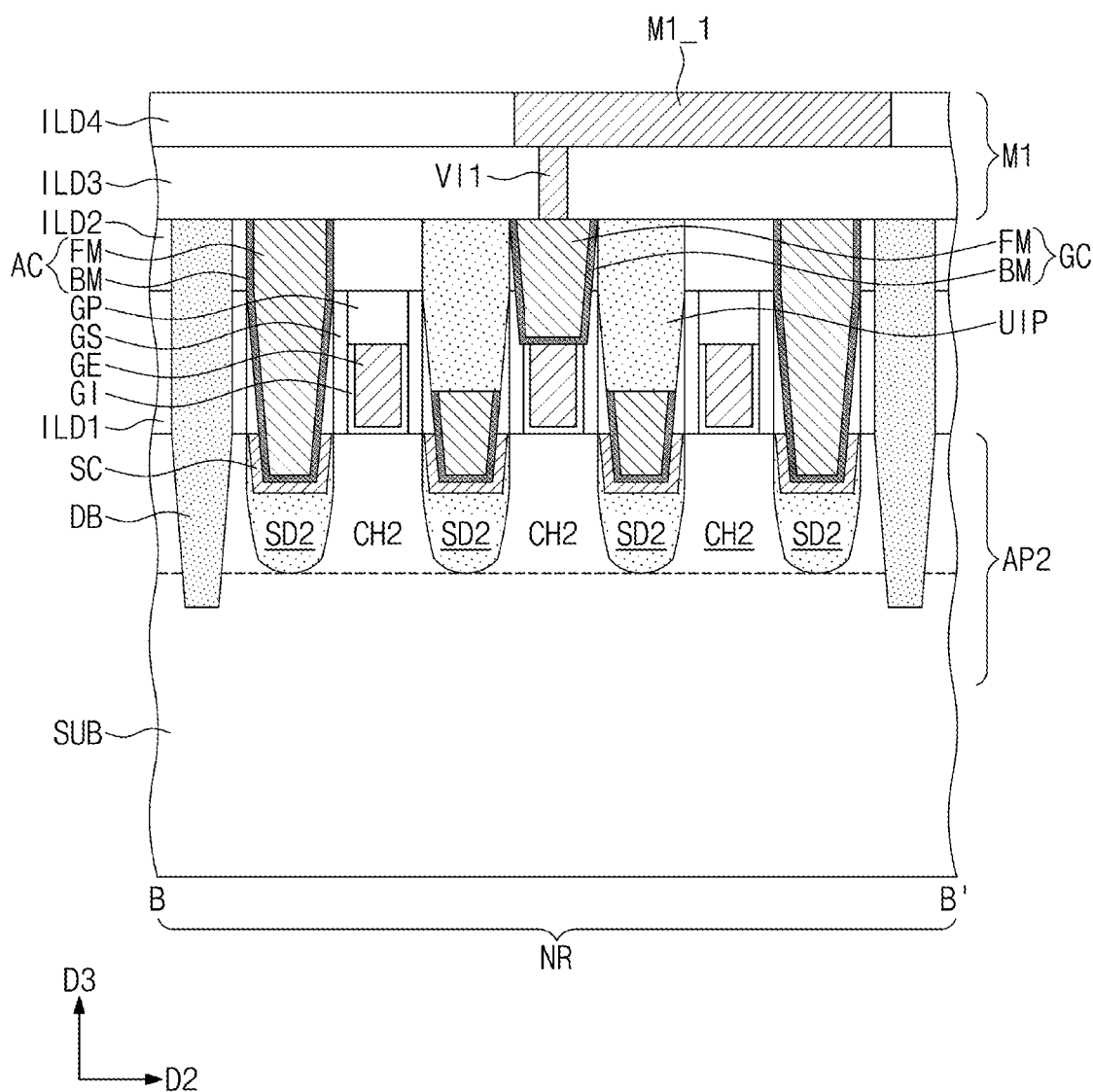
Figure 48C:
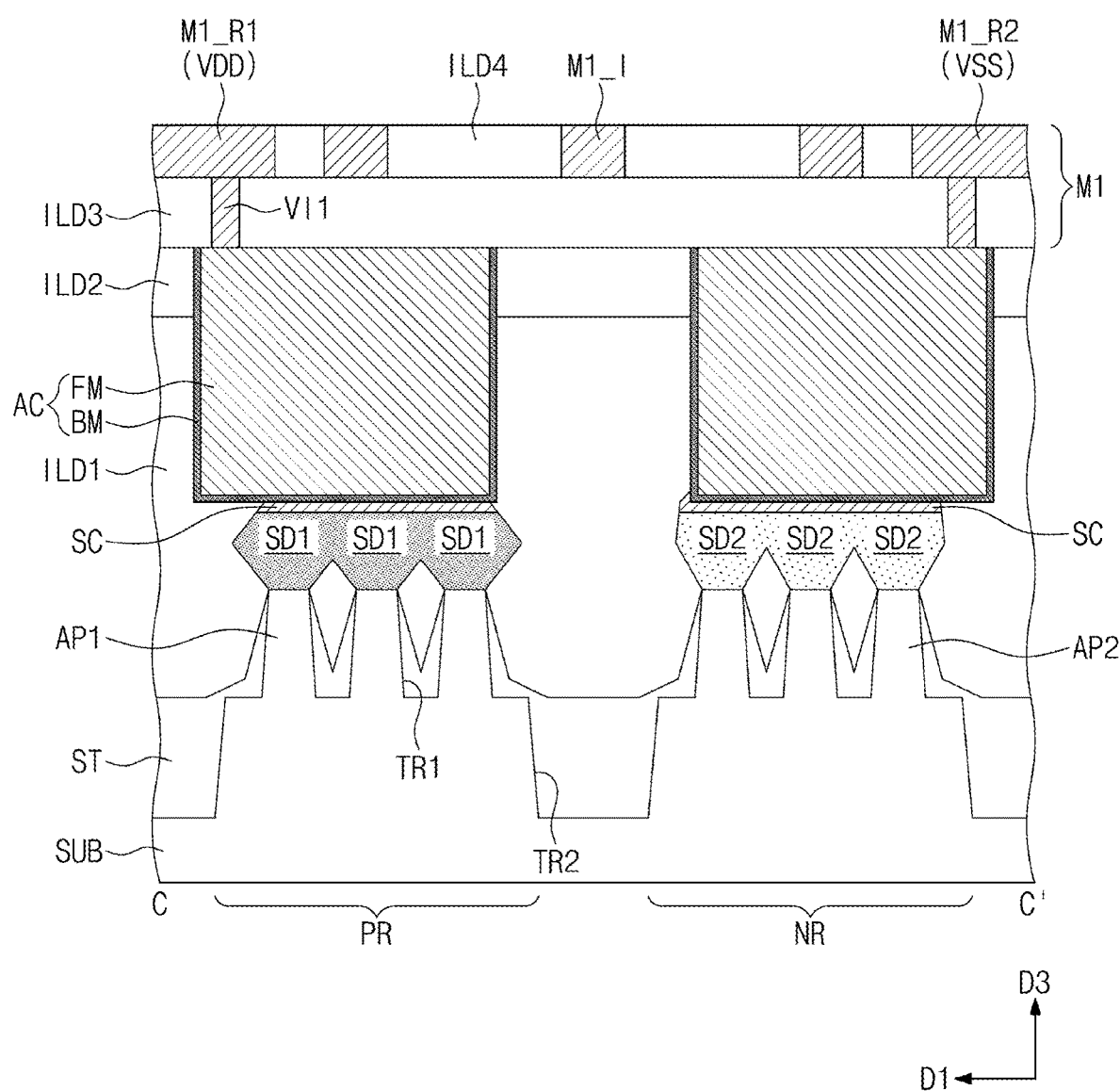
Figure 48D:
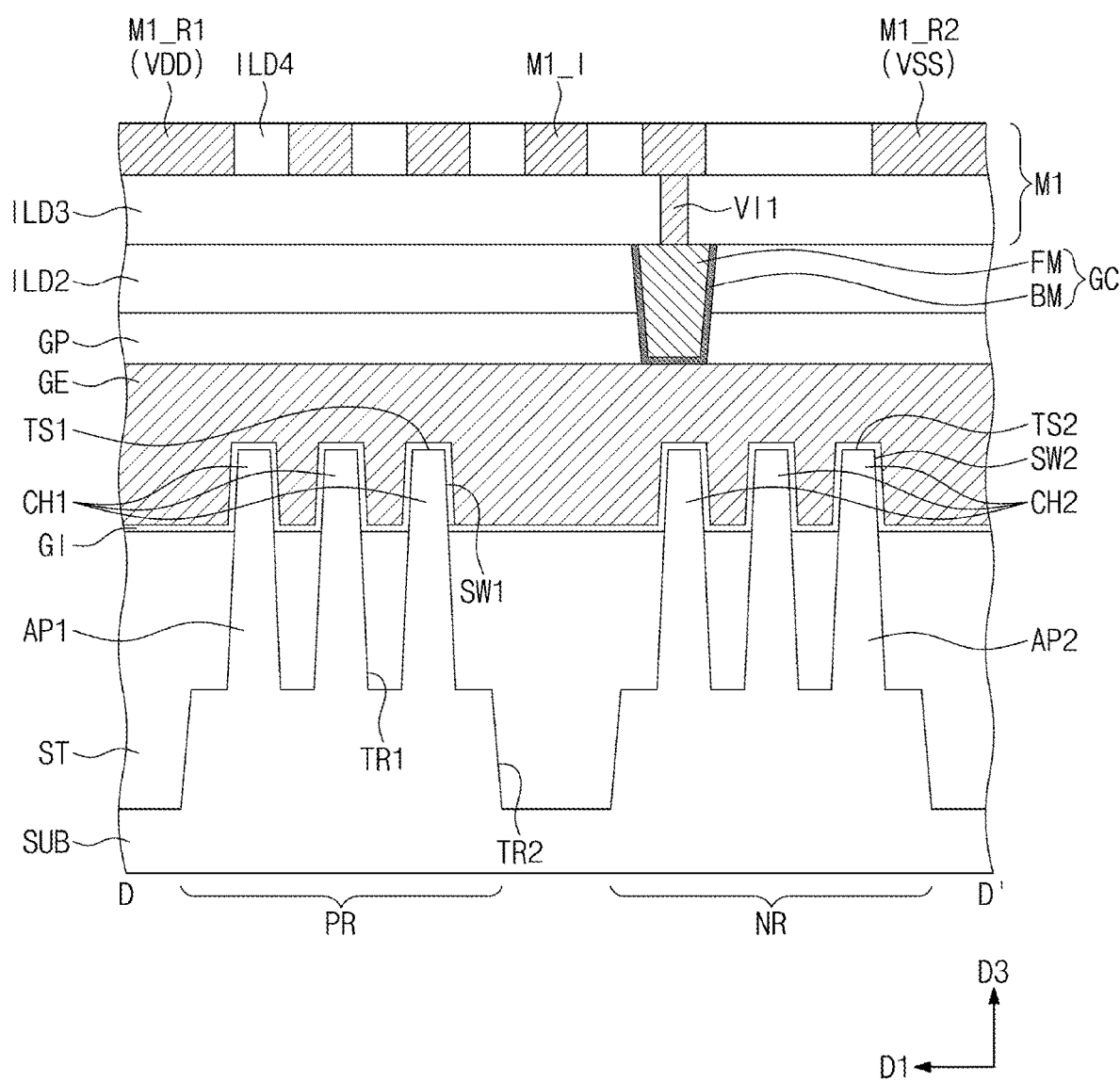

FIGS. 43, 45, and 47 are plan views illustrating a method of fabricating a semiconductor device, according to an embodiment of the inventive concept. FIGS. 44A, 46A, and 48A are sectional views taken along lines A-A' of FIGS. 43, 45, and 47, respectively. FIGS. 44B, 46B, and 48B are sectional views taken along lines B-B' of FIGS. 43, 45, and 47, respectively. FIGS. 44C, 46C, and 48C are sectional views taken along lines C-C' of FIGS. 43, 45, and 47, respectively. FIGS. 44D, 46D, and 48D are sectional views taken along lines D-D' of FIGS. 43, 45, and 47, respectively.

Referring to FIGS. 43 and 44A to 44D, a logic cell LC may be provided on a substrate SUB. Logic transistors constituting a logic circuit may be disposed on the logic cell LC.

The substrate SUB may include a first active region PR and a second active region NR. In an embodiment, the first active region PR may be a PMOSFET region, and the second active region NR may be an NMOSFET region. The substrate SUB may be a semiconductor substrate (e.g., made of silicon, germanium, or silicon-germanium) or a substrate made of a compound semiconductor material. As an example, the substrate SUB may be a silicon wafer.

The first and second active regions PR and NR may be defined by a second trench TR2, which is formed in an upper portion of the substrate SUB. The second trench TR2 may be located between the first and second active regions PR and NR. The first and second active regions PR and NR may be spaced apart from each other, in a first direction D1, with the second trench TR2 interposed therebetween. Each of the first and second active regions PR and NR may be extended in a second direction D2 crossing the first direction D1.

First active patterns AP1 and second active patterns AP2 may be provided on the first active region PR and the second active region NR, respectively. The first and second active patterns AP1 and AP2 may be extended in the second direction D2 to be parallel to each other. The first and second active patterns AP1 and AP2 may be vertically-protruding portions of the substrate SUB. A first trench TR1 may be defined between adjacent ones of the first active patterns AP1 and between adjacent ones of the second active patterns AP2. The first trench TR1 may be shallower than the second trench TR2.

A device isolation layer ST may be formed to at least partially fill the first and second trenches TR1 and TR2. The device isolation layer ST may be formed of or include silicon oxide. Upper portions of the first and second active patterns AP1 and AP2 may protrude vertically above the device isolation layer ST (e.g., see FIG. 44D). Each of the upper portions of the first and second active patterns AP1 and AP2 may be a fin-shaped pattern. The device isolation layer ST may not be on or cover the upper portions of the first and second active patterns AP1 and AP2. The device isolation layer ST may at least partially cover lower side surfaces of the first and second active patterns AP1 and AP2.

First source/drain patterns SD1 may be provided in upper portions of the first active patterns AP1. The first source/drain regions SD1 may be impurity regions of a first conductivity type (e.g., p-type). A first channel region CH1 may be interposed between a pair of the first source/drain regions SD1. Second source/drain regions SD2 may be provided in upper portions of the second active patterns AP2. The second source/drain regions SD2 may be impurity regions of a second conductivity type (e.g., n-type). A second channel region CH2 may be interposed between a pair of the second source/drain regions SD2.

The first and second source/drain regions SD1 and SD2 may be epitaxial patterns, which are formed by a selective epitaxial growth process. As an example, the first and second source/drain regions SD1 and SD2 may have top surfaces that are coplanar with top surfaces of the first and second channel regions CH1 and CH2. As another example, the top surfaces of the first and second source/drain regions SD1 and SD2 may be higher than the top surfaces of the first and second channel regions CH1 and CH2.

The first source/drain regions SD1 may be formed of or include a semiconductor material (e.g., SiGe) whose lattice constant is larger than a lattice constant of the semiconductor material of the substrate SUB. In this case, the first source/drain regions SD1 may exert a compressive stress on the first channel regions CH1. As an example, the second source/drain regions SD2 may be formed of or include the same semiconductor material (e.g., Si) as the substrate SUB.

Gate electrodes GE may be provided to cross the first and second active patterns AP1 and AP2 and to extend in the first direction D1. The gate electrodes GE may be arranged at a constant pitch in the second direction D2. The gate electrodes GE may be vertically overlapped with the first and second channel regions CH1 and CH2 in the cross-sectional views of FIGS. 44A-44D. Each of the gate electrodes GE may be provided to enclose top and two side surfaces of each of the first and second channel regions CH1 and CH2.

Referring back to FIG. 44D, the gate electrode GE may be provided on a first top surface TS1 of the first channel region CH1 and at least one first side surface SW1 of the first channel region CH1. The gate electrode GE may be provided on a second top surface TS2 of the second channel region CH2 and at least one second side surface SW2 of the second channel region CH2. In other words, the transistor according to the present embodiment may be a three-dimensional field-effect transistor (e.g., FinFET), in which the gate electrode GE is provided to three-dimensionally surround the channel region CH1 or CH2.

Referring back to FIGS. 43 and 44A to 44D, a pair of gate spacers GS may be disposed on opposite side surfaces of each of the gate electrodes GE. The gate spacers GS may be extended along the gate electrodes GE and in the first direction D1. Top surfaces of the gate spacers GS may be higher than top surfaces of the gate electrodes GE in the cross-sectional views of FIGS. 44A-44D. The top surfaces of the gate spacers GS may be coplanar with a top surface of a first interlayer insulating layer ILD1, which will be described below. The gate spacers GS may be formed of or include SiCN, SiCON, and/or SiN. In an embodiment, the gate spacers GS may be a multi-layered structure, which includes at least two different materials selected from SiCN, SiCON, and SiN.

A gate capping pattern GP may be provided on each of the gate electrodes GE. The gate capping pattern GP may be extended along the gate electrode GE or in the first direction D1. The gate capping pattern GP may be formed of or include a material having an etch selectivity with respect to first and second interlayer insulating layers ILD1 and ILD2, which will be described below. For example, the gate capping patterns GP may be formed of or include SiON, SiCN, SiCON, and/or SiN.

A gate insulating layer GI may be interposed between the gate electrode GE and the first active pattern AP1 and between the gate electrode GE and the second active pattern AP2. The gate insulating layer GI may be extended along a bottom surface of the gate electrode GE thereon. As an example, the gate insulating layer GI may at least partially cover the first top surface TS1 and the first side surface SW1 of the first channel region CH1. The gate insulating layer GI may at least partially cover the second top surface TS2 and the second side surfaces SW2 of the second channel region CH2. The gate insulating layer GI may at least partially cover a top surface of the device isolation layer ST below the gate electrode GE (e.g., see FIG. 44D).

In an embodiment, the gate insulating layer GI may be formed of or include a high-k dielectric material whose dielectric constant is greater than that of a silicon oxide layer. For example, the high-k dielectric material may include hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The gate electrode GE may include a first metal pattern and a second metal pattern on the first metal pattern. The first metal pattern may be provided on the gate insulating layer GI to be adjacent to the first and second channel regions CH1 and CH2. The first metal pattern may include a work function metal adjusting a threshold voltage of the transistor. By adjusting a thickness and composition of the first metal pattern, it may be possible to realize a transistor having a desired threshold voltage.

The first metal pattern may include a metal nitride layer. For example, the first metal pattern may be formed of or include at least one metallic material, which is selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of work function metal layers, which are stacked.

The second metal pattern may include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta).

The first interlayer insulating layer ILD1 may be provided on the substrate SUB. The first interlayer insulating layer ILD1 may at least partially cover the gate spacers GS and the first and second source/drain regions SD1 and SD2. A top surface of the first interlayered insulating layer ILD1 may be substantially coplanar with top surfaces of the gate capping patterns GP and the top surfaces of the gate spacers GS. The second interlayer insulating layer ILD2 may be provided on the first interlayer insulating layer ILD1 to at least partially cover the gate capping patterns GP.

A pair of division structures DB, which are opposite to each other in the second direction D2, may be provided at both sides of the logic cell LC. The division structure DB may be extended in the first direction D1 and parallel to the gate electrodes GE.

The division structure DB may penetrate the first and second interlayer insulating layers ILD1 and ILD2 and may be extended into the first and second active patterns AP1 and AP2. The division structure DB may penetrate an upper portion of each of the first and second active patterns AP1 and AP2. The dividing structure DB may separate the PMOSFET and NMOSFET regions PR and NR of the logic cell LC from an active region of another logic cell adjacent thereto.

Active contacts AC may be provided to penetrate the first and second interlayer insulating layers ILD1 and ILD2 and to be electrically and respectively connected to the first and second source/drain regions SD1 and SD2. Each of the active contacts AC may be provided between a corresponding pair of the gate electrodes GE.

The active contact AC may be a self-aligned contact. For example, the active contact AC may be formed by a self-alignment process using the gate capping pattern GP and the gate spacer GS. In an embodiment, the active contact AC may be on and cover at least a portion of a side surface of the gate spacer GS. Although not shown, the active contact AC may be on and cover a portion of the top surface of the gate capping pattern GP.

Silicide patterns SC may be interposed between the active contact AC and the first source/drain region SD1 and between the active contact AC and the second source/drain region SD2. The active contact AC may be electrically connected to the source/drain region SD1 or SD2 through the silicide pattern SC. The silicide pattern SC may be formed of or include one or more metal silicide materials (e.g., titanium silicide, tantalum silicide, tungsten silicide, nickel silicide, and cobalt silicide).

A gate contact GC may be provided to penetrate the second interlayer insulating layer ILD2 and the gate capping pattern GP and to be electrically connected to the gate electrode GE. Referring to FIG. 46B, an upper insulating pattern UIP may be formed to at least partially fill an empty region, which is formed on each of the active contacts AC adjacent to the gate contact GC. Accordingly, it may be possible to prevent or reduce the likelihood of the gate contact GC from being in contact with the active contact AC adjacent thereto and thereby to prevent or reduce the likelihood of a short circuit issue from occurring.

Each of the active and gate contacts AC and GC may include a conductive pattern FM and a barrier pattern BM enclosing the conductive pattern FM. For example, the conductive pattern FM may be formed of or include aluminum, copper, tungsten, molybdenum, and/or cobalt. The barrier pattern BM may at least partially cover side and bottom surfaces of the conductive pattern FM. In an embodiment, the barrier pattern BM may include a metal layer and a metal nitride layer. The metal layer may be formed of or include titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), and/or platinum nitride (PtN).

Referring to FIGS. 45 and 46A to 46D, a third interlayer insulating layer ILD3 may be formed on the second interlayer insulating layer ILD2. Via holes VIH may be formed by patterning the third interlayer insulating layer ILD3. Each of the via holes VIH may be formed to penetrate the third interlayer insulating layer ILD3 and to expose a top surface of the active or gate contact AC or GC.

In detail, the patterning process for forming the via holes VIH may be performed using the photolithography process previously described with reference to FIGS. 18 and 19. The photomask 1400 previously described with reference to FIG. 18 may be used as a photomask for forming the via holes VIH. In other words, the photomask for forming the via holes VIH may be manufactured by the OPC method previously described with reference to FIGS. 4 to 17.

Referring to FIGS. 47 and 48A to 48D, first vias VI1 may be formed by at least partially filling the via holes VIH with a conductive material. A fourth interlayer insulating layer ILD4 may be formed on the third interlayer insulating layer ILD3. Interconnection lines M1_R1, M1_R2, and M1_I may be formed in the fourth interlayer insulating layer ILD4. The interconnection lines M1_R1, M1_R2, and M1_I may include a first power line M1_R1, a second power line M1_R2, and lower interconnection lines M1_I.

Referring to FIG. 47, each of the first and second power lines M1_R1 and M1_R2 may be extended in the second direction D2 to cross the logic cell LC. In an embodiment, a plurality of the lower interconnection lines M1_I may be disposed between the first and second lower power lines M1_R1 and M1_R2. The lower interconnection lines M1_I may be line- or bar-shaped patterns extending in the second direction D2.

The interconnection lines M1_R1, M1_R2, and M1_I and the first vias VI1 thereunder may constitute a first metal layer M1. The first via VI1 may be interposed between the interconnection line and the active or gate contact AC or GC to electrically connect them to each other. Although not shown, additional metal layers (e.g., M2, M3, M4, and so forth) may be further formed on the first metal layer M1.

Figure 34:
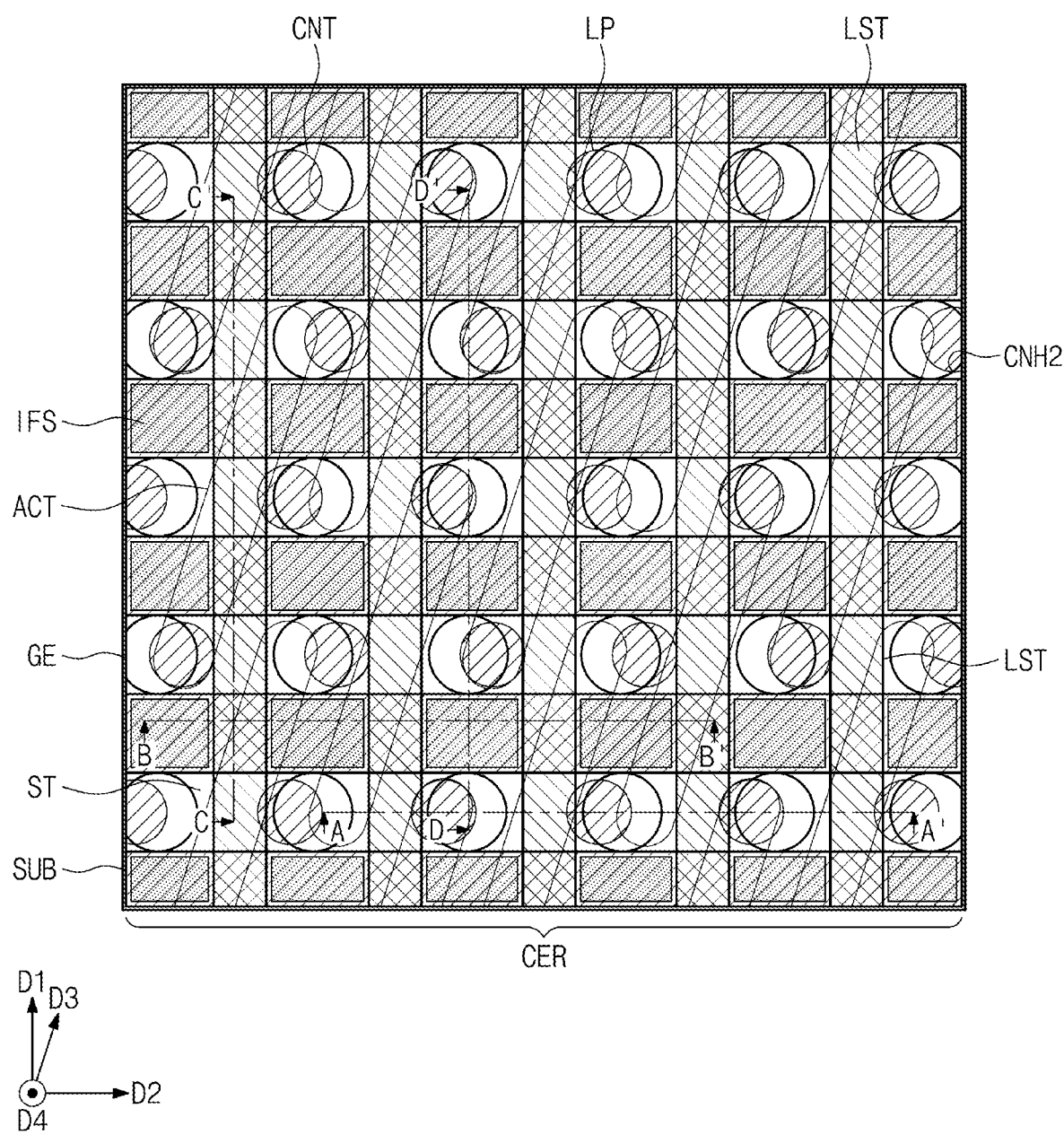
Figure 35A:
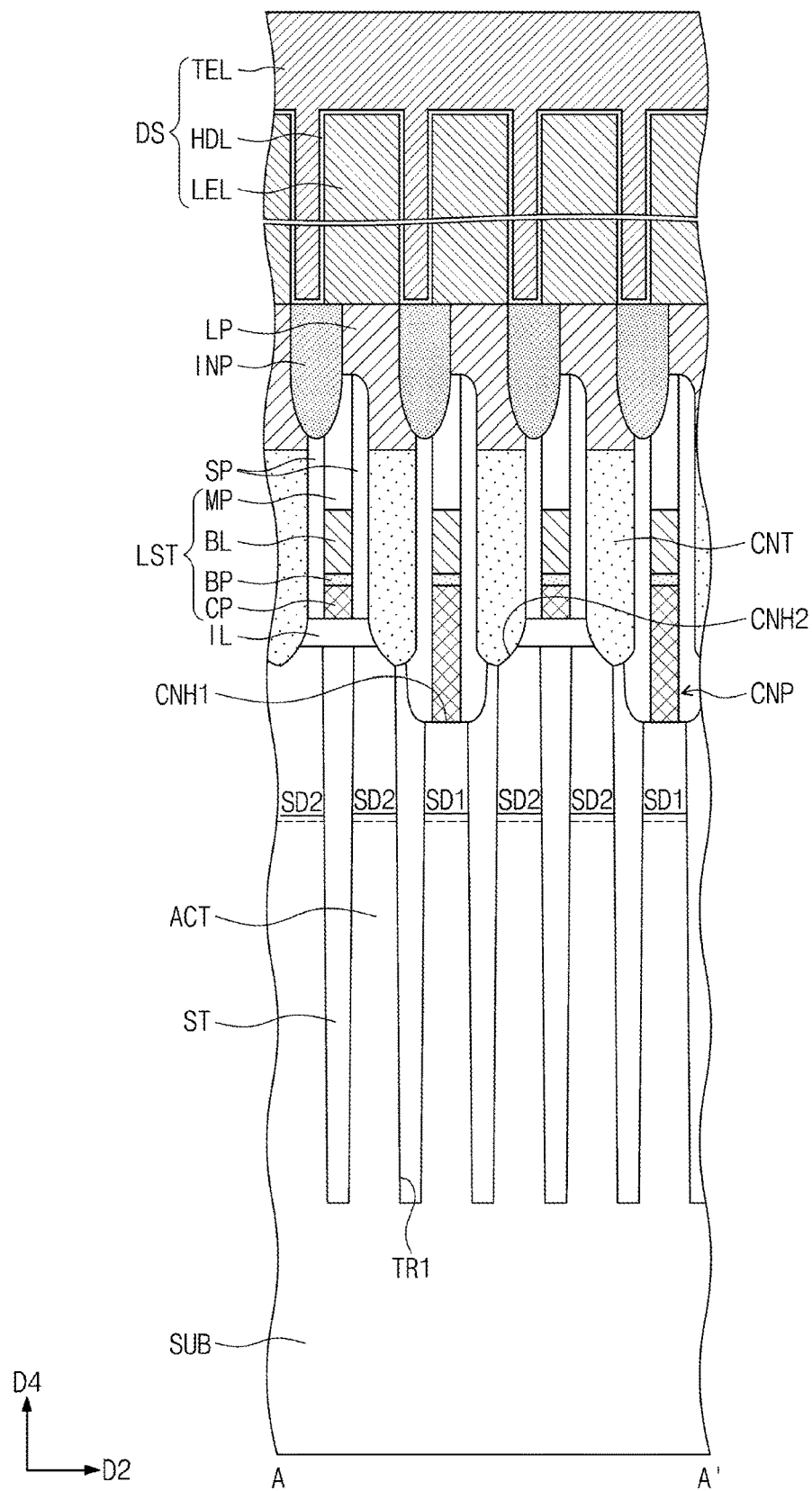
Figure 35B:
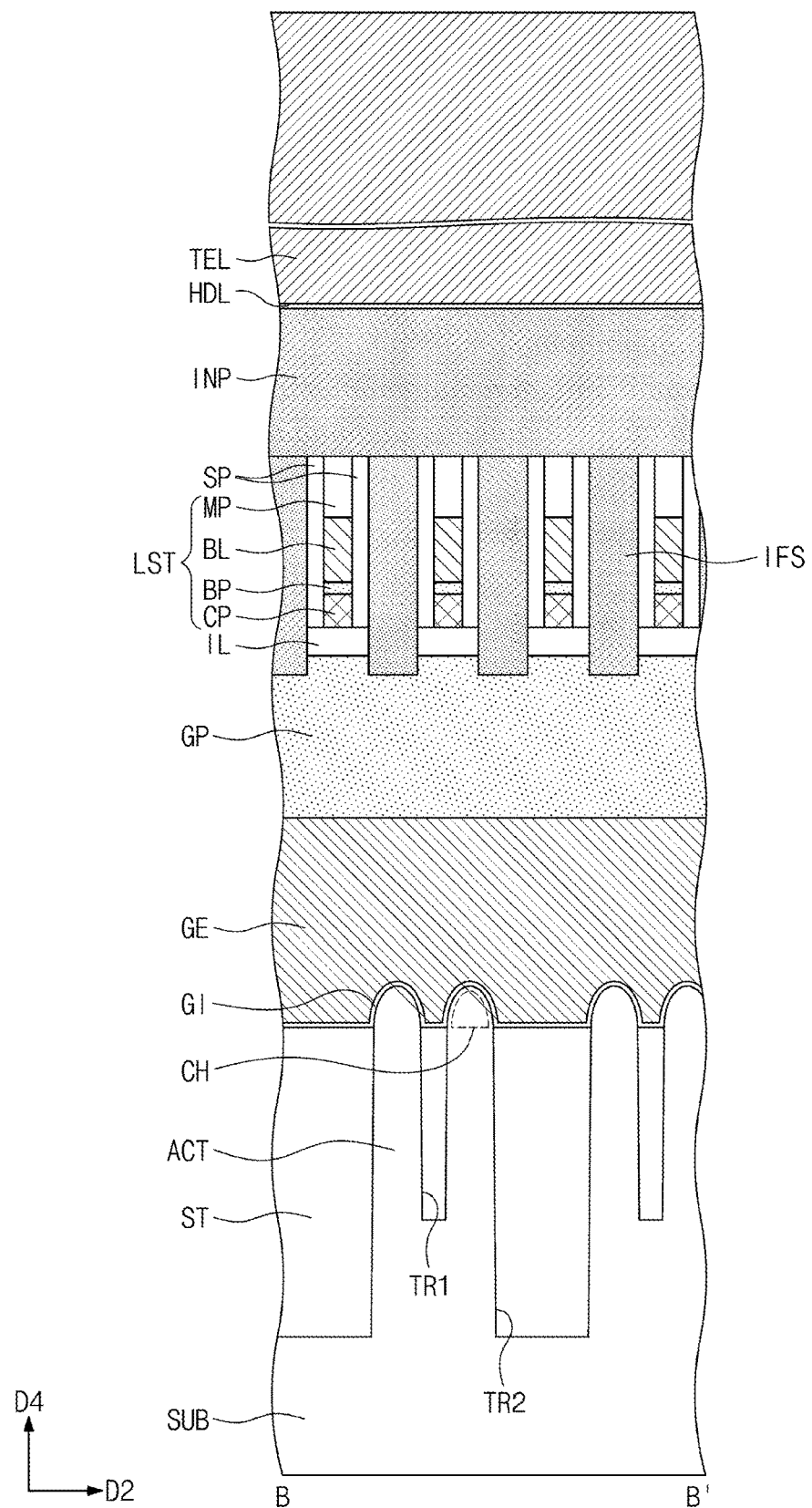
Figure 35C:
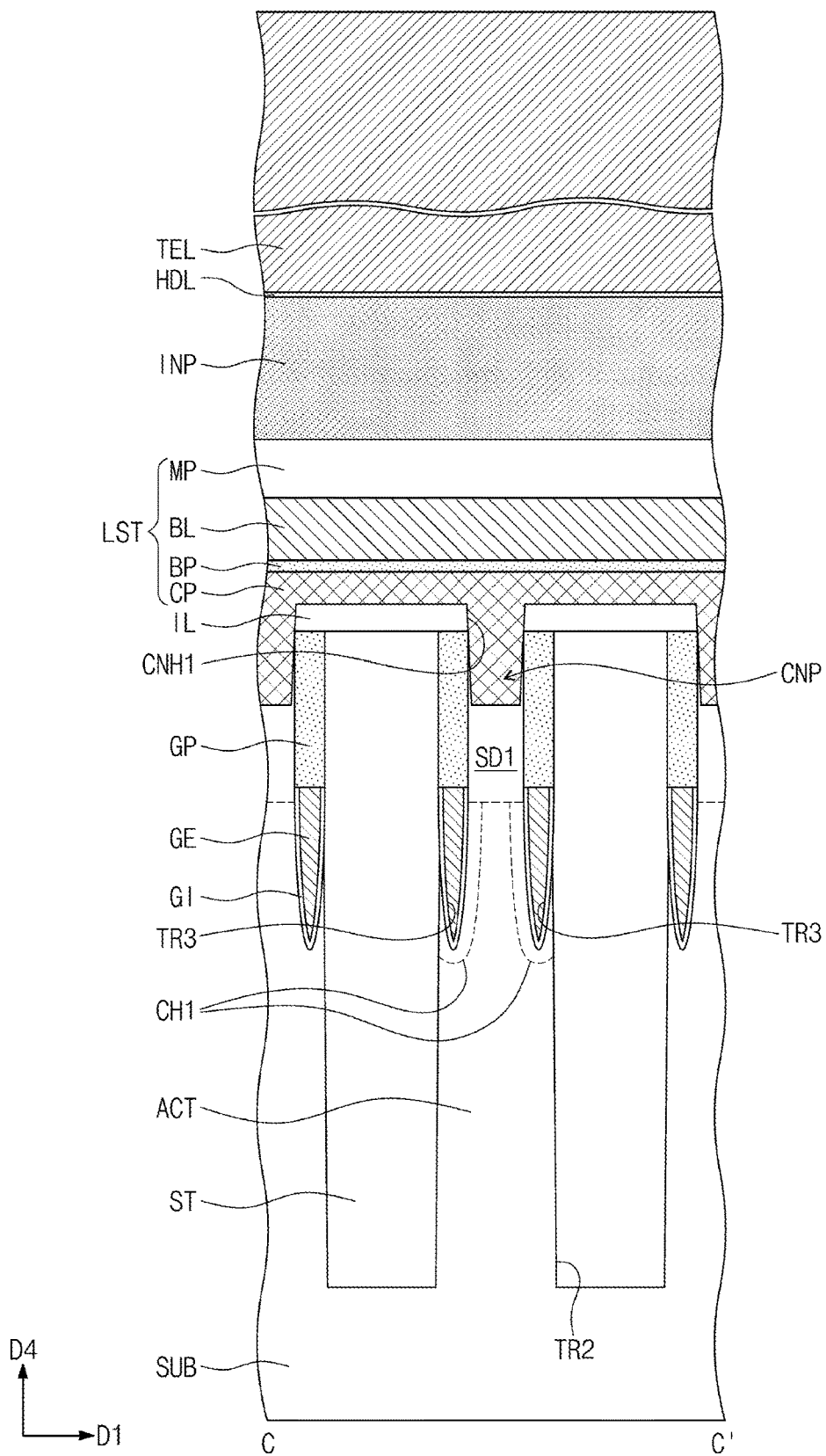
Figure 35D:
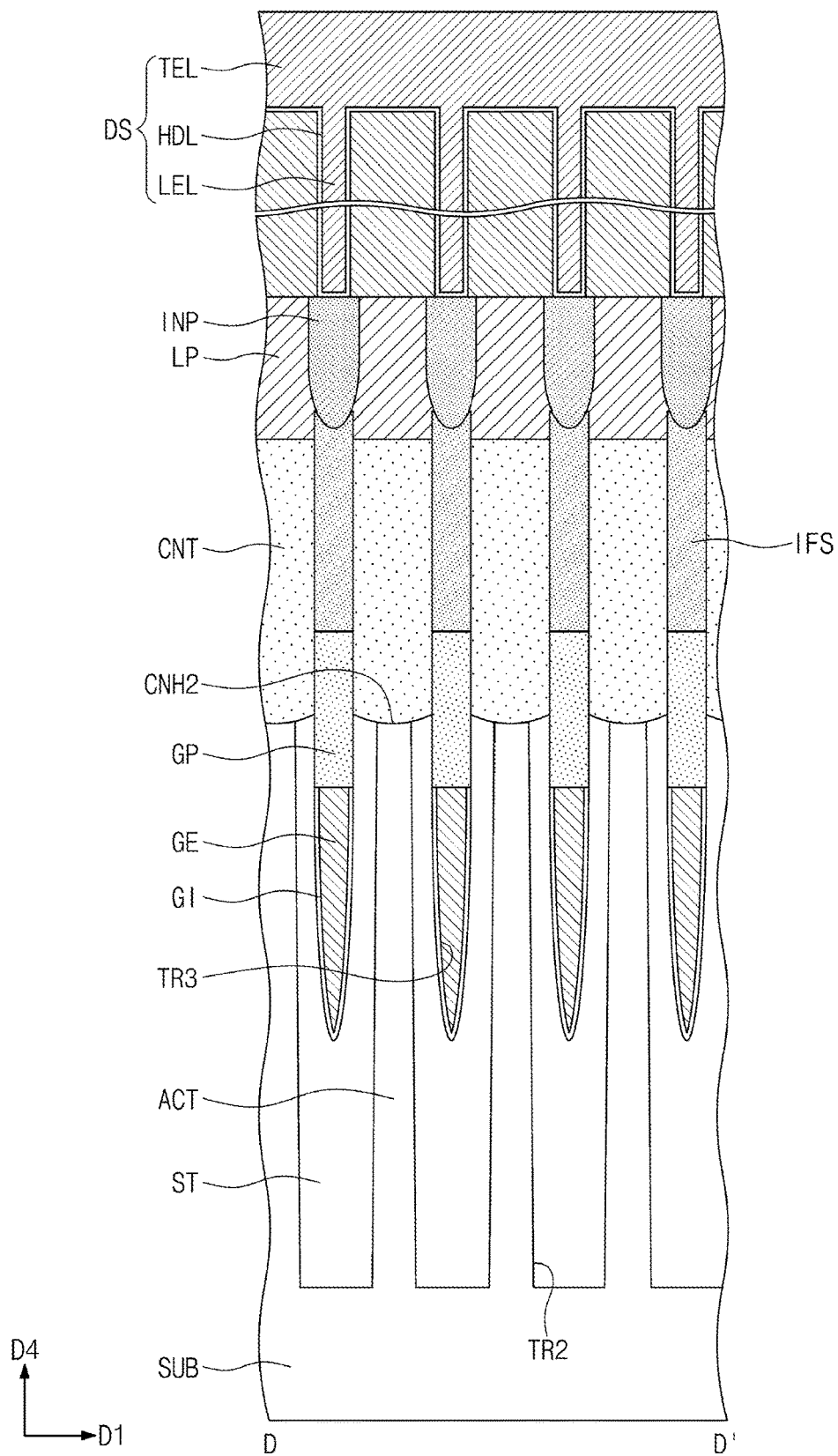

The afore-described OPC method may be used to form island-shaped patterns, such as the landing pads LP of FIG. 34, the channel holes CHO of FIG. 39, and the via holes VIH of FIG. 45. In addition, the afore-described OPC method may be used to form line patterns (e.g., interconnection lines) shown in FIG. 47. In the case where a distance between line ends is small, there may be some restrictions on the mask rule, and in this case, the afore-described OPC method for the curvilinear patterns may be used to effectively overcome such restrictions.

In an OPC method according to an embodiment of the inventive concept, a curvilinear-shaped OPC pattern may be used to realize a precise photolithography process. In an embodiment, it may be possible to realize a continuously curvilinear shape, without any discontinuity, for a curvilinear-shaped pattern on a boundary between patches. All OPC patterns on a layout of full-chip size may be stably generated, and this may make it possible to realize an OPC result with high precision. As a result, in the OPC method according to an embodiment of the inventive concept, it may be possible to realize a highly-integrated and highly-reliable semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    performing an optical proximity correction (OPC) operation on a layout; and
    forming a photoresist pattern on a substrate using a photomask that is manufactured with the layout corrected by the OPC operation,
    wherein the OPC operation comprises:
    sectioning the layout into a low-level patch and a high-level patch;
    performing a first OPC operation on the low-level patch, the first OPC operation comprising generating a first boundary correction pattern of a curvilinear shape on a boundary between the low-level patch and the high-level patch;
    performing a second OPC operation on the high-level patch, the second OPC operation comprising a second boundary correction pattern of a curvilinear shape on the boundary; and
    conforming the first boundary correction pattern and the second boundary correction pattern to each other to generate a conformed boundary correction pattern of a curvilinear shape,
    wherein the generating of the conformed boundary correction pattern comprises:
    converting the first boundary correction pattern to a first Manhattan pattern;
    converting the second boundary correction pattern to a second Manhattan pattern;
    merging the first and second Manhattan patterns to generate a single Manhattan pattern, and
    wherein the merging of the first Manhattan pattern and the second Manhattan pattern comprises:
    leaving a first segment of the first Manhattan pattern, which passes through a freeze boundary, and removing a second segment, which is a remaining portion of the first Manhattan pattern;
    removing a third segment of the second Manhattan pattern, which passes through the freeze boundary, and leaving a fourth segment, which is a remaining portion of the second Manhattan pattern; and
    merging the first segment of the first Manhattan pattern and the fourth segment of the second Manhattan pattern with each other.

2. The method of claim 1, wherein the freeze boundary is defined to be spaced apart from the boundary by a predetermined distance.

3. The method of claim 1, wherein the first segment is located to a side of the freeze boundary,
    wherein the second segment is located to an opposite side of the freeze boundary,
    wherein the third segment is located to the side of the freeze boundary, and
    wherein the fourth segment is located to the opposite side of the freeze boundary.

4. The method of claim 1, wherein each of the first Manhattan pattern and the second Manhattan pattern comprises first linear segments extending in a first direction and second linear segments extending in a second direction crossing the first direction.

5. The method of claim 1, wherein the OPC operation further comprises generating target patterns for design patterns of the layout, respectively,
    wherein the first OPC operation further comprises generating low-level correction patterns based on the target patterns in the low-level patch, and
    wherein the second OPC operation further comprises generating high-level correction patterns based on the target patterns in the high-level patch.

6. The method of claim 1, wherein the first boundary correction pattern and the second boundary correction pattern are generated based on a single boundary target pattern on the boundary.

7. The method of claim 1, wherein, on the boundary, there is incongruity between the first boundary correction pattern and the second boundary correction pattern.

8. The method of claim 1, further comprising:
forming transistors on the substrate;
forming an interlayer insulating layer on the transistors;
forming via holes to penetrate the interlayer insulating layer using the photoresist pattern as a mask;
forming a conductive material in the via holes to form vias; and
forming interconnection lines on the vias.

9. A method of fabricating a semiconductor device, comprising:
performing an optical proximity correction (OPC) operation on a layout; and
forming a photoresist pattern on a substrate using a photomask that is manufactured with the layout corrected by the OPC operation,
wherein the OPC operation comprises:
performing a first OPC operation on a first patch of the layout;
performing a second OPC operation on a second patch of the layout adjacent to the first patch;
converting a first boundary correction pattern, which is generated on a boundary between the first patch and the second patch through the first OPC operation, to a first Manhattan pattern;
converting a second boundary correction pattern, which is generated on the boundary through the second OPC operation, to a second Manhattan pattern;
merging the first Manhattan pattern and the second Manhattan pattern to generate a single Manhattan pattern; and
converting the single Manhattan pattern to a conformed boundary correction pattern,
wherein the merging the first Manhattan pattern and the second Manhattan pattern comprises:
leaving a first segment of the first Manhattan pattern, which passes through a freeze boundary, and removing a second segment, which is a remaining portion of the first Manhattan pattern;
removing a third segment of the second Manhattan pattern, which passes through the freeze boundary, and leaving a fourth segment, which is a remaining portion of the second Manhattan pattern; and
merging the first segment of the first Manhattan pattern and the fourth segment of the second Manhattan pattern with each other.

10. The method of claim 9, wherein the freeze boundary is defined to be spaced apart from the boundary by a predetermined distance.

11. The method of claim 9, wherein the first segment is located to a side of the freeze boundary,
wherein the second segment is located to an opposite side of the freeze boundary,
wherein the third segment is located to the side of the freeze boundary, and
wherein the fourth segment is located to the opposite side of the freeze boundary.

12. The method of claim 9, wherein each of the first Manhattan pattern and the second Manhattan pattern comprises first linear segments extending in a first direction and second linear segments extending in a second direction crossing the first direction.

13. A method of fabricating a semiconductor device, comprising:
sectioning a layout into a first patch and a second patch, the layout comprising a first design pattern in the first patch, a second design pattern in the second patch, and a boundary design pattern on a boundary between the first and second patches;
performing a first OPC operation on the first patch to generate a first correction pattern and a first boundary correction pattern from the first design pattern and the boundary design pattern, respectively;
performing a second OPC operation on the second patch to generate a second correction pattern and a second boundary correction pattern from the second design pattern and the boundary design pattern, respectively;
converting the first boundary correction pattern to a first Manhattan pattern;
converting the second boundary correction pattern to a second Manhattan pattern;
merging the first and second Manhattan patterns to generate a single Manhattan pattern;
converting the single Manhattan pattern to a conformed boundary correction pattern;
manufacturing a photomask using the layout that is corrected to include the first correction pattern, the second correction pattern, and the conformed boundary correction pattern;
forming an etching target layer and a photoresist layer on a substrate;
forming photoresist patterns by exposing the photoresist layer using the photomask and developing the photoresist layer; and
patterning the etching target layer using the photoresist patterns,
wherein the merging of the first Manhattan pattern and the second Manhattan pattern comprises:
leaving a first segment of the first Manhattan pattern, which passes through a freeze boundary, and removing a second segment, which is a remaining portion of the first Manhattan pattern;
removing a third segment of the second Manhattan pattern, which passes through the freeze boundary, and leaving a fourth segment, which is a remaining portion of the second Manhattan pattern; and
merging the first segment of the first Manhattan pattern and the fourth segment of the second Manhattan pattern with each other.

14. The method of claim 13, wherein the first segment is located to a side of the freeze boundary,
wherein the second segment is located to an opposite side of the freeze boundary,
wherein the third segment is located to the side of the freeze boundary, and
wherein the fourth segment is located to the opposite side of the freeze boundary.

15. The method of claim 10, further comprising:
alternately stacking insulating layers and sacrificial layers on the substrate to form a stack;
forming channel holes to penetrate the stack using the photoresist pattern as a mask;
forming vertical channel structures in the channel holes, respectively; and
replacing the sacrificial layers with electrodes, respectively, and
wherein the stack is the etching target layer.

16. The method of claim 10, further comprising:
forming a device isolation layer on the substrate to define an active pattern;
forming a gate electrode to cross the active pattern;

forming a first source/drain region and a second source/drain region in an upper portion of the active pattern, the first source/drain region being adjacent to a side of the gate electrode, the second source/drain region being adjacent to an opposite side of the gate electrode;

forming a bit line, which is electrically coupled to the first source/drain region;

forming a contact, which is electrically coupled to the second source/drain region;

forming a metal layer, which is the etching target layer, on the contact;

patterning the metal layer using the photoresist pattern to form a landing pad; and forming a data storing element on the landing pad.

* * * * *